US011226552B2

(12) United States Patent
Ahn et al.

(10) Patent No.: US 11,226,552 B2
(45) Date of Patent: Jan. 18, 2022

(54) METHOD OF MANUFACTURING PHOTOMASK SET FOR FORMING PATTERNS, AND METHOD OF MANUFACTURING SEMICONDUCTOR DEVICE USING THE PHOTOMASK SET

(71) Applicant: SAMSUNG ELECTRONICS CO., LTD., Suwon-si (KR)

(72) Inventors: Hungbae Ahn, Hwaseong-si (KR); Sangoh Park, Hwaseong-si (KR); Sunggon Jung, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/872,444

(22) Filed: May 12, 2020

(65) Prior Publication Data
US 2021/0124258 A1   Apr. 29, 2021

(30) Foreign Application Priority Data
Oct. 28, 2019   (KR) .......................... 10-2019-0134791

(51) Int. Cl.
*H01L 27/108* (2006.01)
*H01L 21/033* (2006.01)
*H01L 21/768* (2006.01)
*G03F 1/70* (2012.01)

(52) U.S. Cl.
CPC ............ *G03F 1/70* (2013.01); *H01L 21/0332* (2013.01); *H01L 21/76895* (2013.01); *H01L 27/1085* (2013.01); *H01L 27/10885* (2013.01); *H01L 27/10888* (2013.01); *H01L 27/10891* (2013.01)

(58) Field of Classification Search
CPC . G03F 1/70; H01L 27/10885; H01L 21/0332; H01L 21/76895; H01L 27/1085; H01L 27/10888; H01L 27/10891; H01L 27/02; H01L 21/32139; H01L 21/0274; H01L 21/027; H01L 21/76816; H01L 21/76811; H01L 21/76865; H01L 21/762; H01L 27/0611
USPC ........................................................ 438/618
See application file for complete search history.

(56) References Cited

U.S. PATENT DOCUMENTS

| | | | |
|---|---|---|---|
| 5,918,122 A * | 6/1999 | Parekh | H01L 27/10852 438/253 |
| 8,312,394 B2 | 11/2012 | Ban et al. | |
| 8,603,919 B2 | 12/2013 | Han | |
| 8,782,586 B2 | 7/2014 | Sezginer et al. | |
| 9,305,801 B2 | 4/2016 | Sung et al. | |

(Continued)

*Primary Examiner* — Duy T Nguyen
(74) *Attorney, Agent, or Firm* — Lee IP Law, P.C.

(57) ABSTRACT

A method of manufacturing a photomask set includes: preparing a mask layout, the mask layout including a plurality of first layout patterns apart from one another in a first region, wherein distances between center points of three first layout patterns adjacent to one another from among the plurality of first layout patterns respectively have different values; grouping pairs of first layout patterns, in which a distance between two first layout patterns adjacent to each other does not have a smallest value, and splitting the mask layout pattern into at least two mask layouts; and forming a photomask set including at least two photomasks each including a mask pattern corresponding to the first layout pattern included in each of the mask layout patterns split into at least two mask layouts.

10 Claims, 62 Drawing Sheets

(56) References Cited

U.S. PATENT DOCUMENTS

| | | |
|---|---|---|
| 9,842,185 B2 | 12/2017 | Riviere-Cazaux |
| 10,216,082 B2 | 2/2019 | Kang et al. |
| 2009/0256237 A1* | 10/2009 | Kobayashi ........ H01L 21/76897 257/532 |
| 2010/0055865 A1 | 3/2010 | You et al. |
| 2013/0267092 A1* | 10/2013 | Shin .................. H01L 21/76816 438/666 |
| 2015/0340246 A1* | 11/2015 | Woo .................... H01L 21/0332 438/703 |
| 2015/0364334 A1* | 12/2015 | Kang .................. H01L 21/0273 438/703 |
| 2017/0147740 A1 | 5/2017 | Chang |
| 2017/0371250 A1* | 12/2017 | Kim .......................... G03F 1/44 |
| 2018/0151362 A1* | 5/2018 | Kang .................. H01L 21/0271 |
| 2018/0173837 A1 | 6/2018 | Won et al. |
| 2018/0174831 A1* | 6/2018 | Liu .................. H01L 21/02282 |
| 2019/0043865 A1* | 2/2019 | Chang ............... H01L 27/10876 |
| 2019/0172717 A1* | 6/2019 | Ko .................... H01L 21/31144 |
| 2019/0386009 A1* | 12/2019 | Kim .................. H01L 21/76879 |

* cited by examiner

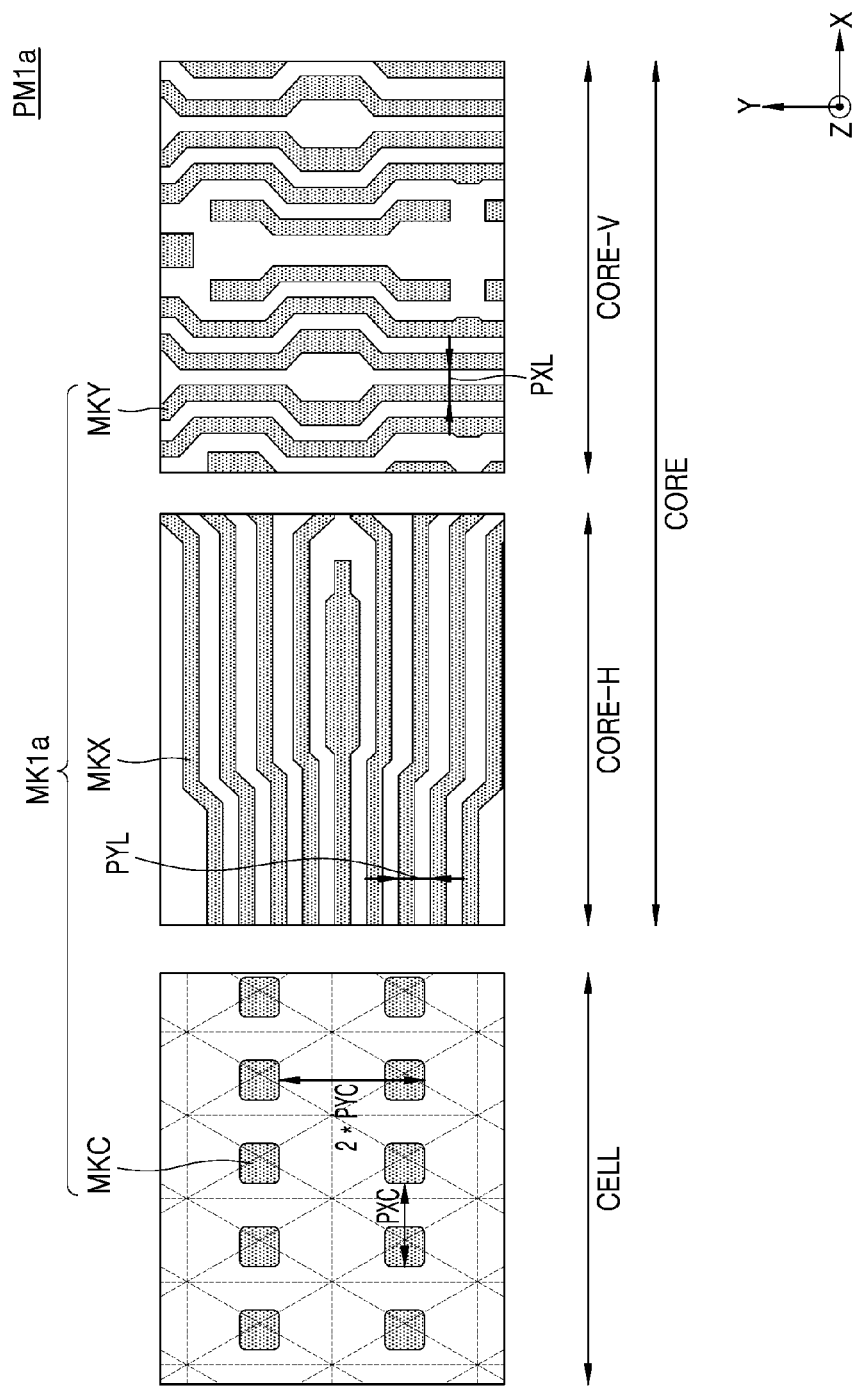

METHOD OF MANUFACTURING PHOTOMASK SET FOR FORMING PATTERNS, AND METHOD OF MANUFACTURING SEMICONDUCTOR DEVICE USING THE PHOTOMASK SET

CROSS-REFERENCE TO RELATED APPLICATION

Korean Patent Application No. 10-2019-0134791, filed on Oct. 28, 2019, in the Korean Intellectual Property Office, and entitled: "Method of Manufacturing Photomask Set for Forming Patterns, and Method of Manufacturing Semiconductor Device Using the Photomask Set" is incorporated by reference herein in its entirety.

BACKGROUND

1. Field

The present disclosure relates to a method of manufacturing a photomask set for forming patterns and a method of manufacturing a semiconductor device by using a photomask.

2. Description of the Related Art

With the rapid development of electronics industry and user needs, electronic devices are becoming more compact and lightweight. Accordingly, semiconductor devices used in electronic devices require high integration, and design rules for configurations of the semiconductor devices are decreasing. Therefore, the difficulty in processes of forming patterns of the semiconductor devices is increasing.

SUMMARY

According to an aspect of the present disclosure, there is provided a method of manufacturing a photomask set, the method including preparing a mask layout, the mask layout including a plurality of first layout patterns apart from one another in a first region, wherein distances between center points of three layout patterns adjacent to one another from among the plurality of first layout patterns respectively have different values, grouping pairs of first layout patterns, in which a distance between two first layout patterns adjacent to each other does not have a smallest value, and splitting the mask layout pattern into at least two mask layouts, and forming a photomask set including at least two photomasks each including a mask pattern corresponding to the first layout pattern included in each of the mask layout patterns split into at least two mask layouts.

According to another aspect of the present disclosure, there is provided a method of manufacturing a semiconductor device by using a photomask set, the method including forming a plurality of bit-line structures having bit-lines extending in parallel to one another in a first horizontal direction on a substrate, forming a plurality of buried contacts filling lower portions of spaces between the plurality of bit-line structures on the substrate, and forming a plurality of landing pads by using a photomask set including a first photomask and a second photomask, the plurality of landing pads filling upper portions of spaces between the plurality of bit-line structures and extending onto the plurality of bit-line structures, and including a first landing pad, a second landing pad, and a third landing pad adjacent to one another, wherein a triangle connecting center points of top surfaces of the first landing pad and the second landing pad, and the third landing pad includes a scalene triangle, and the forming of the plurality of landing pads includes forming a landing pad material layer filling the upper portions of the spaces between the plurality of bit-line structures and covering the plurality of bit-line structures, forming a plurality of first hardmask patterns on the landing pad material layer by using the first photomask, forming a plurality of second hardmask patterns by using the second photomask in space between the plurality of first hardmask patterns on the landing pad material layer, and patterning the landing pad material layer by using the plurality of first hardmask patterns and the plurality of second hardmask patterns as etching masks.

According to yet another aspect of the present disclosure, there is provided a method of manufacturing a semiconductor device, the method including forming a plurality of word-lines extending in parallel to one another in a first horizontal direction across a plurality of active regions on a substrate in which the plurality of active regions are defined by an isolation layer, forming, on the substrate, a plurality of bit-line structures having bit-lines extending in parallel to one another in a second horizontal direction orthogonal to the first horizontal direction, forming, on the substrate, a plurality of buried contacts filling lower portions of spaces between the plurality of bit-line structures and connected to the plurality of active regions, forming a plurality of landing pads by using a photomask set including a first photomask and a second photomask, the plurality of landing pads being connected to the plurality of buried contacts, filling upper portions of spaces between the plurality of bit-line structures, extending onto the plurality of bit-line structures, and each having a circle-shape top surface, and forming, on the plurality of bit-line structures, a plurality of storage nodes connected to the plurality of landing pads, wherein the forming of the plurality of landing pads includes forming a landing pad material layer filling upper portions of spaces between the plurality of bit-line structures and covering the plurality of bit-line structures, forming a plurality of first hardmask patterns and a plurality of second hardmask patterns apart from the plurality of first hardmask patterns, on the landing pad material layer, by sequentially using the first photomask and the second photomask, and patterning the landing pad material layer by using the plurality of first hardmask patterns and the plurality of second hardmask patterns as etching masks, wherein lengths of three sides of a triangle connecting center points of top surfaces of three landing pads adjacent to one another from among the plurality of landing pads respectively have a base distance having a value of 3 F (feature size), a first side distance greater than the base distance, and a second side distance less than the base distance, and in the forming of the plurality of storage nodes, lengths of three sides of a triangle connecting center points of top surfaces of three storage nodes adjacent to one another from among the plurality of storage nodes have a value of 3 F (feature size).

BRIEF DESCRIPTION OF THE DRAWINGS

Features will become apparent to those of skill in the art by describing in detail exemplary embodiments with reference to the attached drawings in which:

FIGS. 4A, 4B, 5A, and 5B illustrate schematic top-plan views of a photomask set for forming patterns according to example embodiments;

DETAILED DESCRIPTION

Figure 1:
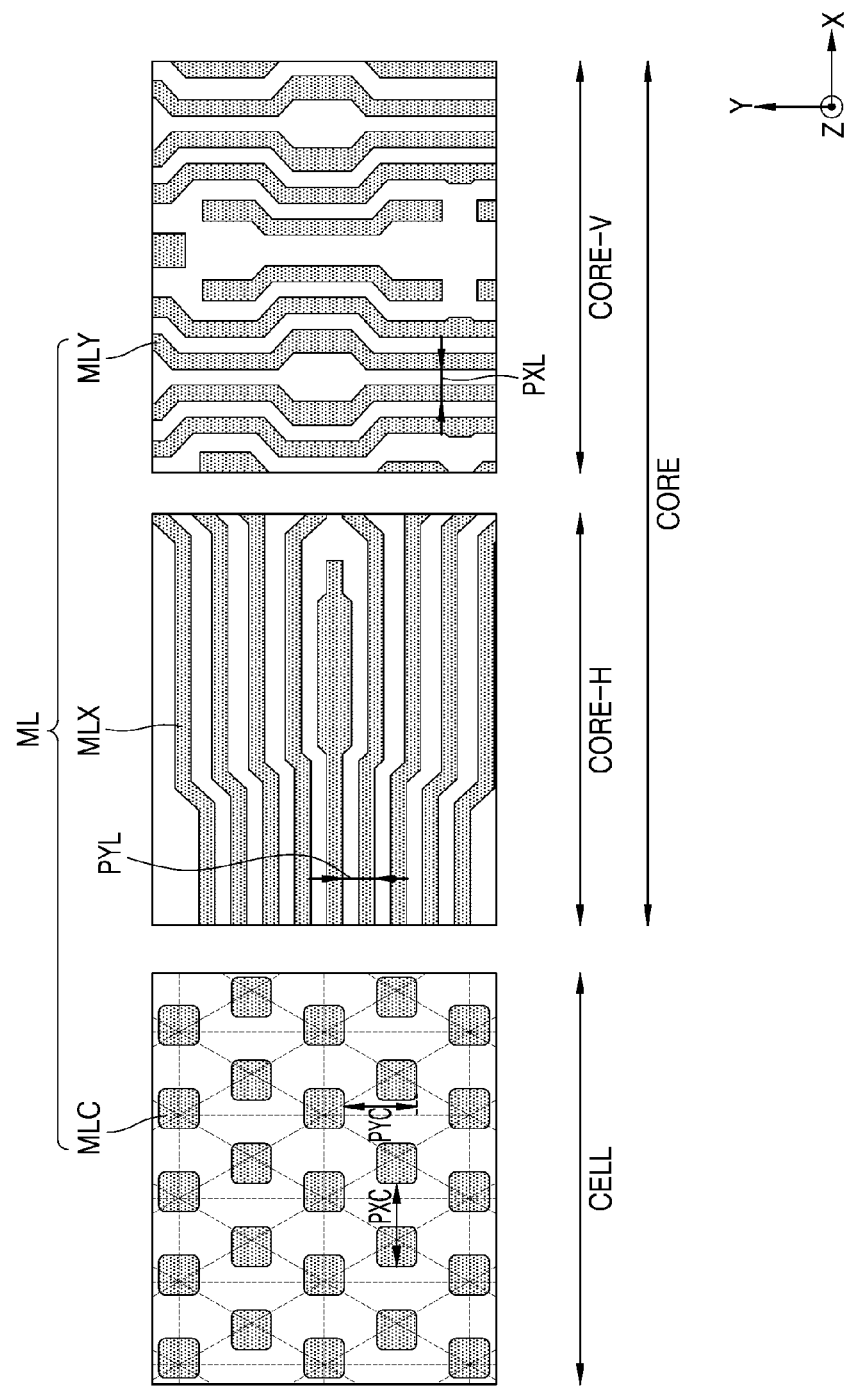
FIG. 1 illustrates a schematic top-plan view of a mask layout for manufacturing a photomask set for forming patterns according to example embodiments.

FIG. 1 is a schematic top-plan view of a mask layout ML for manufacturing a photomask set for forming patterns according to example embodiments.

Referring to FIG. 1, the mask layout ML may include a plurality of first layout patterns MLC, a plurality of second layout patterns MLX, and a plurality of third layout patterns MLY.

The plurality of first layout patterns MLC may be island-shaped layout patterns spaced apart from one another. The plurality of first layout patterns MLC may respectively correspond to a plurality of contact patterns or a plurality of holes in a semiconductor device. The plurality of first layout patterns MLC may be arranged in a honeycomb shape aligned in a row in a first horizontal direction (the X direction) in a plane and aligned in zigzag in a second horizontal direction (the Y direction), e.g., the rows of first layout patterns MLC in the first horizontal direction (X direction) may be offset with respect to each other along the second horizontal direction Y direction). The plurality of first layout patterns MLC may be arranged in a row having a first cell pitch PXC in the first horizontal direction (X direction). In the plurality of first layout patterns MLC, rows arranged in the first horizontal direction (X direction) may be arranged having a second cell pitch PYC in the second horizontal direction (Y direction). In an embodiment, the first cell pitch PXC may have a value greater than that of the second pitch PYC. For example, the first cell pitch PXC may have a value of 3 feature size (3 F), and the second cell pitch PYC may have a value of 2.6 feature size (2.6 F). The plurality of first layout patterns MLC may be formed to have a crushed honeycomb shape, which will be described in detail with reference to FIGS. 2A and 2B.

The plurality of second layout patterns MLX may be a plurality of line-shape layout patterns generally extending in the first horizontal direction (X direction) and arranged to be spaced apart from one another in the second horizontal direction (Y direction). The plurality of second layout patterns MLX may respectively correspond to a plurality of line patterns included in the semiconductor device. The plurality of third layout patterns MLY may be a plurality of line-shaped layout patterns generally extending in the second horizontal direction (Y direction) and arranged to be spaced apart from one another in the first horizontal direction (X direction). The plurality of second layout patterns MLX may have a first core pitch PYL as a minimum pitch in the second horizontal direction (Y direction), and the plurality of third layout patterns MLY may have a second core pitch PXL as a minimum pitch in the first horizontal direction (X direction). In some embodiments, the first core pitch PYL and the second core pitch PXL may have a value of 3 F (feature size).

The plurality of third layout patterns MLY may respectively correspond to a plurality of line patterns included in the semiconductor device. The plurality of third layout patterns MLY may be a plurality of line-shape layout patterns for forming a plurality of line-shape patterns generally extending in the second horizontal direction (Y direction) in the semiconductor device. The first horizontal direction (X direction) and the second horizontal direction (Y direction) may be orthogonal to each other.

The second layout pattern MLX and the third layout pattern MLY are line-shaped patterns "generally" extending respectively in the first horizontal direction (the X direction) and the second horizontal direction (the Y direction). However, this does not mean that the second layout patterns MLX and the third layout patterns MLY are straight line-shaped patterns extending in the first horizontal direction (the X direction) and the second horizontal direction (the Y direction) but means that the second layout patterns MLX and the third layout patterns MLY are generally similar to line-forming patterns extending in the first horizontal direction (the X direction) and the second horizontal direction (the Y direction) even when there are some bent portions or a change in width.

A region in which the first layout patterns MLC are arranged may be referred to as a first region CELL, and a region in which the second layout patterns MLX and the third layout patterns MLY are arranged may be referred to as a second region CORE. The first region CELL may correspond to a cell region of the semiconductor device and the second region CORE may correspond to a core region of the semiconductor device, but embodiments are not limited thereto. Regions in which the second layout patterns MLX and the third layout patterns MLY are arranged may be referred to as a first line region CORE-H and a second line region CORE-V, respectively. In the present specification, regions in the photomask and the semiconductor device corresponding to the first region CELL, the second region CORE, the first line region CORE-H, and the second line region CORE-V of the mask layout ML may also be referred to as the first region CELL, the second region CORE, the first line region CORE-H, and the second line region CORE-V.

Planar shapes of the plurality of first layout patterns MLC, the plurality of second layout patterns MLX, and the plurality of third layout patterns MLY are schematically shown in order to show positions at which the first through third layout patterns MLC through MLY are arranged. Thus, the planar shapes may be different from a planar shape of an actual layout pattern of the mask layout ML. For example, the planar shapes of the plurality of first layout patterns MLC, the plurality of second layout patterns MLX, and the plurality of third layout patterns MLY may be a result of performing optical proximity correction (OPC) for forming a plurality of contact patterns, a plurality of holes, or a plurality of line patterns included in a semiconductor device into desired shapes.

Figure 2A:
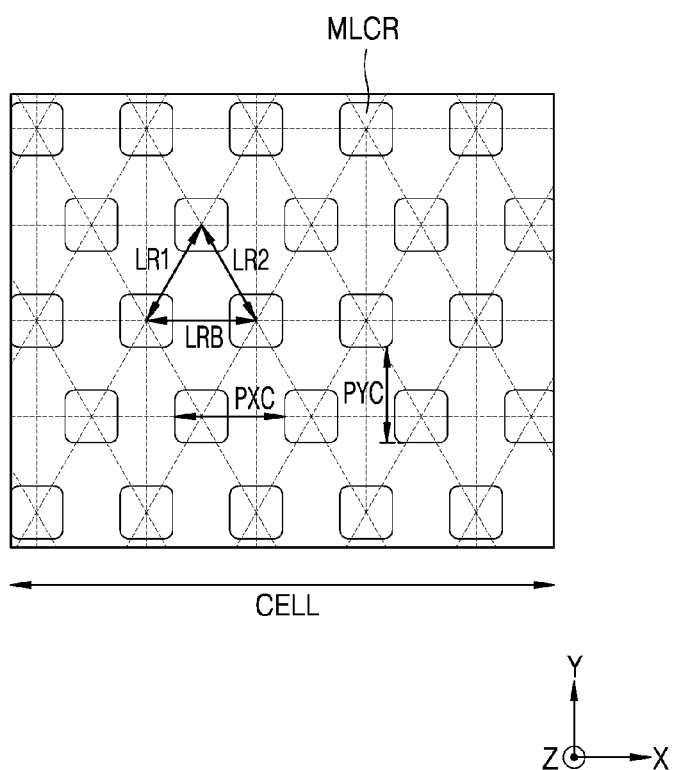
FIGS. 2A and 2B illustrate schematic top-plan views of a process for designing a cell region of a mask layout for manufacturing a photomask set for forming patterns according to example embodiments.
Figure 2B:
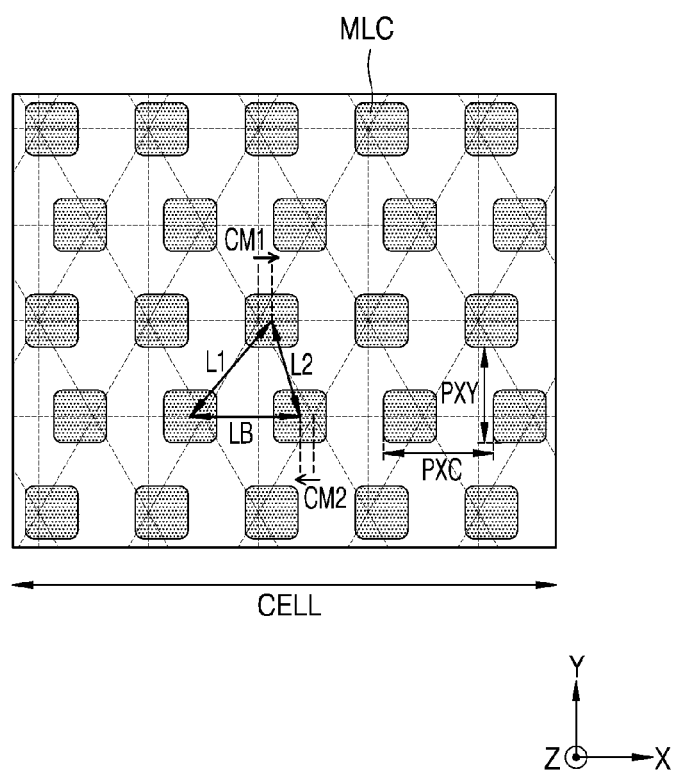

FIGS. 2A and 2B are schematic top-plan views for describing a process of designing a cell region of the mask layout for manufacturing the photomask set for forming patterns according to example embodiments. In detail, FIG. 2B is a top-plan view showing an arrangement of the plurality of first layout patterns MLC in the cell region of the mask layout for manufacturing a photomask set for forming patterns according to example embodiments, and FIG. 2A is a top-plan view showing an arrangement of a plurality of virtual reference layout patterns MLCR referred for effectively describing the arrangement of the plurality of first layout patterns MLC shown in FIG. 2B.

Referring to FIG. 2A, the plurality of virtual reference layout patterns MLCR may have a honeycomb shape aligned in a row in the first horizontal direction (the X direction) in a plane and aligned in zigzag in the second horizontal direction (the Y direction). The plurality of reference layout patterns MLCR denote a case in which a triangle connecting center points of three reference layout patterns MLCR adjacent to one another is an equilateral triangle and at least two of three interior angles of the triangle connecting the center points of three reference layout patterns MLCR adjacent to one another have a same value.

In three reference layout patterns MLCR adjacent to one another, a reference base distance LRB, which is a distance between center points of two reference layout patterns MLCR adjacent to each other in the first horizontal direction (the X direction), and a first reference side distance LR1 and a second reference distance LR2, which are respective distances between the center points of two reference layout patterns MLCR adjacent to each other in the first horizontal direction (the X direction) and a center of one reference layout pattern MLCT adjacent to the two reference layout patterns MLCR in the second horizontal direction (the Y direction), may have a value of 3 F (feature size), i.e., an identical value. The reference base distance LRB may have a same value as that of the first cell pitch PXC. A distance having a value of 3 F may be referred to as a reference distance.

Referring to FIG. 2B, the plurality of first layout patterns MLC may have a honeycomb shape aligned in a row in the first horizontal direction (the X direction) in a plane and aligned in zigzag in the second horizontal direction (the Y direction). In the plurality of first layout patterns MLC, a triangle connecting center points of three first layout patterns MLC adjacent to one another may be a scalene triangle.

In three first layout patterns MLC adjacent to one another, a base distance LB, which is a distance between center points of two first layout patterns MLC adjacent to each other in the first horizontal direction (the X direction), and a first side distance L1 and a second side distance L2, which are distances between the center points of two first layout patterns MLC adjacent to each other in the first horizontal direction (the X direction) and one first layout pattern MLC adjacent to the two first layout patterns MLC in the second horizontal direction (the Y direction), may have different values. In some embodiments, the first side distance L1 may have a value greater than a value of the base distance LB, and the second side distance L2 may have a value less than the value of the base distance LB. For example, the first side distance L1 may have a value greater than 3 F (feature size), and the second side distance L2 may have a value less than 3 F (feature size). The base distance LB may have a same value as that of the first cell pitch PXC.

Compared to the plurality of reference layout patterns MLCR (FIG. 2A), in the plurality of first layout patterns MLC, center points of the plurality of first layout patterns MLC may be shifted from center points of the plurality of reference layout patterns MLCR by a certain distance in the first horizontal direction (the X direction) or a direction (the −X direction) opposite to the first horizontal direction (the X direction). Compared to the plurality of reference layout patterns MLCR, in the plurality of first layout patterns MLC, rows arranged in the first horizontal direction (the X direction) may be alternately shifted in the second horizontal direction (the Y direction) by a first moving distance CM1 in the horizontal direction (the X direction) and a second moving distance CM2 in the direction (the −X direction) opposite to the first horizontal direction (the X direction). In some embodiments, the first moving distance CM1 and the second moving distance CM2 may have a same value.

Figure 3:
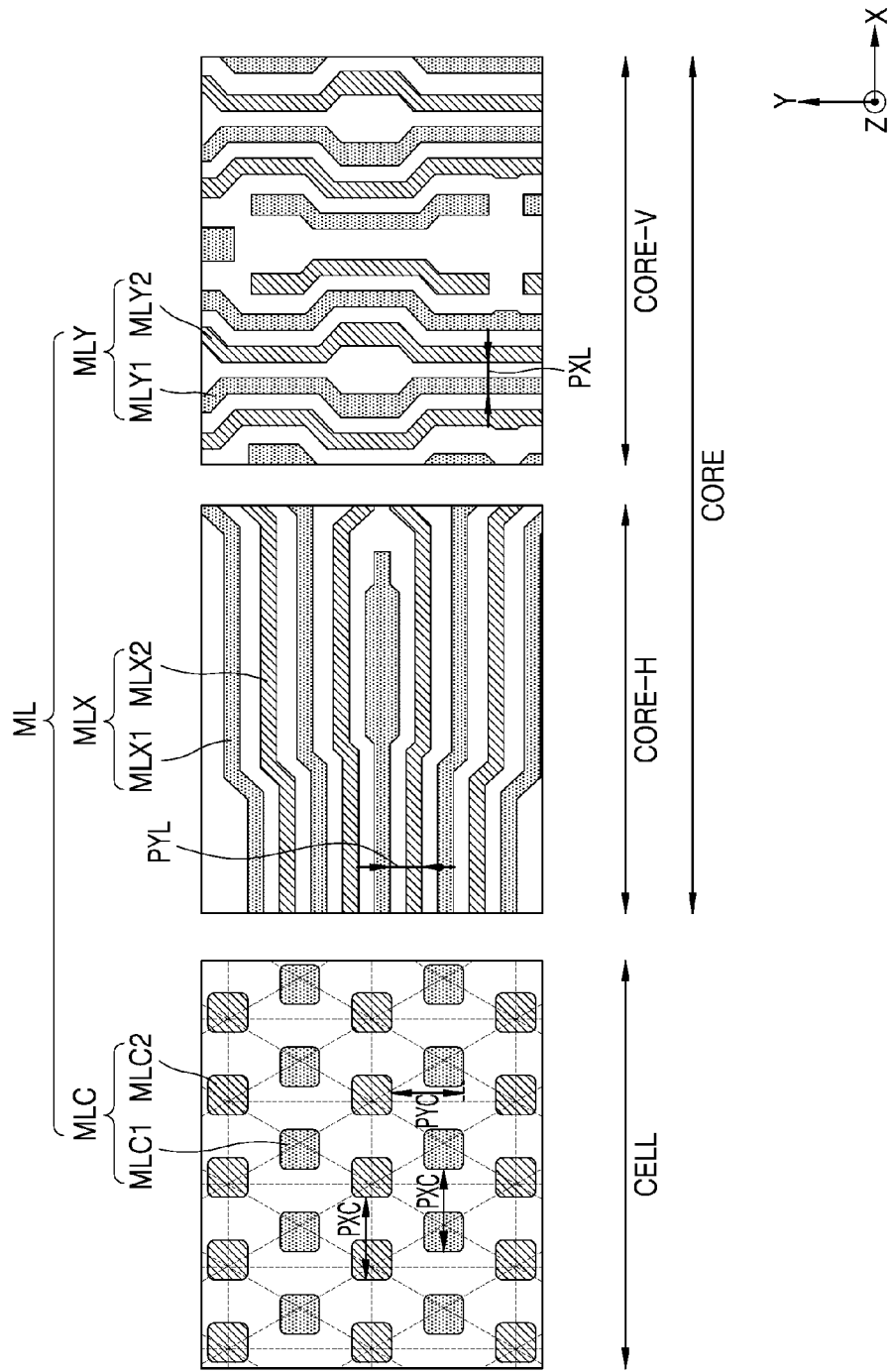
FIG. 3 illustrates a schematic top-plan view of a process for dividing a mask layout for manufacturing a photomask set for forming patterns according to example embodiments.

FIG. 3 is a schematic top-plan view for describing a process of splitting the mask layout for manufacturing the photomask set for forming patterns according to example embodiments, and FIGS. 4A, 4B, 5A, and 5B are each a schematic top-plan view of the photomask set for forming patterns according to example embodiments.

Referring to FIG. 3, the mask layout ML may include the plurality of first layout patterns MLC, the plurality of second layout patterns MLX, and the plurality of third layout patterns MLY (described with reference to FIG. 1). The plurality of first layout patterns MLC, the plurality of second layout patterns MLX, and the plurality of third layout patterns MLY are split into a plurality of first even layout patterns MCL 1 and a plurality of first odd layout patterns MLC2, a plurality of second even layout patterns MLX1 and a plurality of second odd layout patterns MLX2, a plurality of third even layout patterns MLY1 and a plurality of third odd layout patterns MLY2, respectively.

For example, the plurality of first layout patterns MLC may be split into groups by selecting a group of the first layout patterns MLC, in which a distance between center points of two first layout patterns MLC adjacent to each other has a value greater than the second side distance L2 (see FIG. 2B), and split the selected layout patterns into the plurality of first even layout patterns MLC1 and the first odd layout patterns MLC2. The plurality of first even layout patterns MLC1 and the plurality of first odd layout patterns MLC2 each may be obtained by selecting pairs of layout patterns MLC adjacent to each other, in which a distance between center points of the two first layout patterns MLC is equal to the side distance LB (see FIG. 2B), and grouping the pairs of layout patterns. For example, the plurality of first even layout patterns MLC1 and the first odd layout patterns MLC2 may be obtained by alternately selecting rows arranged in the horizontal direction (the X direction) from the plurality of first layout patterns MLC.

The plurality of second even layout patterns MLX1 and the plurality of second odd layout patterns MLX2 may be obtained by alternately selecting the plurality of second layout patterns MXL arranged apart from one another in the second horizontal direction (the Y direction). The plurality of third even layout patterns MLY1 and the plurality of third odd layout patterns MLY2 may be obtained by alternately selecting the plurality of third layout patterns MLY arranged apart from one another in the first horizontal direction (the X direction).

Figure 4A:
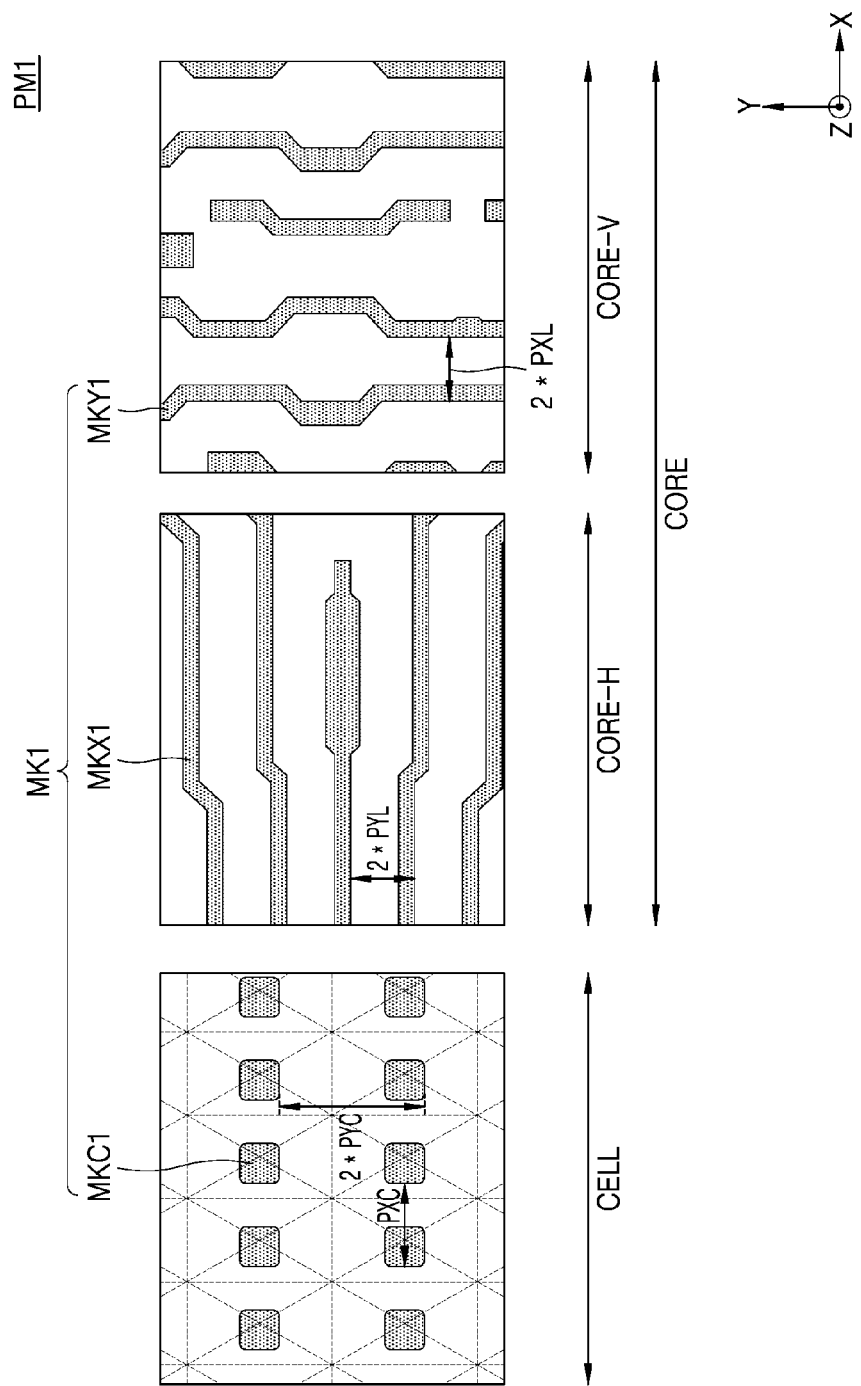
Figure 4B:
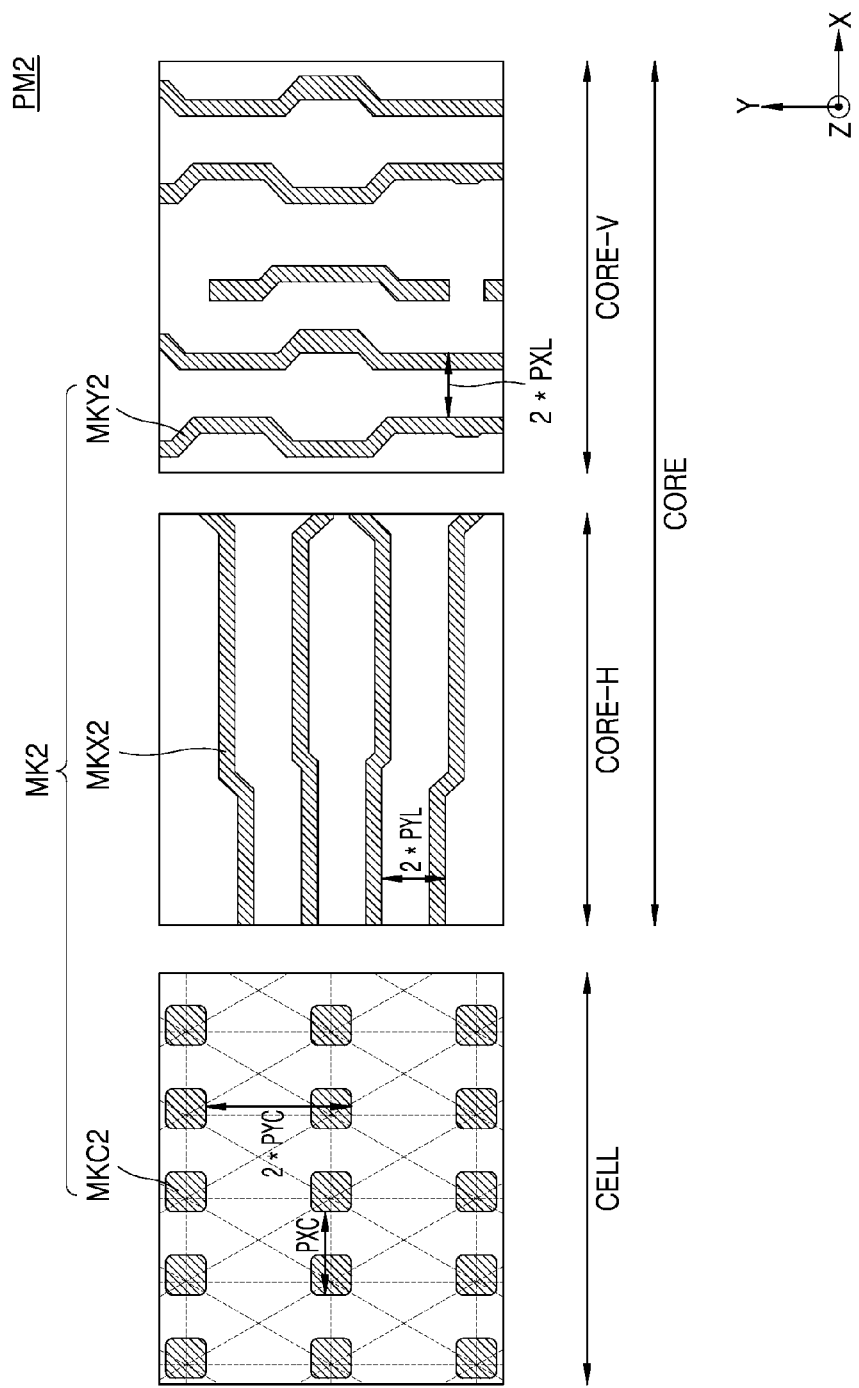

Referring to FIGS. 4A and 4B, a photomask set PM1 and PM2 may include a first photomask PM1 including a first mask pattern MK1 and a second photomask PM2 including a second mask pattern MK2. The first mask pattern MK1 may include a plurality of first even mask patterns MKC1 arranged in the first region CELL, a plurality of second even mask patterns MKX1 arranged in the first line region CORE-H of the second region CORE, and a plurality of third even mask patterns MKY1 arranged in the second line region CORE-V of the second region CORE. The second mask pattern MK2 may include a plurality of first odd mask patterns MKC2 arranged in the first region CELL, a plurality of second odd mask patterns MKX2 arranged in the first line region CORE-H of the second region CORE, and a plurality of third odd mask patterns MKY2 arranged in the second line region CORE-V of the second region CORE.

The plurality of first even mask patterns MKC1, the plurality of second even mask patterns MKX1, and the plurality of third even mask patterns MKY1 may be formed from the plurality of first even layout patterns MLC1, the plurality of second even layout patterns MLX1, and the plurality of third even layout patterns MLY1, respectively. The plurality of first odd mask patterns MKC2, the plurality of second odd mask patterns MKX2, and the plurality of third odd mask patterns MKY2 may be formed from the plurality of first odd layout patterns MLC2, the plurality of second odd layout patterns MLX2, and the plurality of third odd layout patterns MLY2, respectively.

The plurality of first even mask patterns MKC1 and the plurality of first odd mask patterns MKC2 may be arranged having a pitch of the first cell pitch PXC in the first horizontal direction (the X direction) and arranged having a pitch of twice the second cell pitch PYC (2*PYC) in the second horizontal direction (the Y direction), respectively. The plurality of second even mask patterns MKX1 and the plurality of second odd mask patterns MKX2 may be arranged having a pitch of twice the first core pitch PYL (2*PYL) as a minimum pitch in the second horizontal direction (Y direction), respectively. The plurality of third even mask patterns MKY1 and the plurality of third odd mask patterns MKY2 may be arranged having a pitch of twice the second core pitch PXL (2*PXL) as a minimum pitch in the first horizontal direction (X direction), respectively.

Figure 5B:
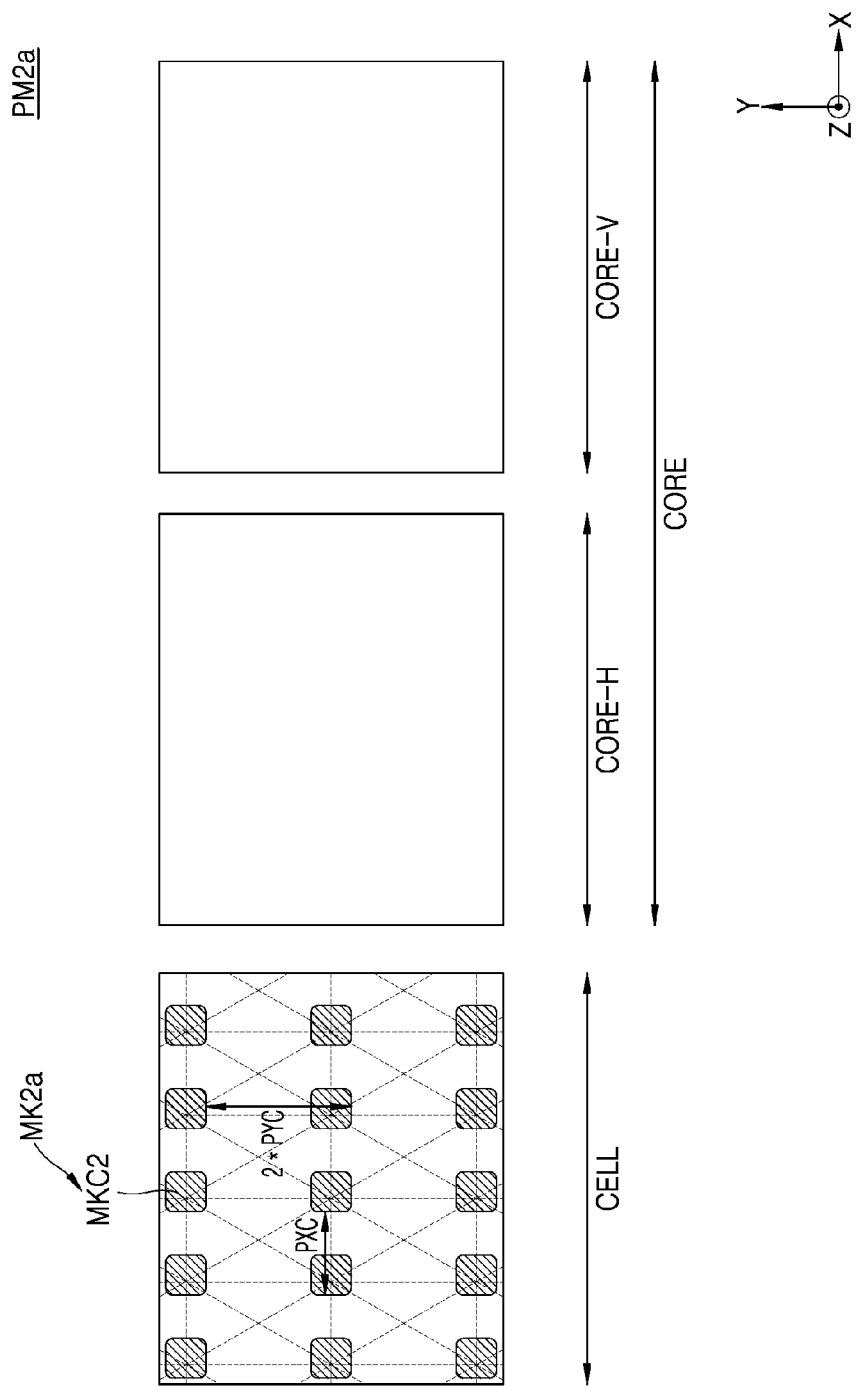

Referring to FIGS. 5A and 5B, the photomask set PM1a and PM2a may include a first photomask PM1a including a first mask pattern MK1a and a second photomask PM2a including a second mask pattern MK2a. The first mask pattern MK1a may include the plurality of first even mask patterns MKC arranged in the first region CELL, the plurality of second even mask patterns MKX arranged in the first line region CORE-H of the second region CORE, and the plurality of third even mask patterns MKY arranged in the second line region CORE-V of the second region CORE. The second mask pattern MK2a may include the plurality of second odd mask patterns MKC2 arranged in the first region CELL. The second mask pattern MK2a included in the second photomask PM2a may not be arranged in the second region CORE.

The plurality of first even mask patterns MKC1 the plurality of first odd mask patterns MKC2, the plurality of second mask patterns MKX, and the plurality of third even mask patterns MKY may be formed from the plurality of first even layout patterns MLC1, the plurality of first odd layout patterns MLC2, the plurality of second layout patterns MLX, and the plurality of third layout patterns MLY, respectively.

The plurality of first even mask patterns MKC1 and the plurality of first odd mask patterns MKC2 may be arranged having a pitch of the first cell pitch PXC in the first horizontal direction (the X direction) and arranged having a pitch of twice the second cell pitch PYC (2*PYC) in the second horizontal direction (the Y direction), respectively. The plurality of second mask patterns MKX may be arranged having a pitch of the first core pitch PYL as a minimum pitch in the second horizontal direction (Y direction). The plurality of third mask patterns MKY may be arranged having the pitch of the first core pitch PLY as a minimum pitch in the first horizontal direction (the X direction).

Figure 6:
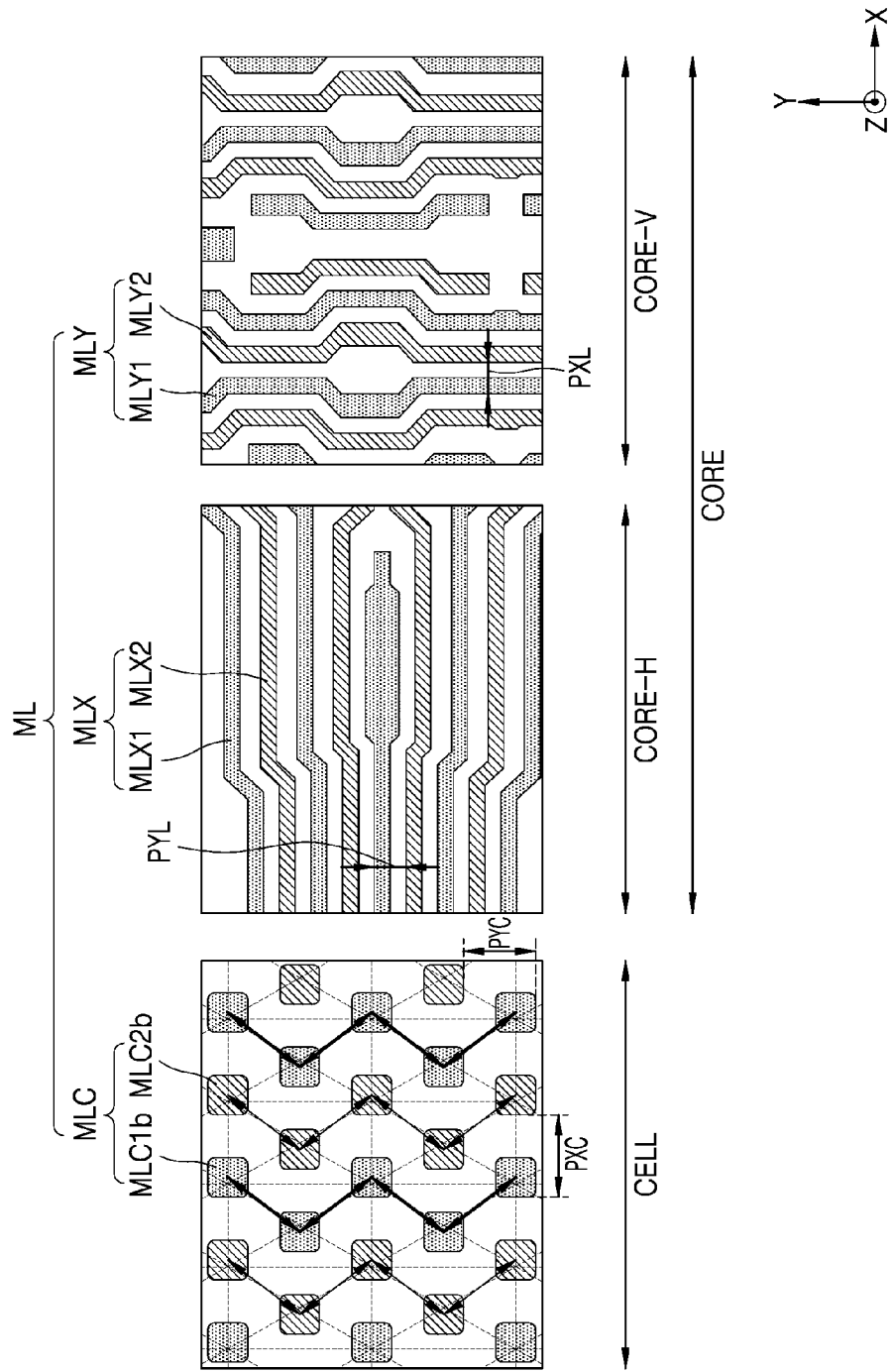
FIG. 6 illustrates a schematic top-plan view of a process for dividing a mask layout for manufacturing a photomask set for forming patterns according to example embodiments.

FIG. 6 is a schematic top-plan view for describing a process of splitting a mask layout for manufacturing the photomask set for forming patterns according to example embodiments, and FIGS. 7A, 7B, 8A, and 8B are each a schematic top-plan view of a photomask set for forming patterns according to example embodiments.

Referring to FIG. 6, the plurality of first layout patterns MLC, the plurality of second layout patterns MLX, and the plurality of third layout patterns are split into a plurality of first even layout patterns MLC1b and a plurality of first odd layout patterns MLC2b, a plurality of second even layout patterns MLX1 and a plurality of second odd layout patterns MLX2, and a plurality of third even layout patterns MLY1 and a plurality of third odd layout patterns MLY2, respectively.

In the plurality of first layout patterns MLC, a pair of first layout patterns MLC in which each distance between center points of two first layout patterns MLC adjacent to each other has a value greater than the second side distance L2 (see FIG. 2B) that is a smallest distance value may be selected, and the plurality of first layout patterns MLC that are selected may be split into the plurality of first even layout patterns MLC1b and the plurality of first odd layout patterns MLC2b. The plurality of first even layout patterns MLC1b and the plurality of first odd layout patterns MLC2b each may be obtained by selecting, from the plurality of layout patterns MLC, pairs of layout patterns MLC adjacent to each other, in which a distance between center points of the two first layout patterns MLC is the first side distance L1 (see FIG. 2B) that has a greatest value, and grouping the pairs of layout patterns. For example, the plurality of first even layout patterns MLC1b and the plurality of first odd layout patterns MLC2b may be obtained by alternately selecting rows arranged in zigzag in the second horizontal direction (the Y direction) from the plurality of first layout patterns MLC.

Figure 7A:
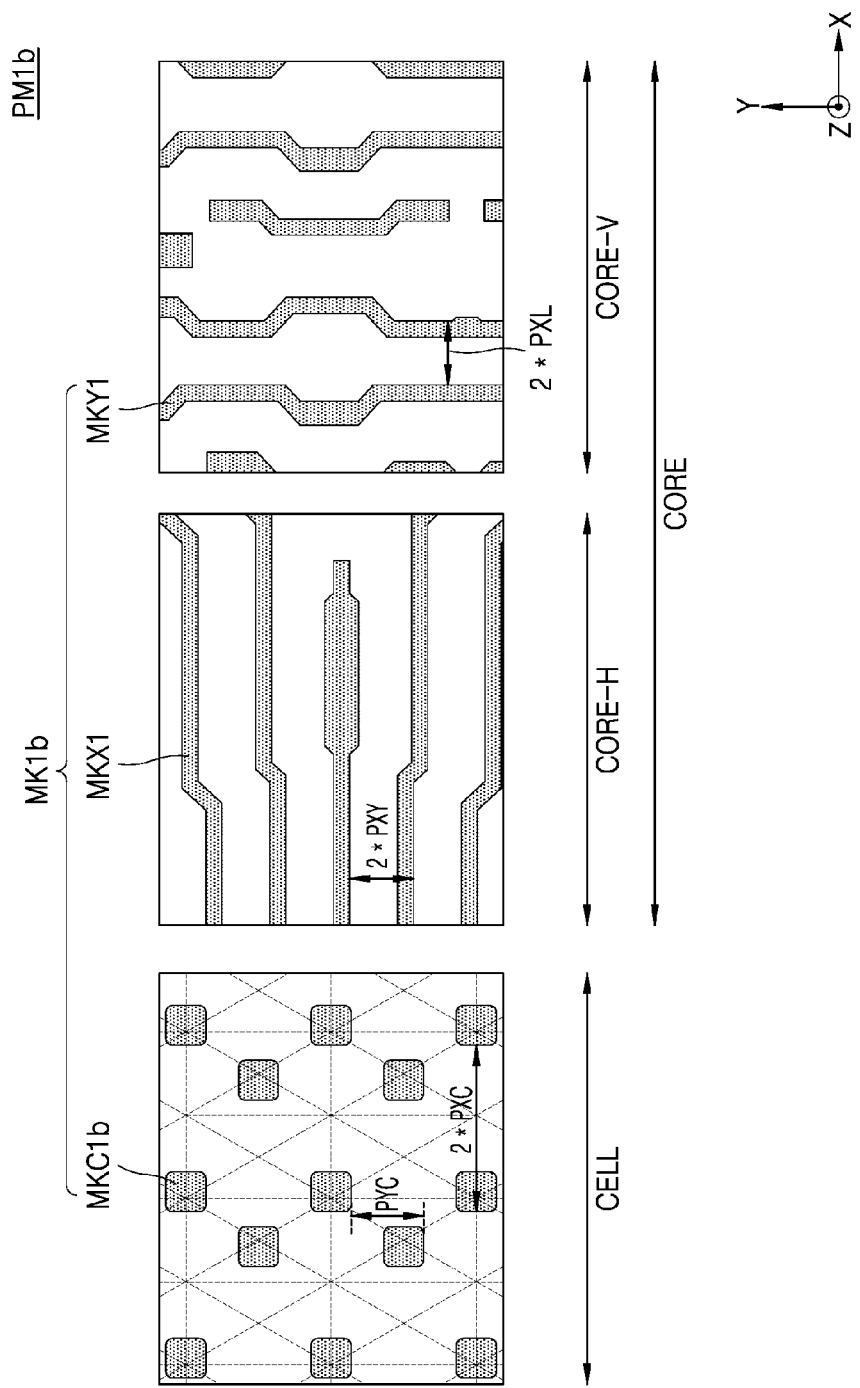
FIGS. 7A, 7B, 8A, and 8B illustrate schematic top-plan views of a photomask set for forming patterns according to example embodiments.
Figure 7B:
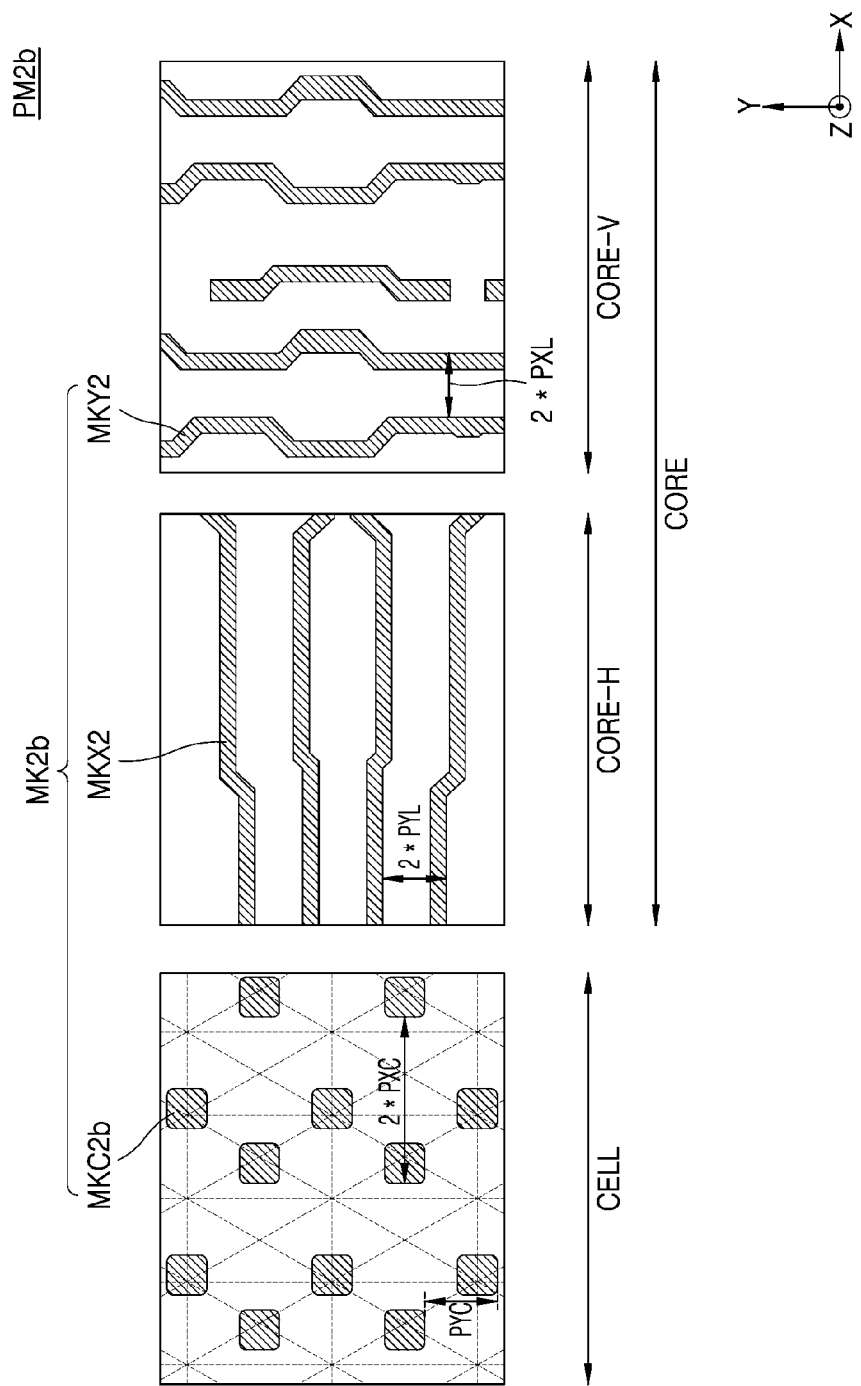

Referring to FIGS. 7A and 7B, a photomask set PM1b and PM2b may include a first photomask PM1b including a first mask pattern MK1b and a second photomask PM2b including a second mask pattern MK2b. The first mask pattern MK1b may include a plurality of first even mask patterns MKC1b arranged in the first region CELL, the plurality of second even mask patterns MKX1 arranged in the first line region CORE-H of the second region CORE, and the plurality of third even mask patterns MKY1 arranged in the second line region CORE-V of the second region CORE.

The second mask pattern MK2b may include a plurality of first odd mask patterns MKC2b included in the first region CELL, the plurality of second odd mask patterns MKX2 arranged in the first line region CORE-H of the second region CORE, and the plurality of third odd mask patterns MKY2 arranged in the second line region CORE-V of the second region CORE.

The plurality of first even mask patterns MKC1b, the plurality of second even mask patterns MKX1, and the plurality of third even mask patterns MKY1 may be formed from the plurality of first even layout patterns MLC1b, the plurality of second even layout patterns MLX1, and the plurality of third even layout patterns MLY1, respectively. The plurality of first odd mask patterns MKC2b, the plurality of second odd mask patterns MKX2, and the plurality of third odd mask patterns MKY2 may be formed from the plurality of first odd layout patterns MLC2b, the plurality of second odd layout patterns MLX2, and the plurality of third odd layout patterns MLY2 shown in FIG. 6, respectively. The plurality of first even mask patterns MKC1b and the plurality of first odd mask patterns MKC2b may be arranged having a pitch of twice the first cell pitch PXC (2*PXC) in the first horizontal direction (X direction) and arranged having a pitch of the second cell pitch PYC in the second horizontal direction (Y direction).

Figure 8A:
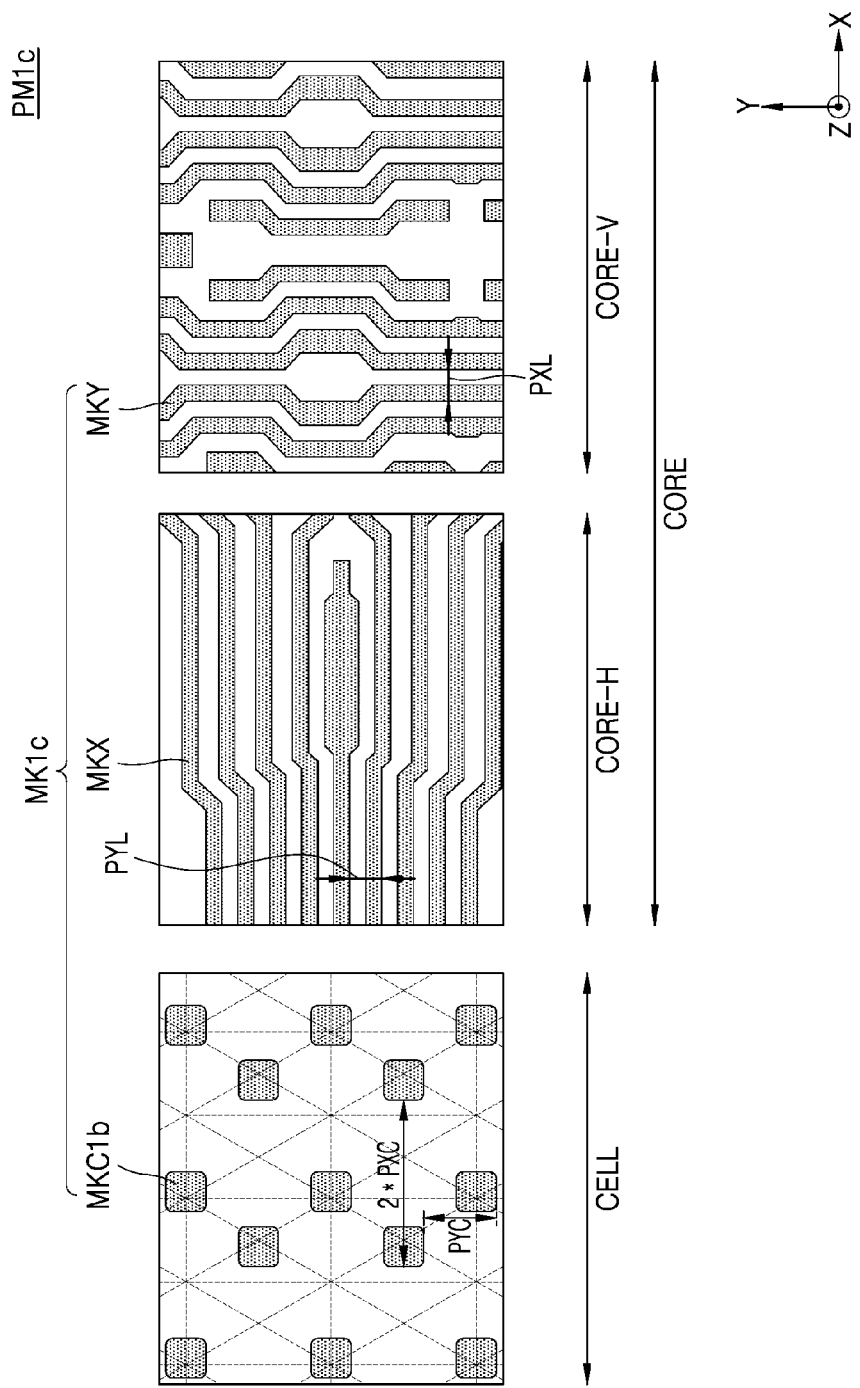
Figure 8B:
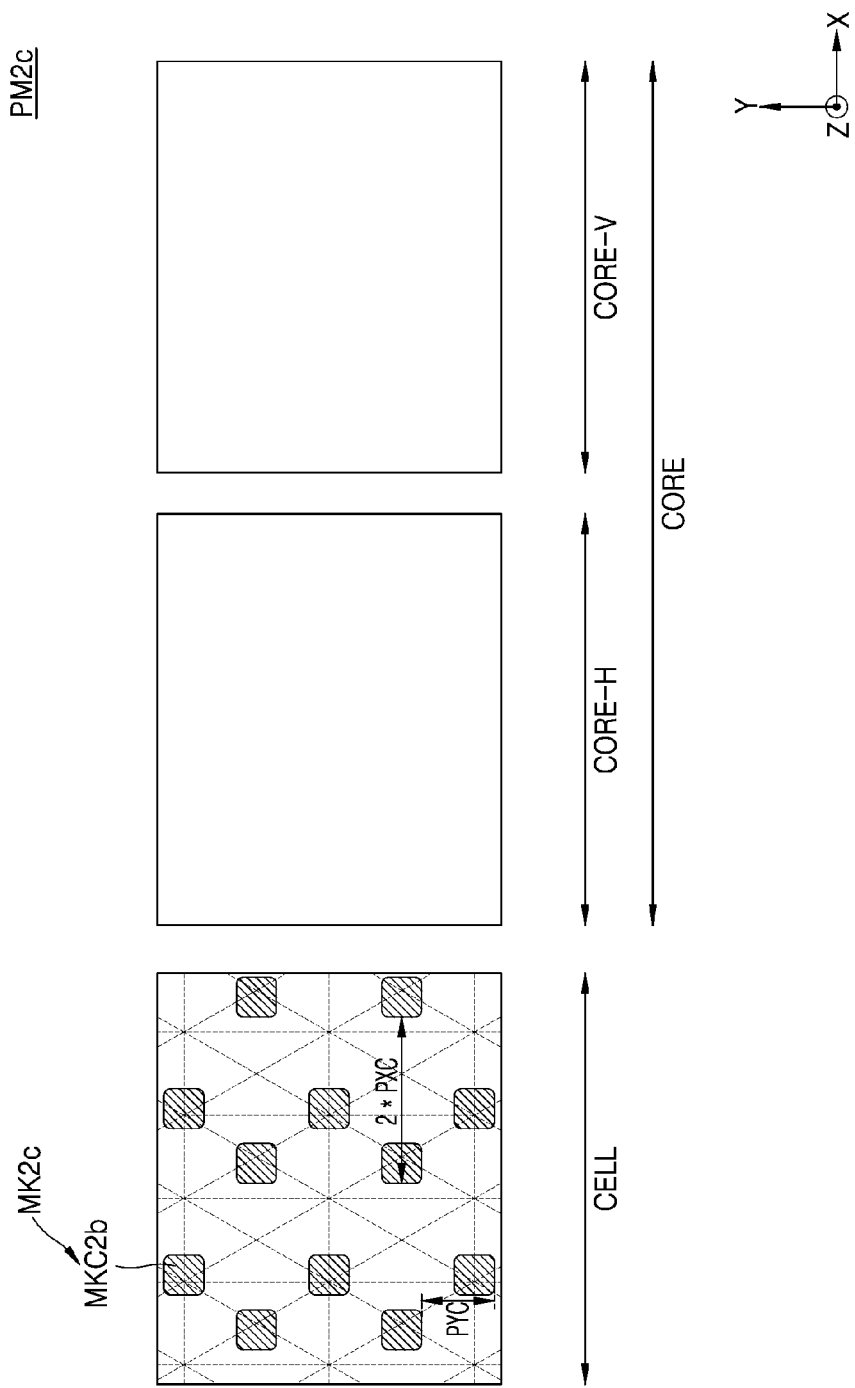

Referring to FIGS. 8A and 8B, a photomask set PM1c and PM2c may include a first photomask PM1c including a first mask pattern MK1c and a second photomask PM2c including a second mask pattern MK2c. The first mask pattern MK1c may include a plurality of first even mask patterns MKC1b arranged in the first region CELL, a plurality of second mask patterns MKX arranged in the first line region CORE-H of the second region CORE, and a plurality of third even mask patterns MKY arranged in the second line region CORE-V of the second region CORE. The second mask pattern MK2c may include a plurality of first odd mask patterns MKC2b arranged in the first region CELL. The second mask pattern MK2c included in the second photomask PM2c may not be arranged in the second region CORE.

The plurality of first even mask patterns MKC1b, the plurality of first odd mask patterns MKC2b, the plurality of second mask patterns MKX, and the plurality of third mask patterns MKY may be formed from the plurality of first even layout patterns MLC1b, the plurality of first odd layout patterns MLC2b, the plurality of second layout patterns MLX, and the plurality of third layout patterns MLY shown in FIG. 6, respectively. The plurality of first even mask patterns MKC1b and the plurality of first odd mask patterns MKC2b may be arranged having a pitch of twice the first cell pitch PXC (2*PXC) in the first horizontal direction (X direction) and arranged having a pitch of the second cell pitch PYC in the second horizontal direction (Y direction), respectively.

Figure 9A:
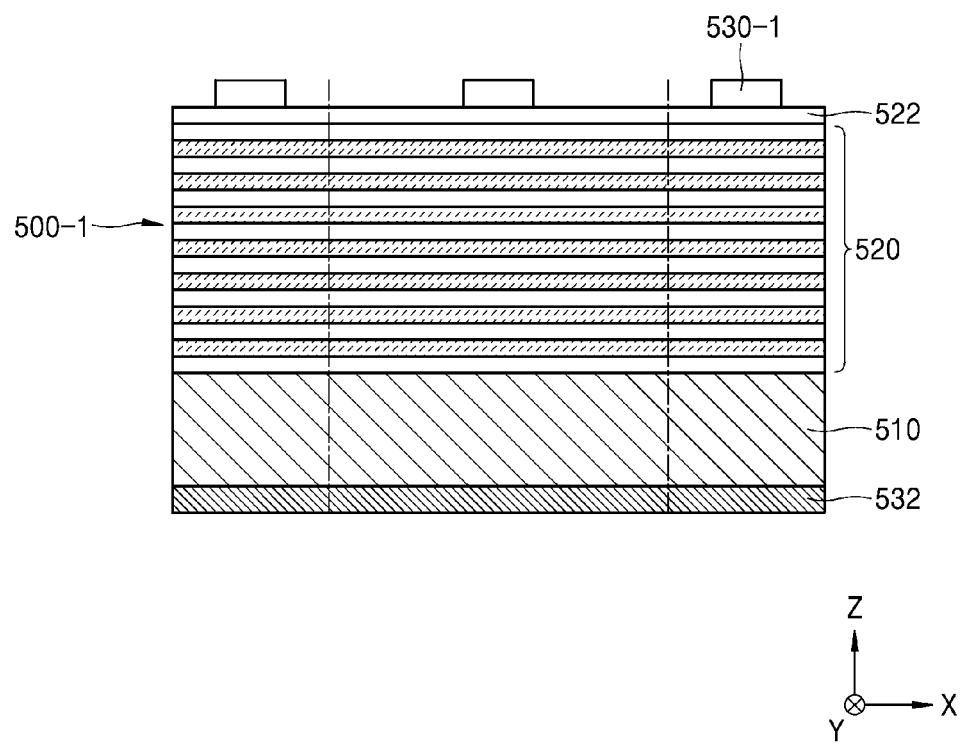
FIGS. 9A and 9B illustrate schematic cross-sectional views of a photomask set for forming patterns according to example embodiments.
Figure 9B:
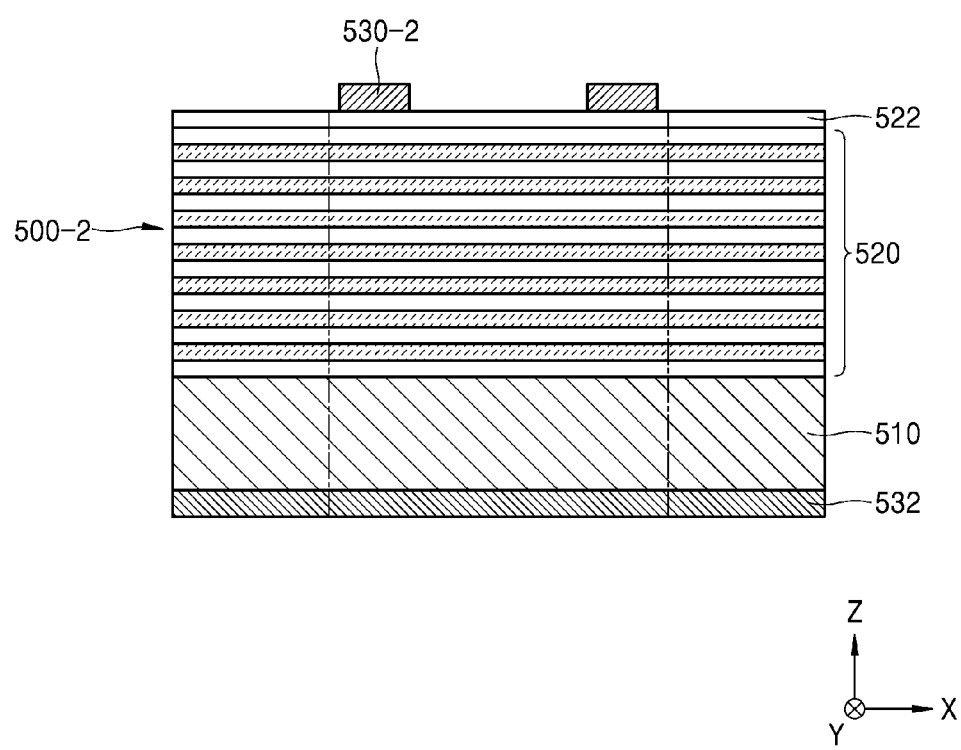

FIGS. 9A and 9B are schematic cross-sectional views of a photomask set 500-1 and 500-2 for forming patterns according to example embodiments.

Referring to FIGS. 9A and 9B, the photomask set 500-1 and 500-2 may respectively include a first photomask 500-1 and a second photomask 500-2. Although FIG. 9A and FIG. 9B show that the first photomask 500-1 and the second photomask 500-2 are reflective masks, the first photomask 500-1 and the second photomask 500-2 are not limited thereto. For example, the first photomask 500-1 and the second photomask 500-2 may be used in a photolithography process in which extreme ultraviolet (EUV) light, e.g., light having a wavelength of 13.5 nm, is used. The first photo-mask 500-1 may be either of the first photomasks PM1, PM1a, PM1b, and PM1c shown in FIGS. 4A, 5A, 7A, and 8A, and the second photomask 500-2 may be either of the second photomasks PM2, PM2a, PM2b, and PM2c shown in FIGS. 4B, 5B, 7B, and 8B.

The first photomask 500-1 and the second photomask 500-2 may each include a mask substrate 510, a reflective layer 520, and respectively include absorbing patterns 530-1 and 530-2. The mask substrate 510 may include, e.g., a glass or quartz substrate. The reflective layer 520 may be on the mask substrate 510 and reflect incident light. The absorbing patterns 530-1 and 530-2 may be formed on the reflective layer 520, and the reflective layer 520 may be exposed between the absorbing patterns 530-1 and 530-2.

The reflective layer 520 may have, e.g., a multi-layer structure in which thirty to sixty Mo/Si layers are repeatedly stacked. In some embodiments, in order to protect the reflective layer, a capping layer 522 may be on the reflective layer 520. The capping layer 522 may include, e.g., ruthenium oxide (RuO) and the like. In some embodiments, the capping layer 522 may be omitted.

At the bottom of the mask substrate 510, a base layer 532 for vacuum attachment of the first photomask 500-1 and the second photomask 500-2 to a stage of an exposure apparatus may be formed. The base layer 532 may include, e.g., a chromium nitride (CrN) layer.

The absorbing patterns 530-1 and 530-2 may include first absorbing patterns 530-1 in the first photomask 500-1 and second absorbing pattern 530-2 in the second photomask 500-2. The first absorbing pattern 530-1 may be the first mask patterns MK1, MK1a, MK1b, and MK shown in FIGS. 4A, 5A 7A, and 8A, and the second absorbing pattern 530-2 may be the second mask patterns MK2, MK2a, MK2b, and MK2c shown in FIGS. 4B, 5B 7B, and 8B.

In some embodiments, according to types of photoresist used in the photolithography process, portions of the reflective layer 520 between the first absorbing patterns 530-1 may be the first mask patterns MK1, MK1a, MK1b, and MK1c shown in FIG. 4A, FIG. 5A, FIG. 7A, and FIG. 8A, and portions of the reflective layer 520 between the second absorbing patterns 530-2 may be the second mask patterns MK2, MK2a, MK2b, and MK2c shown in FIG. 4B. FIG. 5B, FIG. 7B, and FIG. 8B.

FIGS. 10A through 10H are cross-sectional views showing stages in a method of forming patterns by using a photomask set according to example embodiments.

Figure 10A:
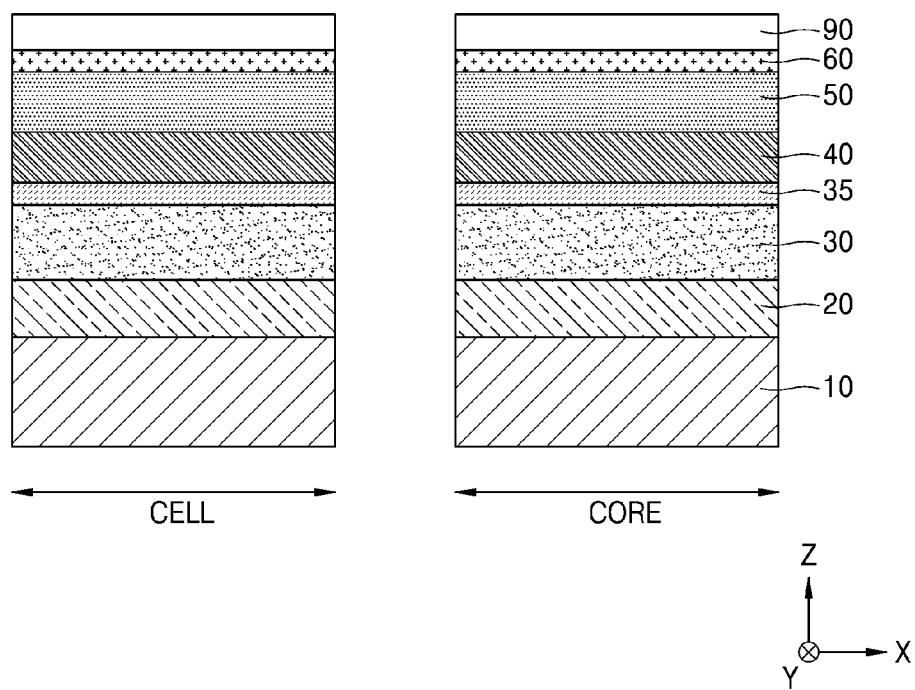
FIGS. 10A through 10H illustrate cross-sectional views of stages in a method of forming patterns by using a photomask set according to example embodiments.

Referring to FIG. 10A, on a base substrate 10, after forming a target layer 20, a hardmask layer 40, and a first coating layer 50 that are sequentially stacked, a first photoresist layer 90 is formed. In some embodiments, a buffer layer 30 and an auxiliary layer 35 that are sequentially stacked may be further formed between the target layer 20 and the hardmask layer 40. In some embodiments, a first cover layer 60 stacked on the first coating layer 50 may be further formed.

The base substrate 10 may include, e.g., a semiconductor substrate. The base substrate 10 may further include a conductive material and an insulating layer arranged between the semiconductor substrate and the target layer 20. The target layer 20 may include a conductive material. For example, the target layer 20 may include polysilicon, a metal, a conductive metal nitride, and the like. For example, the buffer layer 30 may include an amorphous carbon layer (ACL). The auxiliary layer 35 may prevent exposure of the buffer layer 30 in a process of patterning the hardmask layer 40. For example, the hardmask layer 40 may include tetraethylorthosilicate (TEOS). For example, the first coating layer 50 may be a Spin-on Hardmask (SOH). The first cover layer 60 may protect a top surface of the first coating layer 50. For example, the first cover layer 60 may include silicon oxynitride (SiON).

Figure 10B:
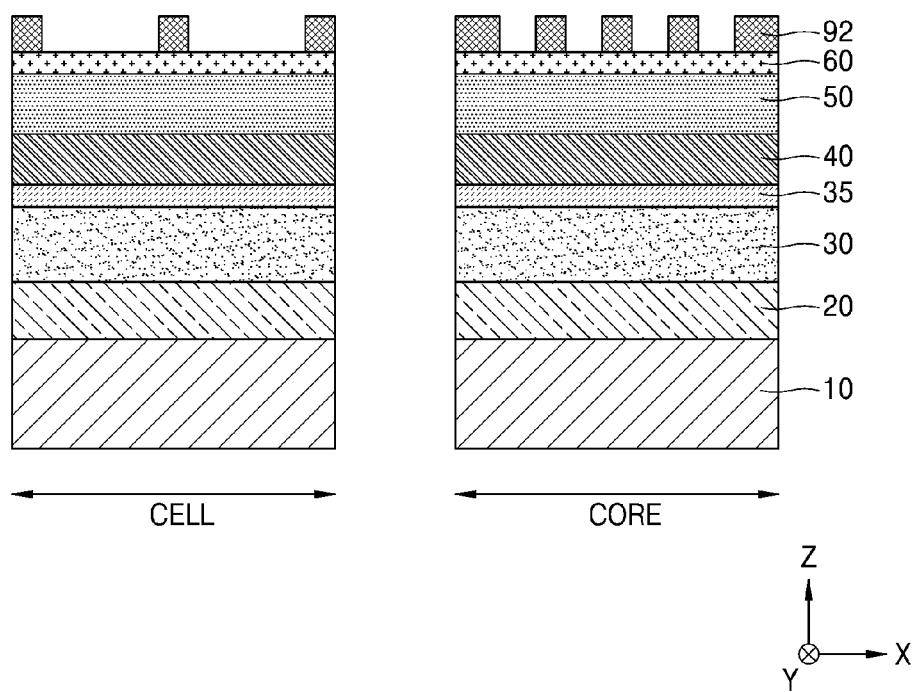

Referring to FIGS. 10A and 10B, a first resist pattern 92 is formed from the first photoresist layer 90 by using a first photomask. For example, the first photomask may be any one of the first photomasks PM1a, PM1c, and 500-1 shown in FIGS. 5A, 8A, and 9A, but is not limited thereto. For example, the first photomask may also be any one of the first photomasks PM1 and PM1b shown in FIG. 4A and FIG. 7A, and in this case, the number of first resist patterns 92 may be less than the number of first resist patterns 92 in the second region CORE shown in FIG. 10B.

Figure 10C:
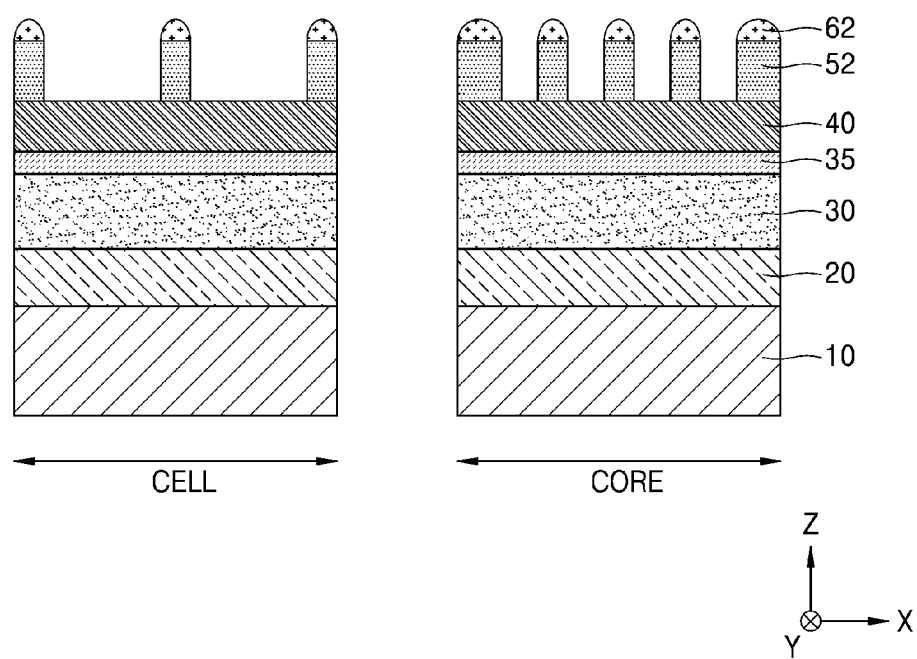

Referring to FIGS. 10B and 10C, a preliminary hardmask pattern 52 is formed by patterning the first coating layer by using the first resist pattern 90 as an etching mask. In some embodiments, a cover pattern 62, which is a portion of the first cover layer 60, may remain on the preliminary hardmask pattern 52.

Figure 10D:
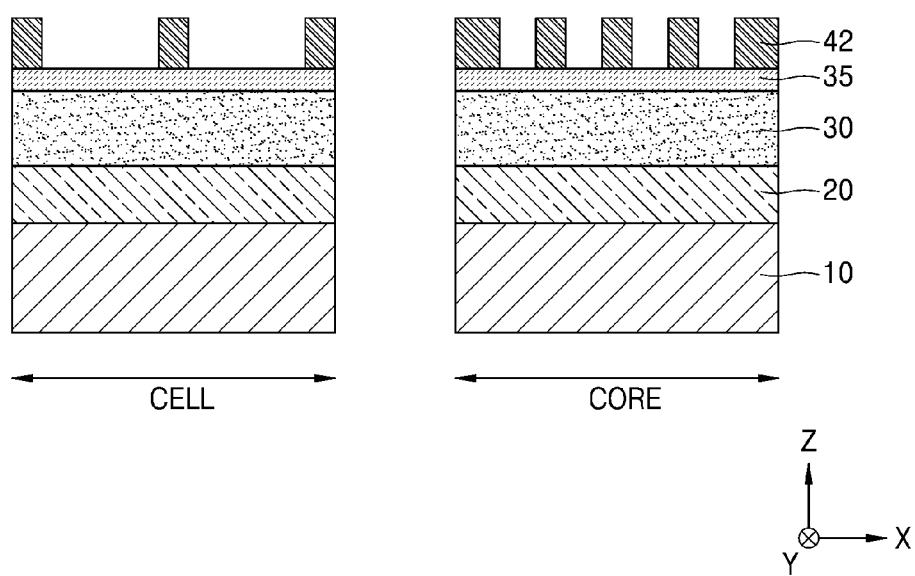

Referring to FIGS. 10C and 10D, the hardmask layer 40 is patterned by using the preliminary hardmask pattern 52 as an etching mask to form a first hardmask pattern 42.

Figure 10E:
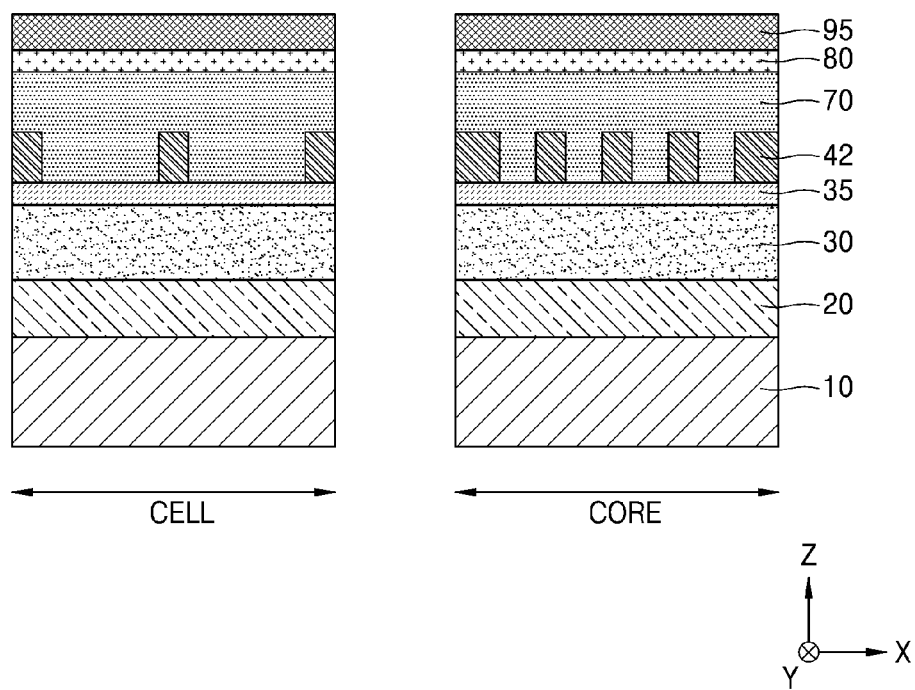

Referring to FIG. 10E, after forming a second coating layer 70 covering the first hardmask pattern 42, a second photoresist layer 95 is formed. In some embodiments, a second cover layer 80 stacked on the second coating layer 70 may be further formed. The second coating layer 70 may include a material containing carbon. For example, the second coating layer 70 may include SOH. The second cover layer 80 may protect a top surface of the second coating layer 70. For example, the second cover layer 80 may include SiON.

Figure 10F:
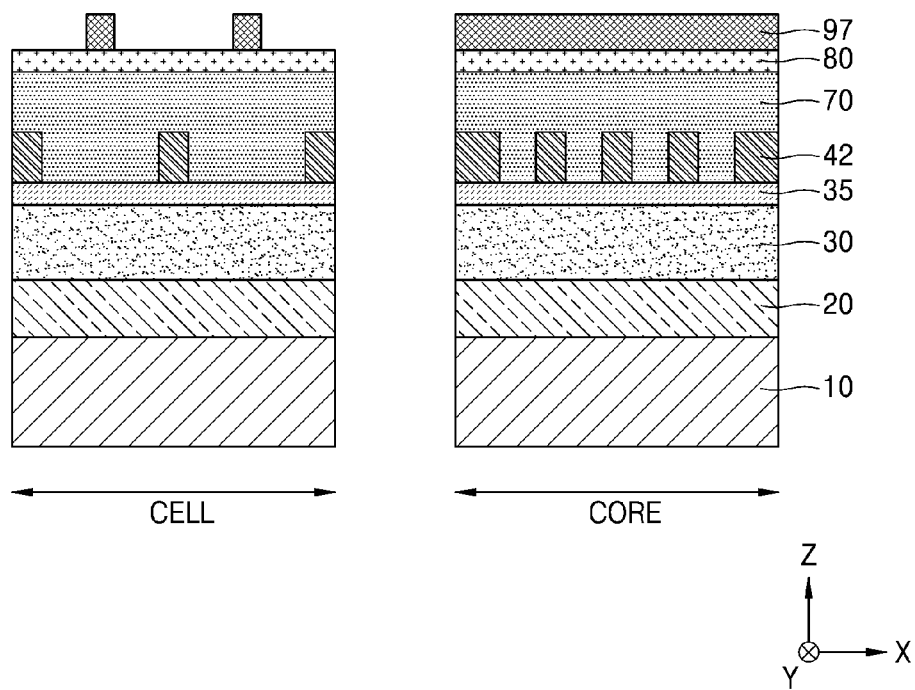

Referring to FIGS. 10E and 10F, a second resist pattern 97 is formed from the second photoresist layer 95 by using the second photomask. For example, the second photomask may be any one of the second photomasks PM2a, PM2c, and 500-2 shown in FIGS. 5B, 8B, and 9B, but is not limited thereto. For example, the second photomask may be any one of the second photomasks PM2 and PM2b shown in FIG. 4B and FIG. 7B, and in this case, the second resist pattern 97 may also be patterned in the second region CORE and expose a portion of each of the second coating layer 70 and the second cover layer 80.

Figure 10G:
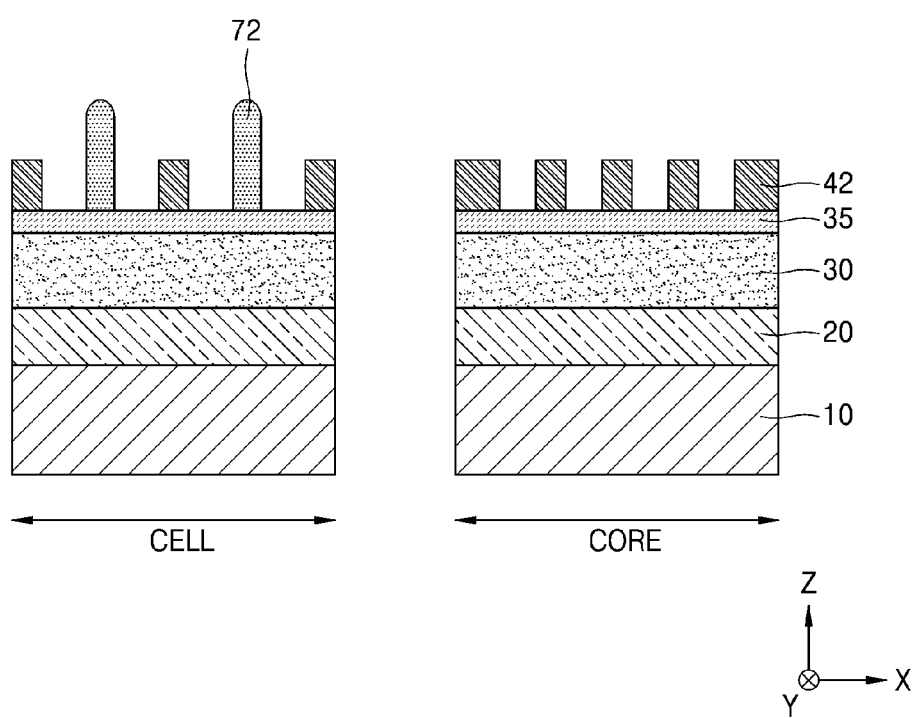

Referring to FIGS. 10F and 10G the second coating layer 70 is patterned by using the second resist pattern 90 as an etching mask to form a second hardmask pattern 72. In some embodiments, similarly to the cover pattern 62 that remains on the preliminary hardmask pattern 52 not shown in FIG. 10G but shown in FIG. 10C, a portion of the second cover layer 80 may remain on the second hardmask pattern 72.

Figure 10H:
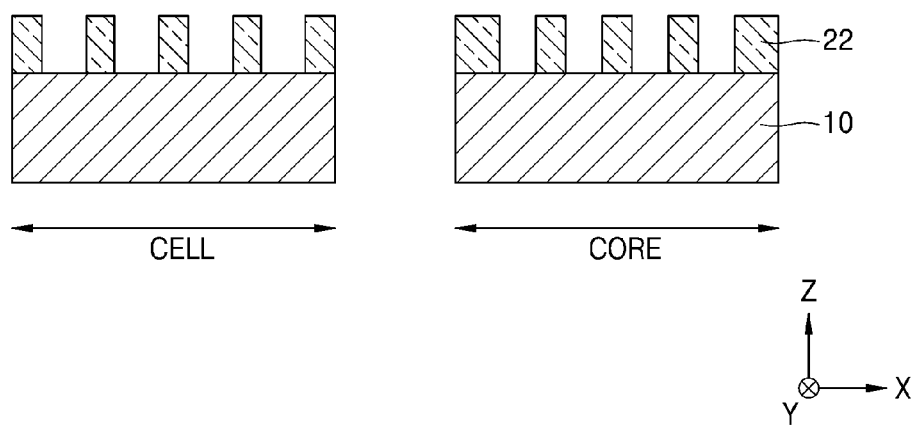

Referring to FIGS. 10G and 10H, the target layer 20 is patterned by using the first hardmask pattern 42 and the second hardmask pattern 72 as etching masks to form a target pattern 22. Although forming the target pattern 22 by a photo-etch-photo-etch (PEPE) method is described with reference to FIGS. 10A through 10H, the present disclosure is not limited thereto, and the present disclosure may both include forming the target pattern 22 by using a photomask set including two or more photomasks, together with forming the target pattern 22 by a photo-photo-etch (PPE) method.

Figure 11A:
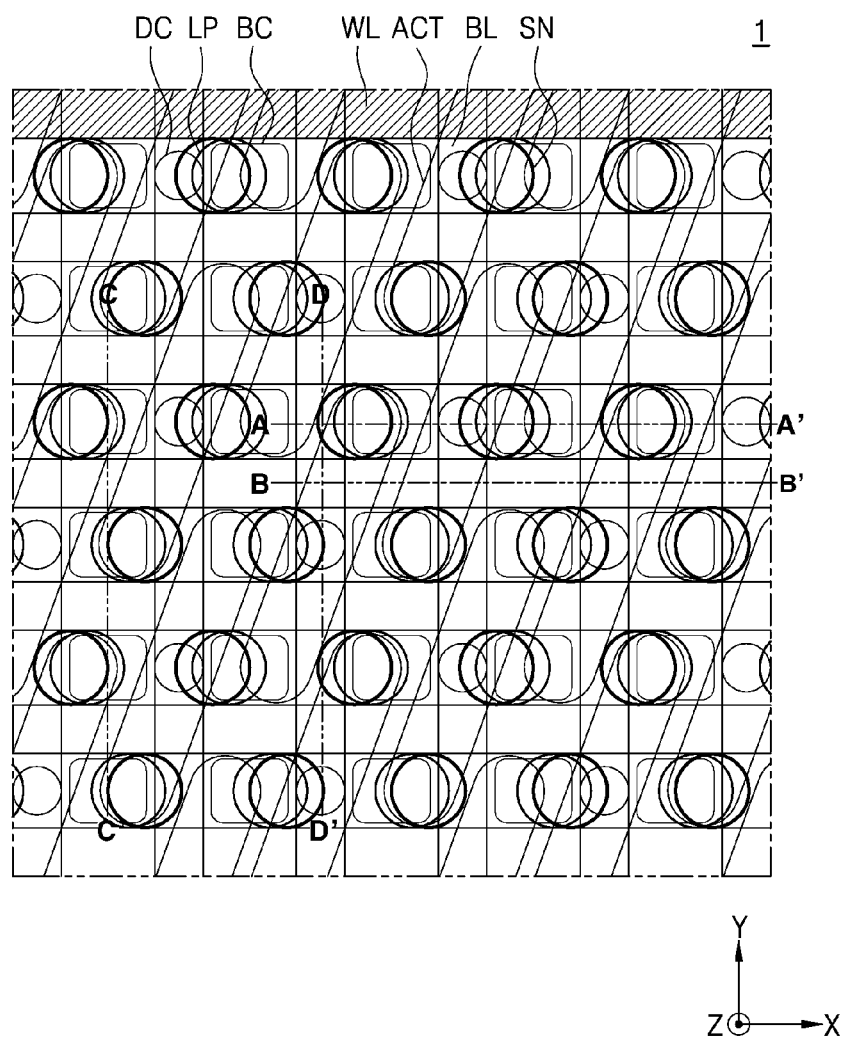
FIG. 11A illustrates a schematic top-plan layout of a semiconductor device manufactured by using a photomask set according to example embodiments.
Figure 11B:
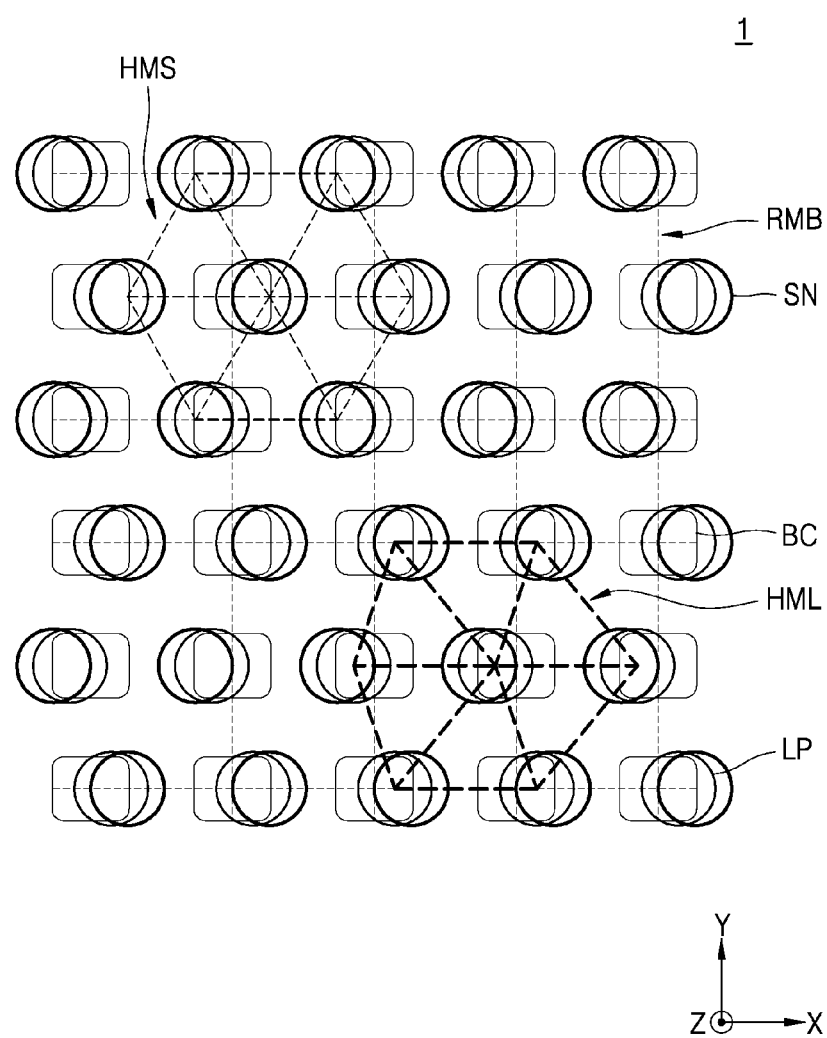
FIG. 11B illustrates a top-plan layout selectively showing some of the main configurations in FIG. 11A.

FIG. 11A is a schematic top-plan layout for describing main configurations of a semiconductor device 1 manufactured by using the photomask set according to example embodiments, and FIG. 11B is a top-plan layout selectively showing some of the main configurations shown in FIG. 11A.

Referring to FIGS. 11A and 11B, the semiconductor device 1 may include a plurality of active regions ACT. In some embodiments, the plurality of active regions ACT may each have a long shaft in a diagonal direction with respect to the first horizontal direction (the X direction) and the second horizontal direction (the Y direction) that are orthogonal to each other. A plurality of word-lines WL across the plurality of active regions ACT may extend in parallel to one another in the first horizontal direction (X direction). Above the plurality of word-lines WL, a plurality of bit-lines BL may extend in parallel to one another in the second horizontal direction (the Y direction) that crosses the first horizontal direction (the X direction). The plurality of bit-lines BL may be connected to the plurality of active regions ACT via direct contacts DC.

In some embodiments, in the plurality of bit-lines BL, a plurality of buried contacts BC may be formed between two bit-lines BL adjacent to each other. In some embodiments, the plurality of buried contacts BC may be arranged in a matrix aligned in the first horizontal direction (the X direction) and the second horizontal direction (the Y direction).

A plurality of landing pads LP may be on the plurality of buried contacts BC. The plurality of landing pads LP may be arranged to at least partially overlap the plurality of buried contacts BC. In some embodiments, the plurality of landing pads LP may each extend onto any one bit-line BL of two bit-lines BL adjacent to each other. In a plane, the plurality of landing pads LP may be arranged to be serially aligned in the first horizontal direction (the X direction) and aligned in zigzag in the second horizontal direction (the Y direction).

The plurality of landing pads LP may be formed by performing photolithography processes twice. For example, the plurality of landing pads LP may be formed by performing two EUV processes without using a pattern density enhancing technology of performing a photolithography process once. A top surface of each of the plurality of landing pads LP may have a disc shape, of which an edge is substantially circular rather than elliptical.

A plurality of storage nodes SN may be on the plurality of landing pads LP. The plurality of storage nodes SN may be above the plurality of bit lines BL. Each of the storage nodes SN may be a lower electrode of each of the plurality of capacitors. The storage nodes SN may be connected to the active regions ACT via the landing pads LP and the buried contacts BC. In a plane, the plurality of storage nodes may have a hexagonal arrangement structure. For example, the plurality of storage nodes SN may have a honeycomb shape aligned in a line in the first horizontal direction (the X direction) in a plane and aligned in zigzag in the second horizontal direction (the Y direction).

The honeycomb shape in which the plurality of landing pads LP is arranged and the honeycomb shape in which the plurality of storage nodes SN is arranged may be different from each other. For example, the storage nodes SN may be arranged in a complete honeycomb shape HMS, in which a triangle connecting center points of three storage nodes SN adjacent to one another is a regular triangle, and the plurality of landing pads LP may be arranged in a crushed honeycomb shape HML, in which a triangle connecting center points of three landing pads LP adjacent to one another is a scalene triangle. In the present specification, a center point of the landing pad LP and a center point of the storage node SN respectively represent a center point of a top surface of the landing pad LP and a center point of a top surface of the storage node SN in a plane (the X-Y plane).

The plurality of landing pads may be aligned in the crushed honeycomb shape HML and respectively arranged between the plurality of buried contacts BC aligned in the matrix RMB and the plurality of storage nodes SN aligned in the whole honeycomb shape HMS, and electrically connect the plurality of buried contacts BC respectively to the plurality of storage nodes SN.

Figure 12A:
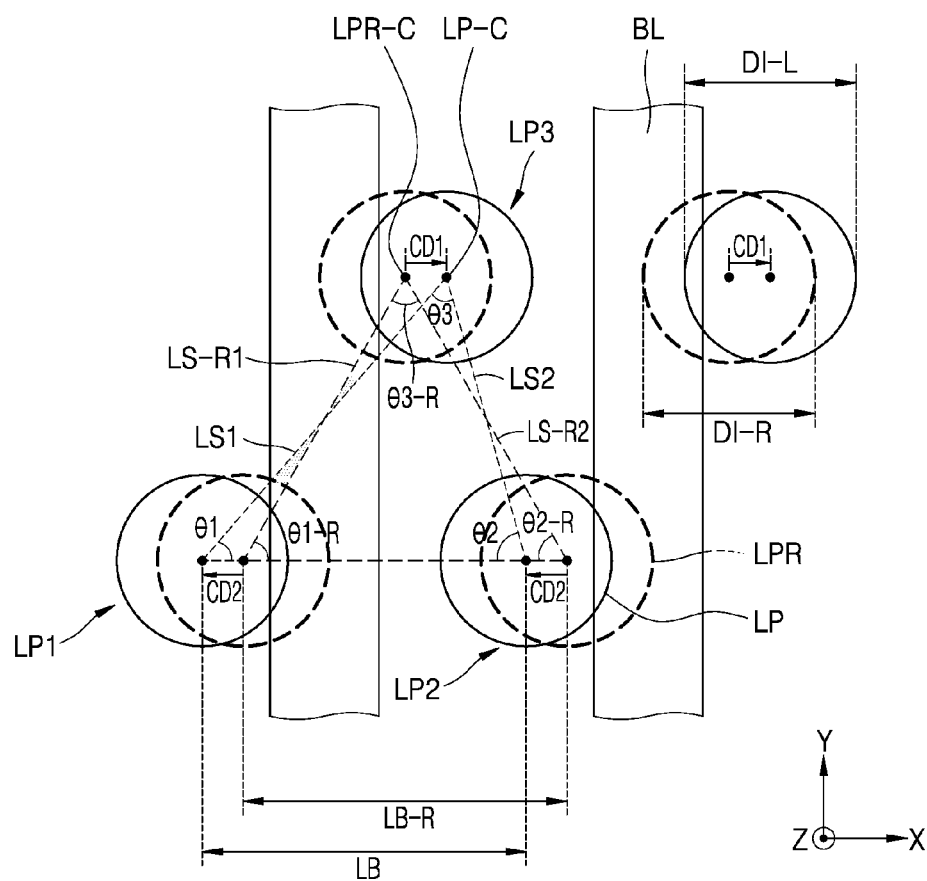
FIGS. 12A through 12C illustrate schematic top-plan layouts of arrangements of landing pads included in a semiconductor device manufactured by using a photomask set according to example embodiments.
Figure 12B:
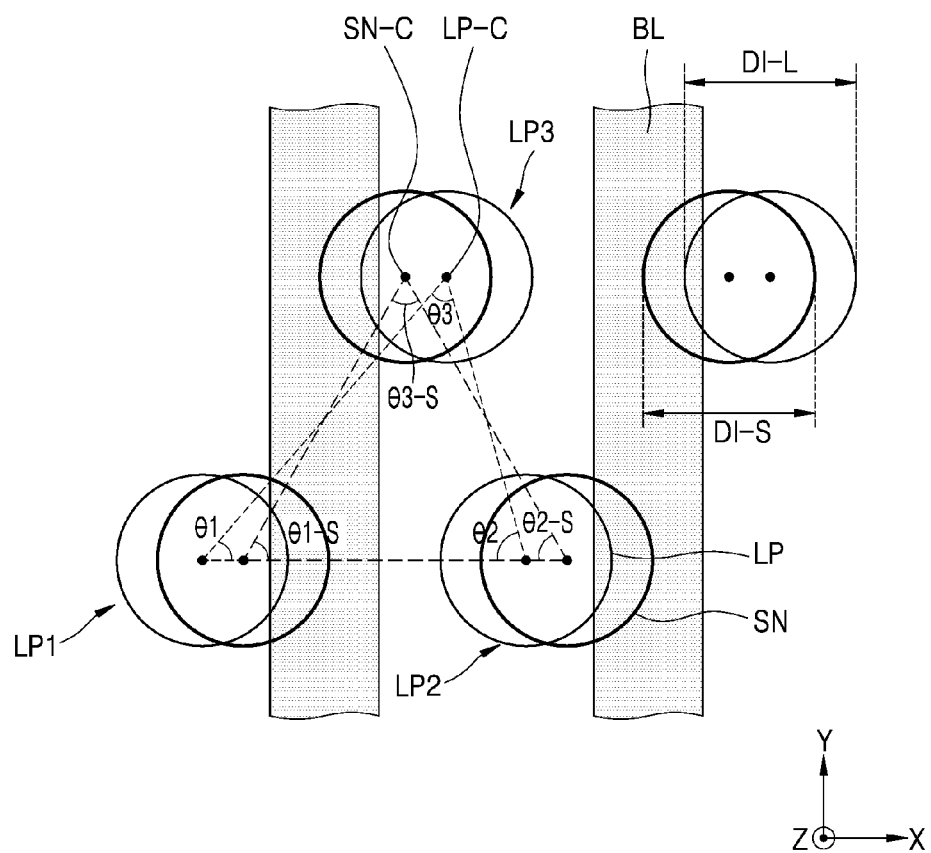
Figure 12C:
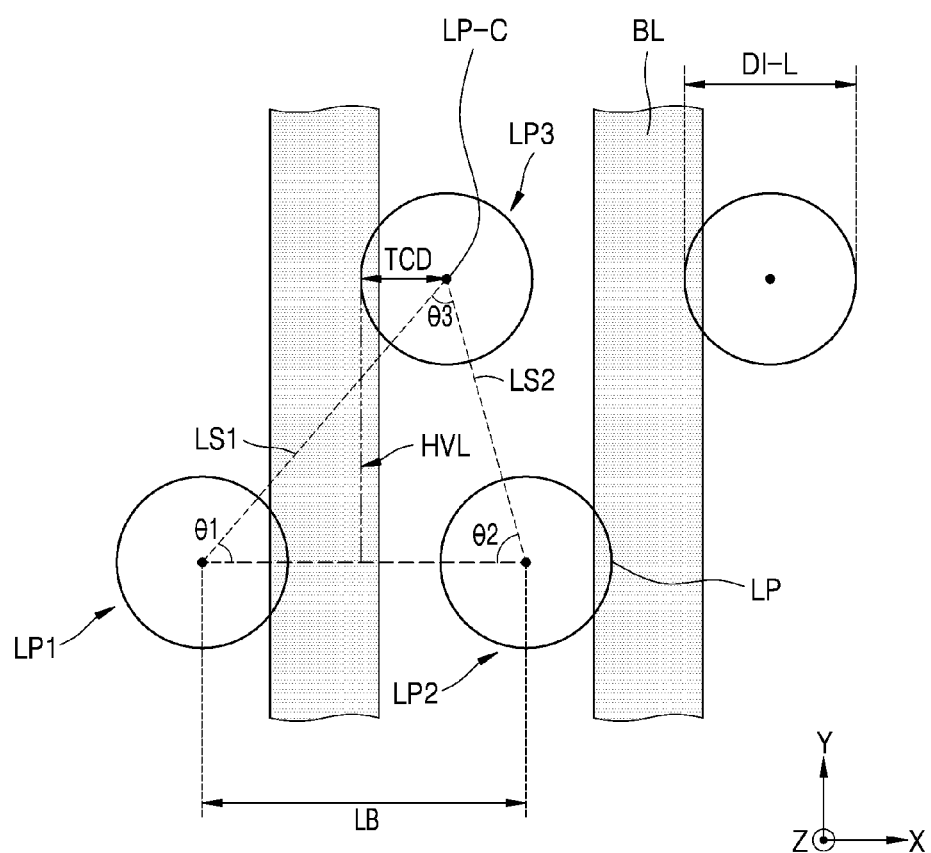

FIGS. 12A through 12C are schematic top-plan layouts for describing arrangements of the landing pads LP included in the semiconductor device manufactured by using the photomask set according to example embodiments.

Referring to FIG. 12A, the plurality of landing pads LP may have a hexagonal alignment structure in a plane. For example, the plurality of landing pads LP may have a honeycomb shape aligned in a line in the first horizontal direction (the X direction) and aligned in zigzag in the second horizontal direction (the Y direction). To describe the arrangement of the plurality of landing pads LP, FIG. 12A shows the plurality of landing pads LP together with a plurality of virtual reference landing pads LPR. The plurality of reference landing pads LPR indicate a case in which a triangle connecting center points LPR-C of three reference landing pads LPR adjacent to one another is a regular triangle. A diameter of the reference landing pad LPR may have a same value as that of a diameter DI-L of the landing pad LP.

For example, in the three reference landing pads LPR adjacent to one another, a first reference interior angle $\theta1$-R and a second reference interior angle $\theta2$-R, which are respective interior angles between a base connecting center points LPR-C of two adjacent reference landing pads LPR in the first horizontal direction (the X direction) and two sides respectively connecting center points LPR-C of the two adjacent reference landing pads LPR in the first horizontal direction (the X direction) and a center point LPR-C of one adjacent reference landing pad LPR in the second horizontal direction (the Y direction), and a third reference interior angle, which is an interior angle between two sides respectively connecting the center points LPR-C of the two adjacent reference landing pads LPR in the first horizontal direction (the X direction) to the center point LPR-C of the one adjacent reference landing pad LPR in the second horizontal direction (the Y direction), may all have a same value. For example, the first reference interior angle $\theta1$-R, the second reference interior angle $\theta2$-R, and the third reference interior angle $\theta3$-R may be 60°, respectively.

In the three reference landing pads LPR adjacent to one another, a reference base distance LB-R, which is a distance between the center points LPR-C of the two adjacent reference landing pads LPR in the first horizontal direction (the X direction), and a first reference side distance LS-R1 and a second reference side distance LS-R2, which are respective distances LS-R1 and LS-R2 between the center points LPR-C of the two adjacent reference landing pads LPR in the first horizontal direction (the X direction) and the center point LPR-C of the one adjacent reference landing pad LPR in the second horizontal direction (the Y direction), may all have a same value of 3 F (feature size). For example, the 3 F (feature size) may have a value of about 25.6 nm, but are not limited thereto.

A triangle connecting three landing pads LP adjacent to one another from among the plurality of landing pads, e.g., center points LP-C of two adjacent landing pads LP in the first horizontal direction (the X direction) and a center point LP-C of one adjacent landing point in the first horizontal direction (the Y direction) to the two adjacent landing pads LP in the first horizontal direction (the X direction), may be a scalene triangle. From among the plurality of landing pads LP, in three landing pads LP adjacent to one another such that lines connecting center points LP construct a triangle, two landing pads LP adjacent to each other in the first horizontal direction (the X direction) are respectively referred to as a first landing pad LP1 and a second landing pad LP2, and a landing pad LP that is adjacent to the first landing pad LP1 and the second landing pad LP2 between the first landing pad LP1 and the second landing pad LP2 in the second horizontal direction (the Y direction) may be referred to as a third landing pad LP3.

A first interior angle $\theta1$, which is an interior angle between a base connecting center points LP-C of the first landing pad LP1 and the second landing pads LP2 and a side connecting the first landing pad LP1 to the third landing pad LP3, and a second interior angle $\theta2$, which is an internal angle between a base connecting center points LP-C of the first landing pad LP1 and the second landing pad LP2 and a side connecting the second landing pad LP1 to the third landing pad LP3, may have different values, respectively. For example, the first interior angle $\theta1$ may have a value less than 60°, and the second interior angle $\theta2$ may have a value greater than 60°. A third interior angle $\theta3$, which is an interior angle between a side connecting the first landing pad LP1 to the third landing pad LP3 and the side connecting the second landing pad LP2 to the third landing pad LP3, may have a value of subtracting values of the first interior angle $\theta1$ and the second interior angle $\theta2$ from 180°.

A base distance LB, which is a distance between the center points LP-C of the first landing pad LP1 and the second landing pad LP2, a first side distance LS1, which is a distance between the center points LP-C of the first landing pad LP1 and the third landing pad LP3, and a second side distance LS2, which is a distance between the center points LP-C of the second landing pad LP2 and the third landing pad LP3, may have different values. The base distance LB may have a value of 3 F (feature size) that is a value identical to the reference side distance LB-R. The first side distance LS1 may have a value greater than a value of the base distance LB, and the second side distance LS2 may have a value smaller than the value of the base distance LB. For example, the first side distance LS1 may have a value greater than 3 F (feature size), and the second side distance LS2 may have a value smaller than 3 F (feature size).

A center point LP-C of each of the plurality of landing pads may be shifted away from a center point LPR-C of each of the plurality of reference landing pads LPR in the first horizontal direction (the X direction) or the direction (the −X direction) opposite to the first horizontal direction (the X direction) and away from a bit-line BL adjacent thereto. For example, center points LP-C of the landing pads LP constructing a row in the first horizontal direction (the X direction) may be shifted by a first shift distance CD1 in the first horizontal direction (the X direction) from the center points LPR-C of the reference landing pads LPR constructing a row in the first horizontal direction (the X direction), and center points LP-C of the landing pads LP adjacent to one another in the second horizontal direction and constructing another one row in the first horizontal direction (the X direction), may be shifted by a second shift distance CD2 in the direction (the −X direction) opposite to the first horizontal direction (the X direction) from the center points LPR-C of the reference landing pads LPR constructing one row in the first horizontal direction (the X direction). In some embodiments, the first shift distance CD1 and the second shift distance CD2 may have a same value. For example, the first shift distance CD1 and the second shift distance CD2 may each have a value greater than 0 and smaller than 0.75 F (feature size). In some embodiments, the first shift distance CD1 and the second shift distance CD2 may each have a value from about 1 nm to about 6 nm.

The first moving distance CM1 and the second moving distance CM2 shown in FIG. 2B are respectively logical distances on the mask layout to realize the first shift distance CD1 and the second shift distance CD2, which are physical distances shown in FIG. 12A, may have substantially identical values.

The plurality of landing pads LP according to example embodiments may be formed by performing two EUV lithography processes without using the pattern density enhancing technology of performing once the photolithography process. Thus, the top surface of each of the plurality of landing pads LP may have a disc shape, of which the edge is substantially circular rather than elliptical or quadrangular.

Referring to FIG. 12B, the plurality of storage nodes SN may be on the plurality of landing pads LP. As described above with reference to FIGS. 11A and 11B, the landing pads LP may be arranged in the crushed honeycomb shape. The plurality of storage nodes SN may be arranged in the whole honeycomb shape. A diameter DI-S of the storage node SN may generally have a value equal to that of the diameter DI-L of the landing pad LP. For example, the diameter DI-S of the storage node SN and the diameter DI-L of the landing pad LP may have a value of about 1.5 F (feature size).

A triangle connecting the center points LP-C of the first landing pad LP1, the second landing pad LP2, and the third landing pad LP3 may be a scalene triangle, and a triangle connecting center points SN-C of three storage nodes SN respectively corresponding to the first landing pad LP1, the second landing pad LP2, and the third landing pad LP3 may be a regular triangle. For example, distances between the center points SN-C of three storage nodes SN respectively corresponding to the first landing pad LP1 the second landing pad LP2, and the third landing pad LP3 may have a same value, i.e., a value of 3 F (feature size). Accordingly, a first node interior angle θ1-S, a second node interior angle θ2-S. and a third node interior angle θ3-S of the triangle connecting the center points SN-C of three storage nodes SN respectively corresponding to the first landing pad LP1, the second landing pad LP2, and the third landing pad LP3, may have a same value of 60°.

Referring to FIG. 12C, the center point LP-C of the third landing pad LP3 may be spaced apart, by a center transfer distance TCD in the first horizontal direction (the X direction), from a center of a base connecting the center points LP-C of the first landing pad LP1 and the second landing pad LP2 and a virtual center extension line HVL extending in the second horizontal direction (the Y direction) that is a vertical direction of the side connecting the center points LP-C of the first landing pad LP1 and the second landing pad LP2. The center point LP-C of the third landing pad LP3 may be shifted by the center transfer distance TCD in the first horizontal direction (the X direction) from the center extension line HVL. The center transfer distance TCD may have a same value as a sum of the first shift distance CD1 and the second shift distance CD2 shown in FIG. 12A. The center transfer distance TCD may have a value that is greater than 0 and smaller than half the base distance LB. For example, the center transfer distance TCD may have a value greater than 0 and smaller than 1.5 F (feature size). In some embodiments, the center transfer distance TCD may have a value from about 2 nm to about 12 nm.

Figure 13A:
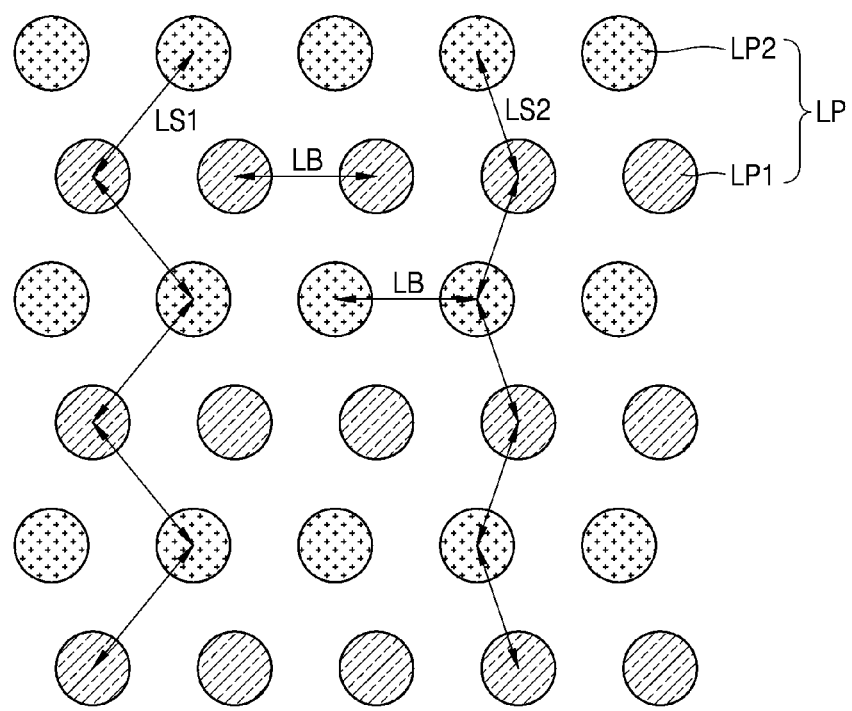
FIGS. 13A through 13B illustrate schematic top-plan layouts of landing pads included in a semiconductor device formed to correspond to photomasks included in a photomask set according to example embodiments.
Figure 13B:
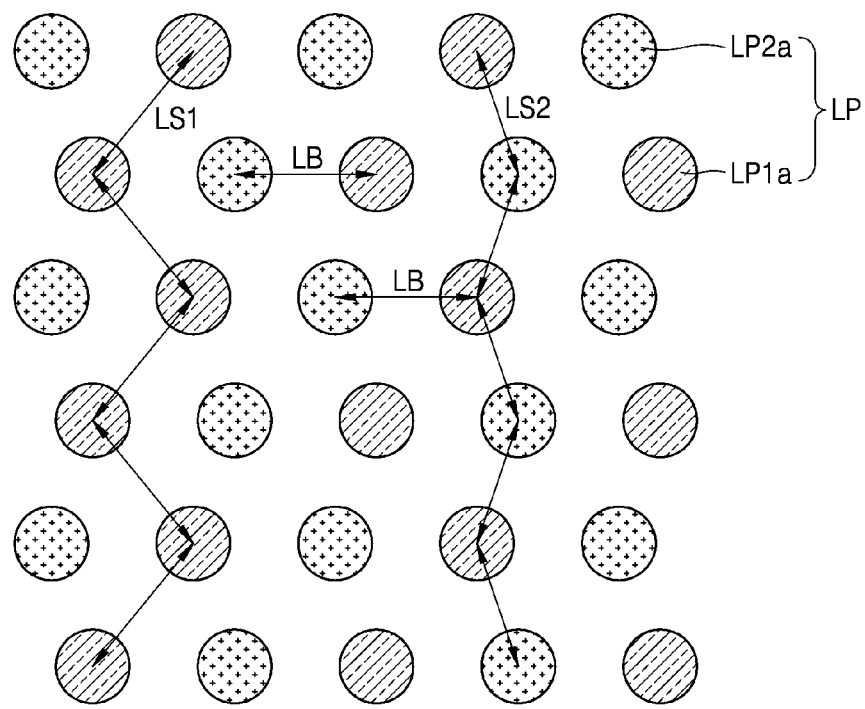
Figure 14A:
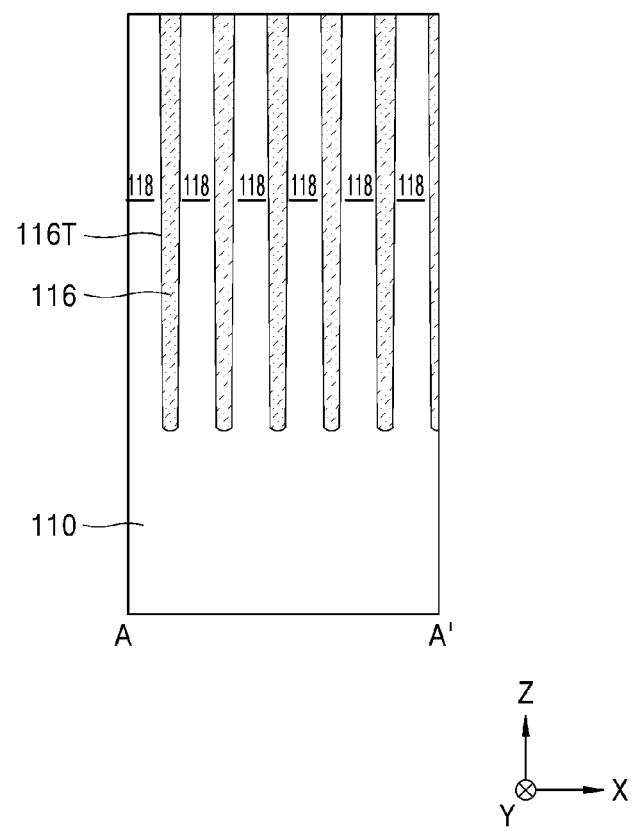
FIGS. 14A-14D, 15A-15D, 16A-16D, 17A-17D, 18A-18D, 19A-19D, 20A-20D and 21A-21D illustrate cross-sectional views of stages in a method of manufacturing a semiconductor device, according to example embodiments.
Figure 14B:
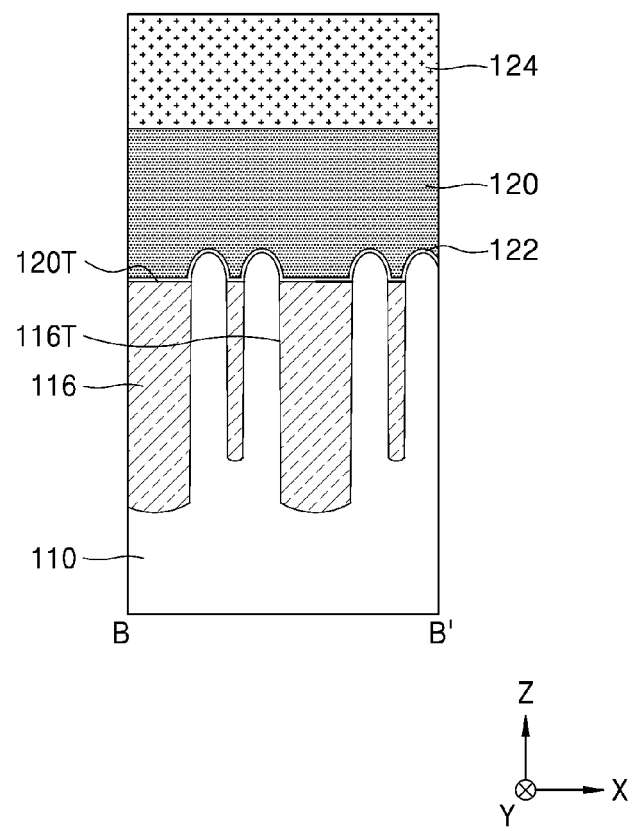
Figure 14C:
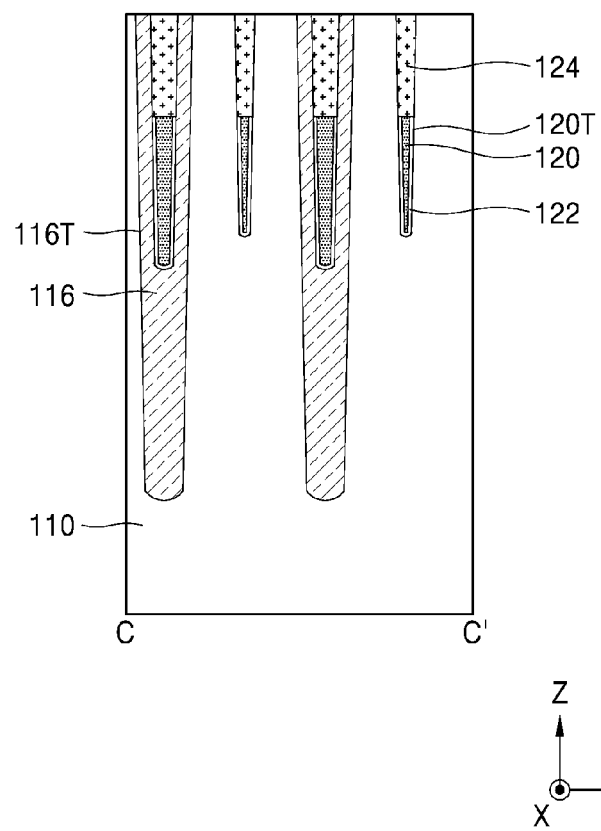
Figure 14D:
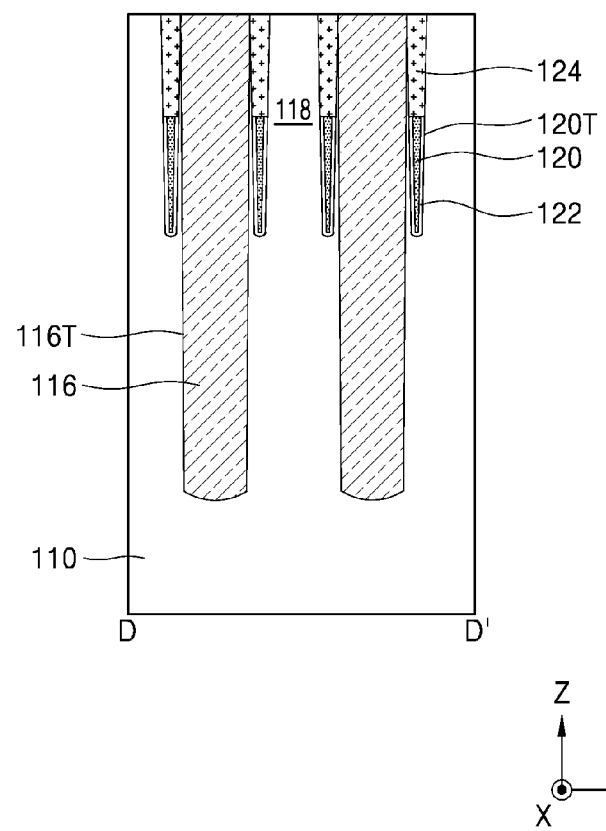
Figure 15A:
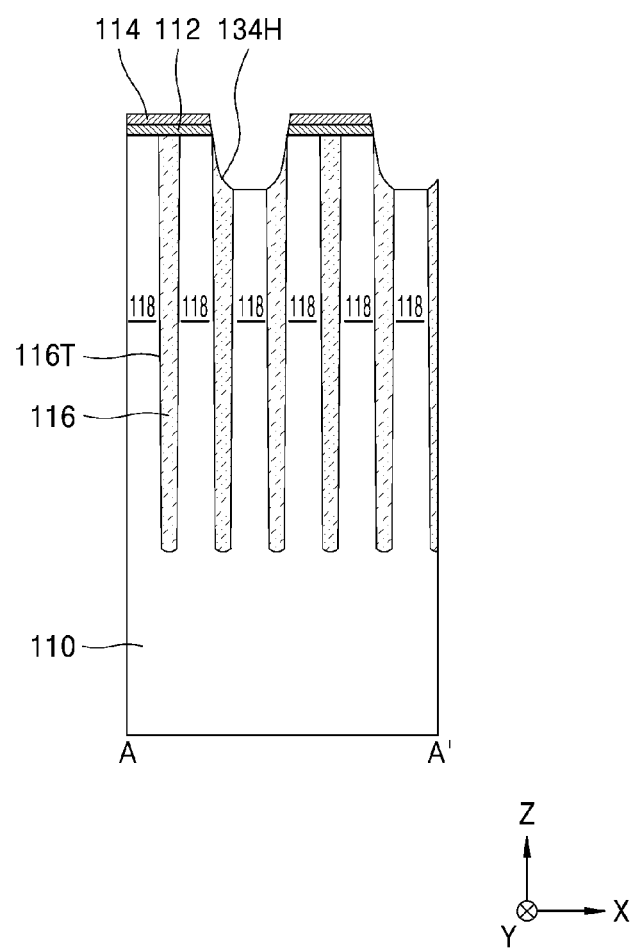
Figure 15B:
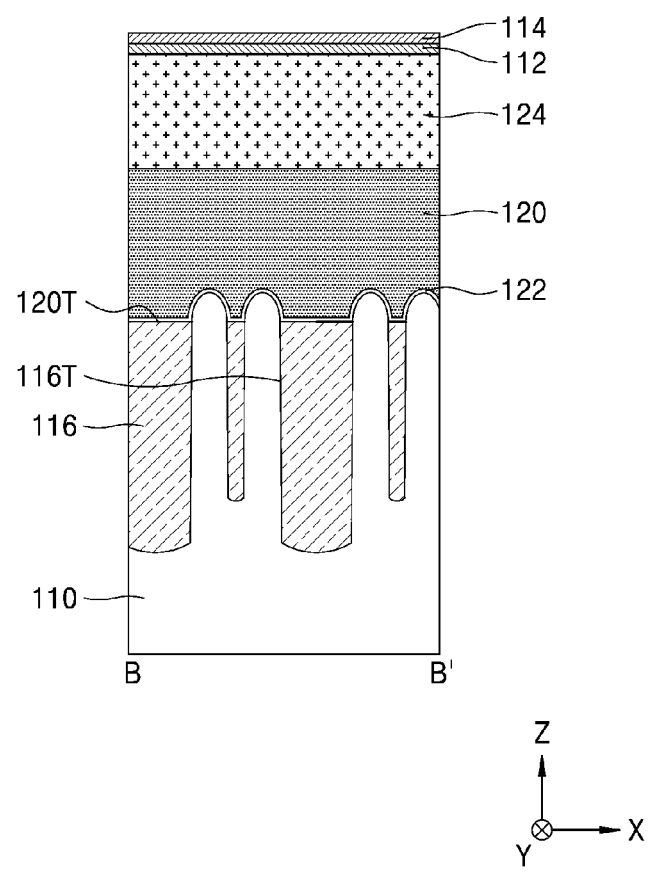
Figure 15C:
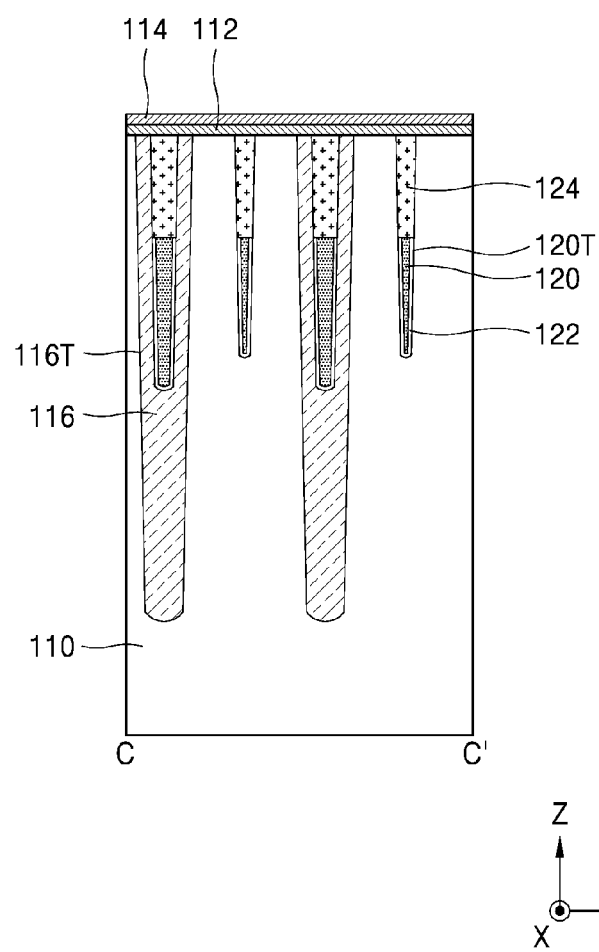
Figure 15D:
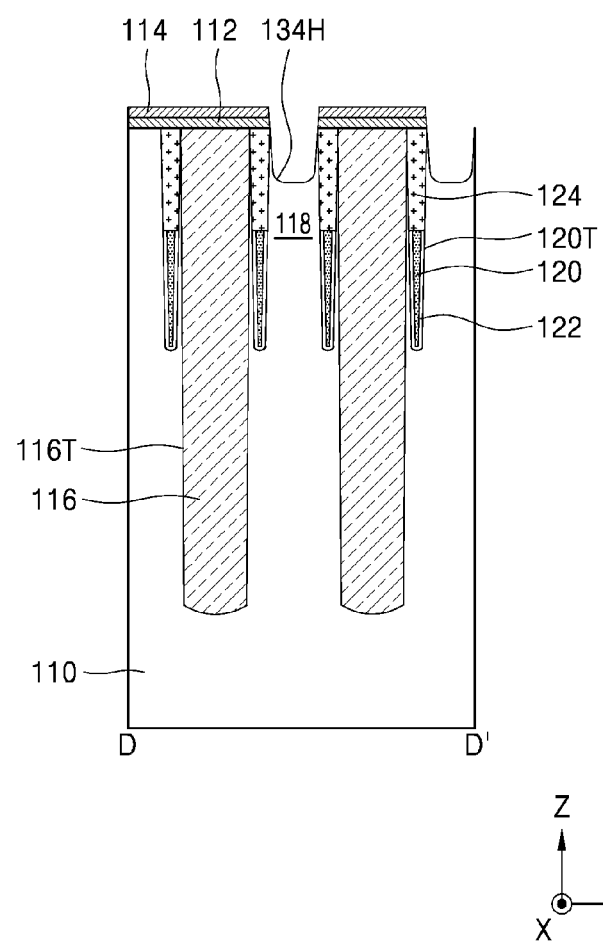
Figure 16A:
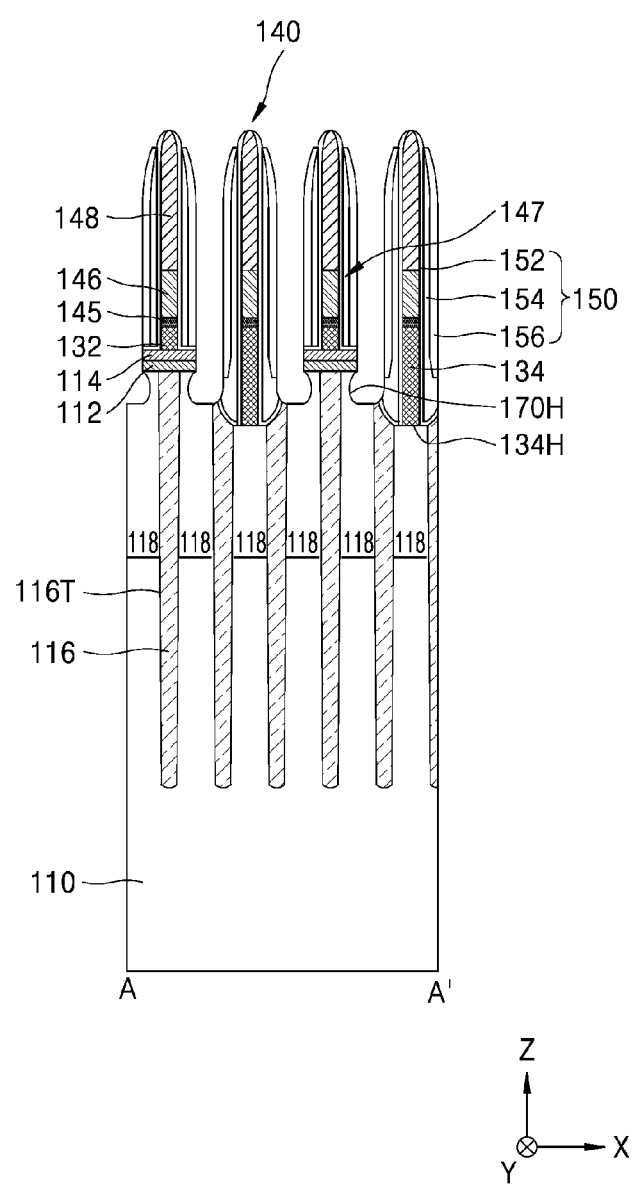
Figure 16B:
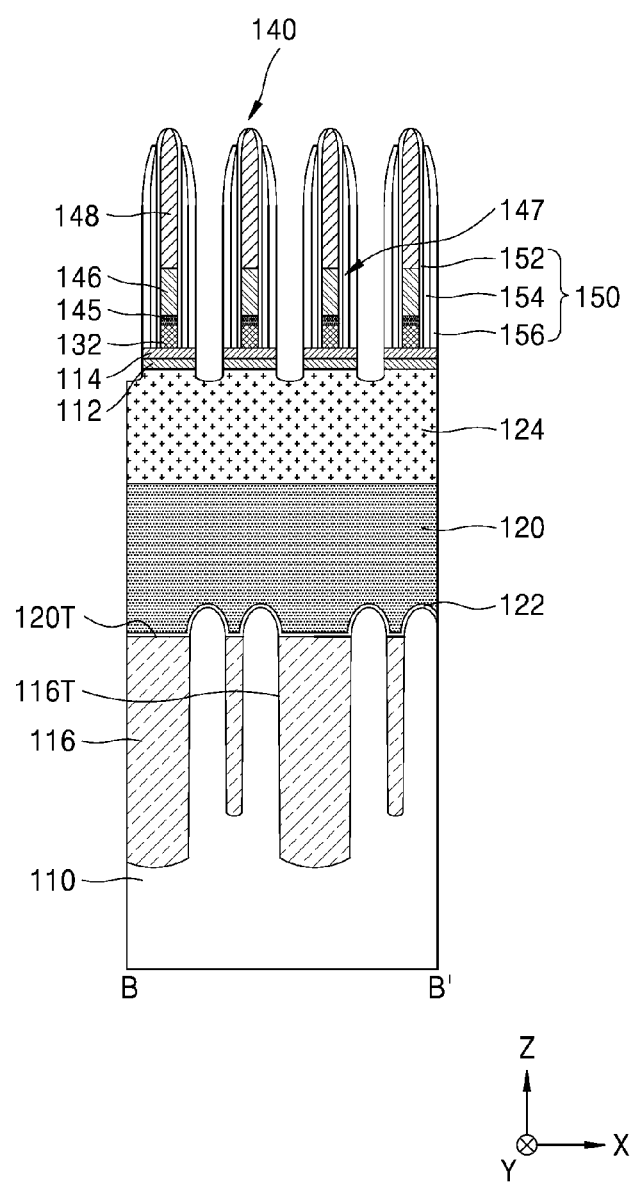
Figure 16C:
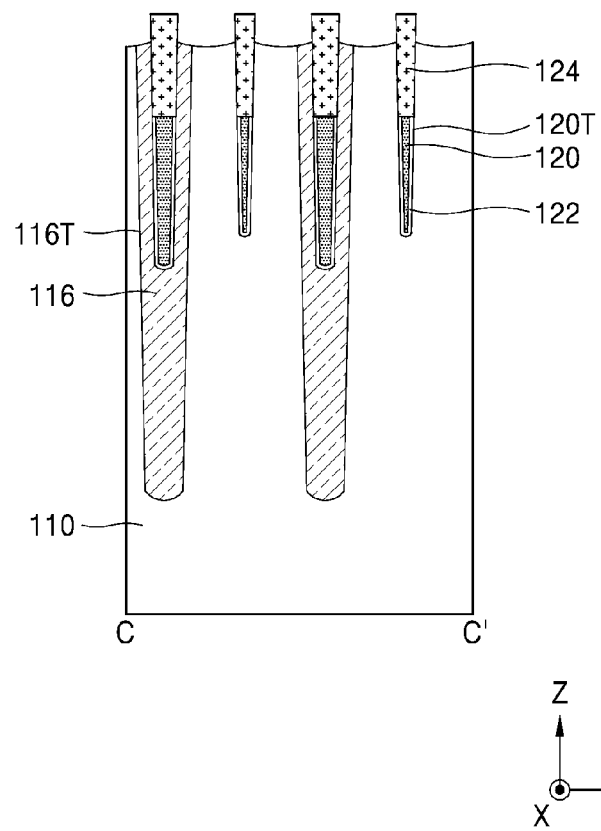
Figure 16D:
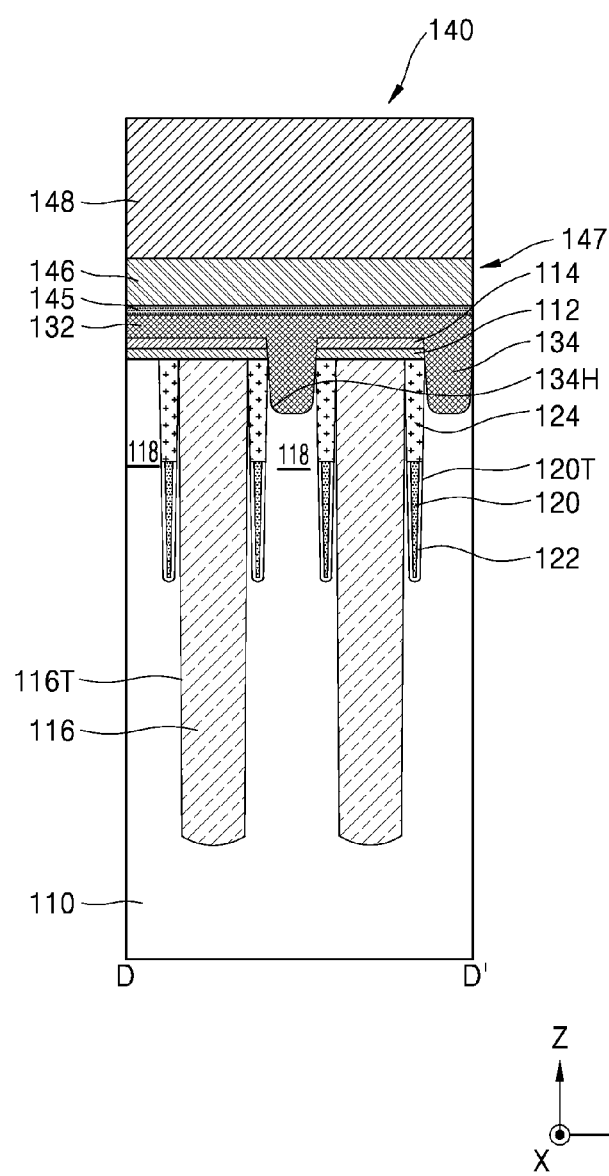
Figure 17A:
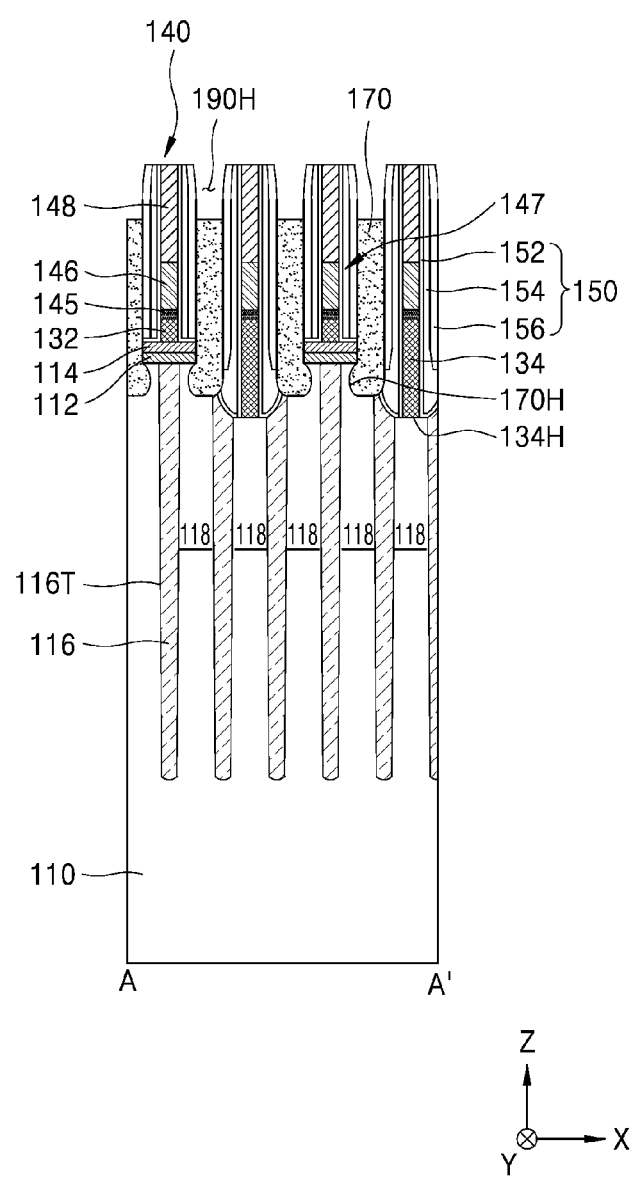
Figure 17B:
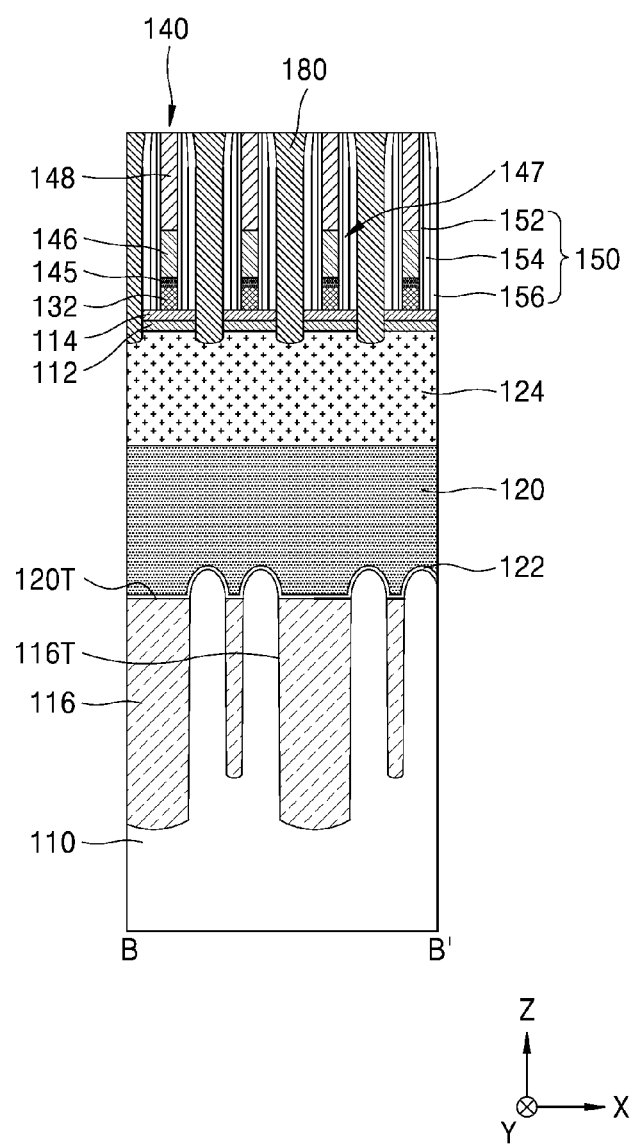
Figure 17C:
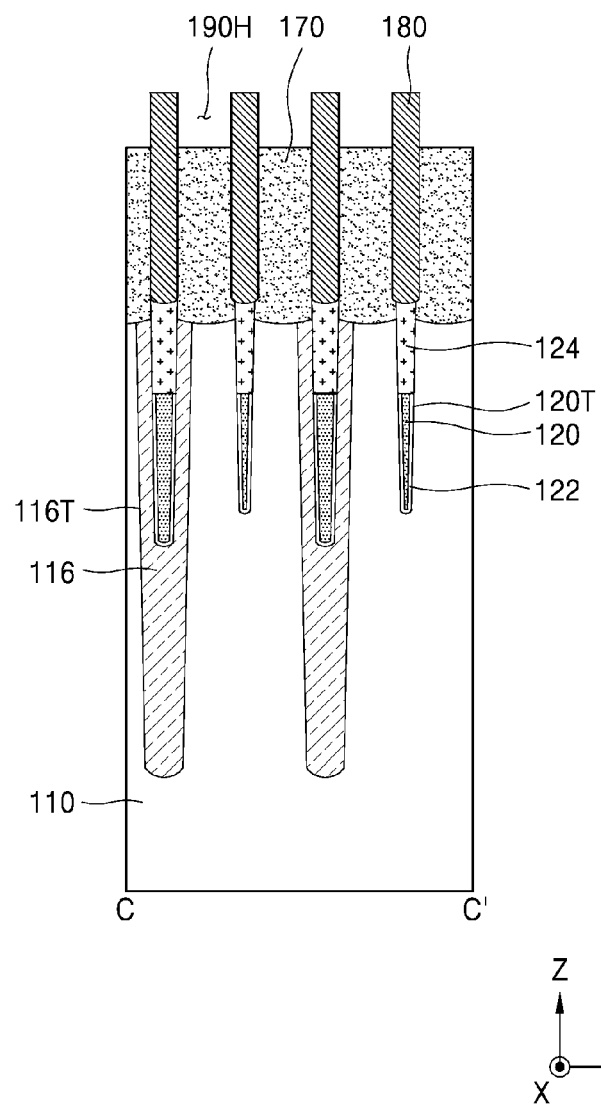
Figure 17D:
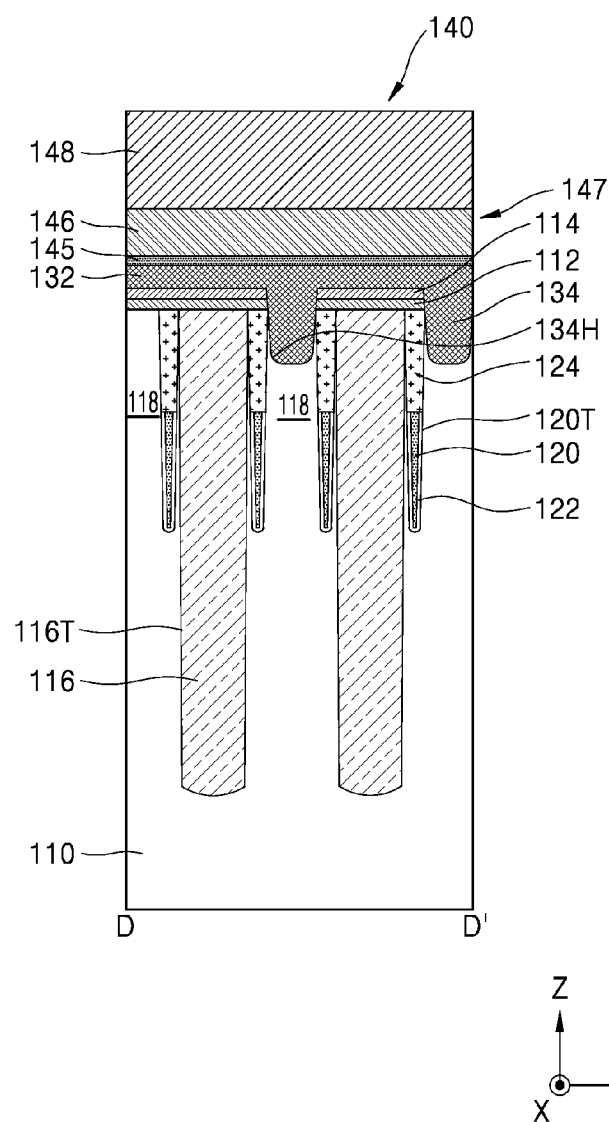
Figure 18A:
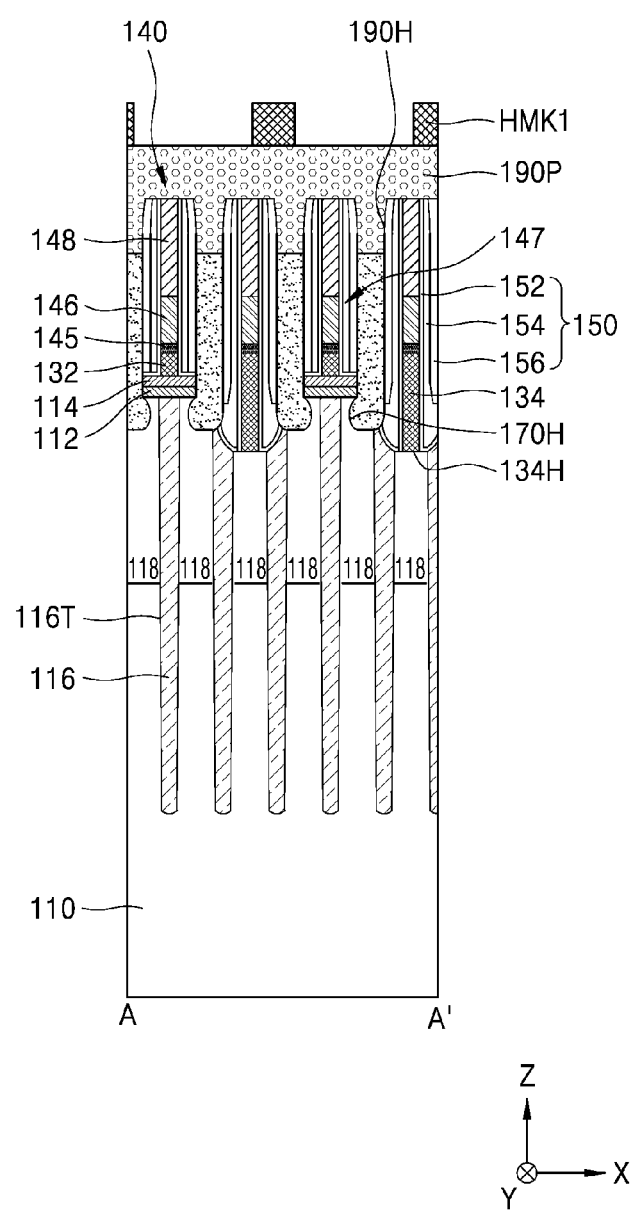
Figure 18B:
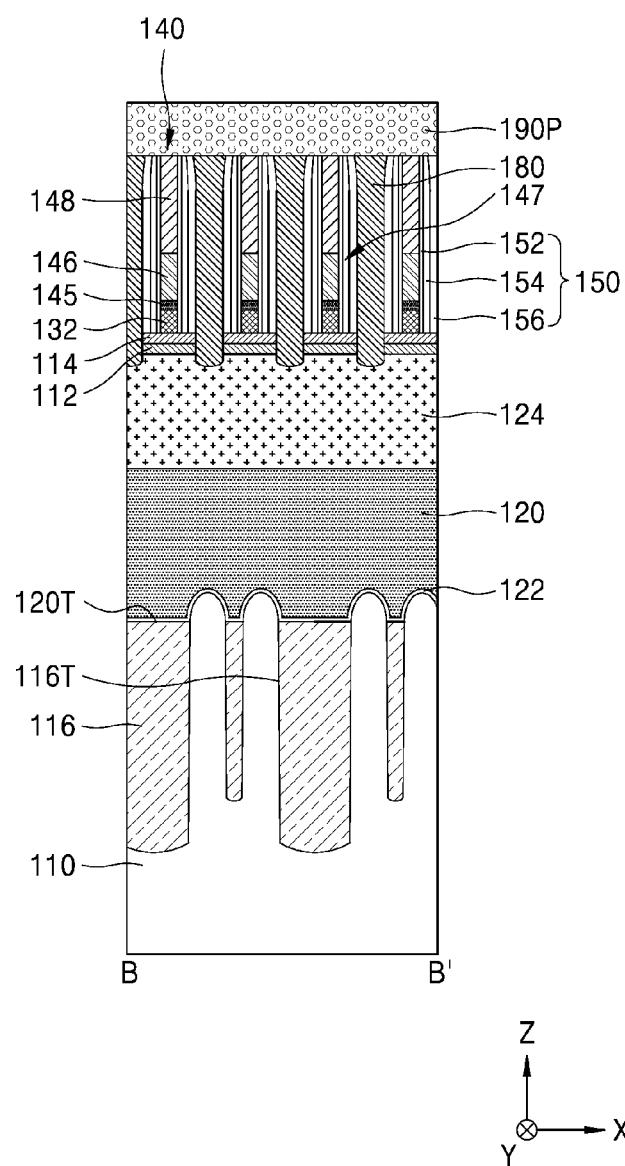
Figure 18C:
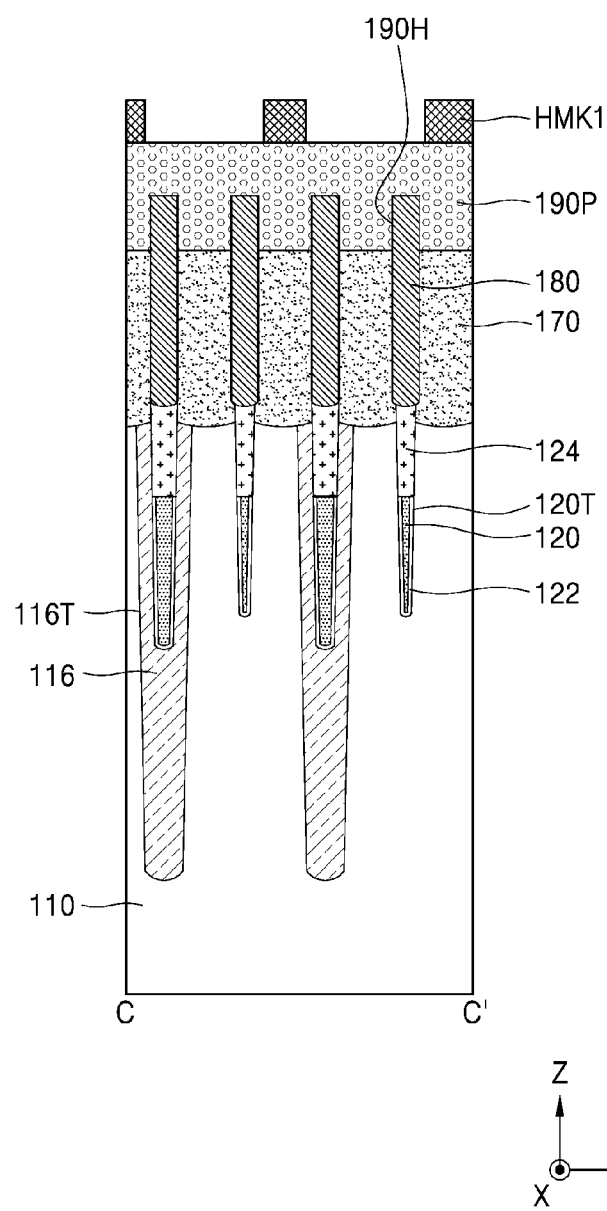
Figure 18D:
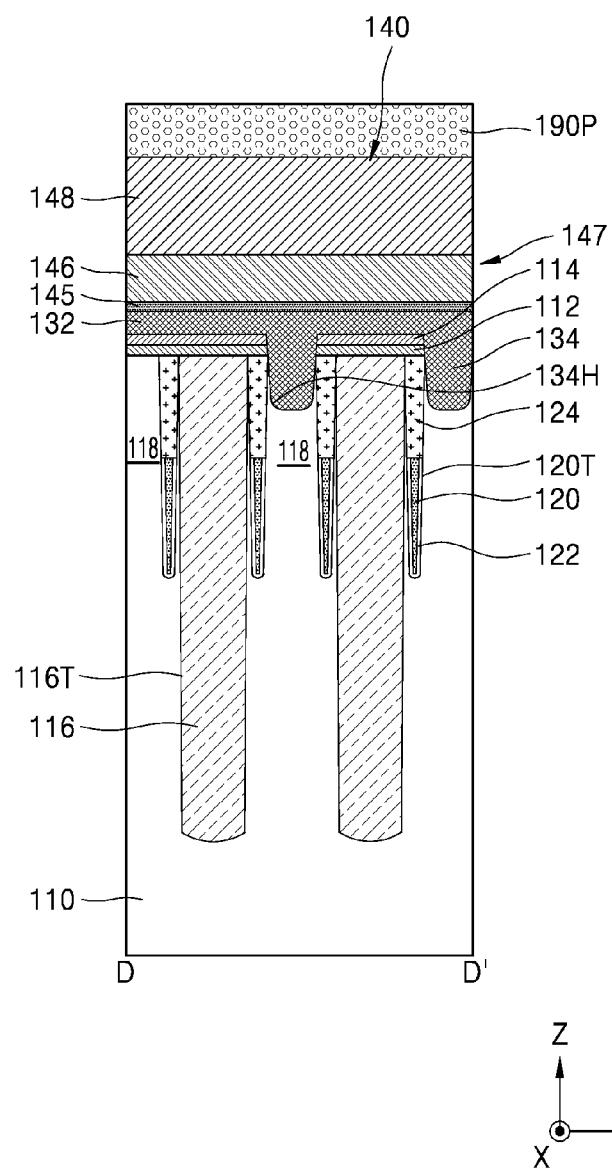
Figure 19A:
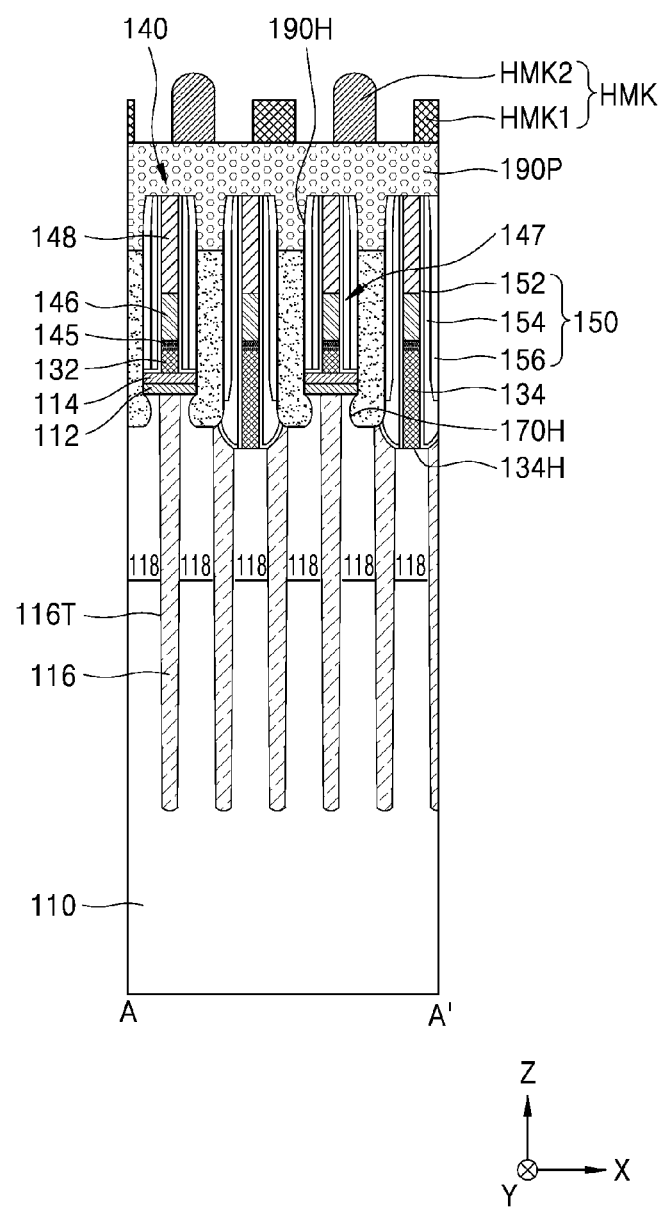
Figure 19B:
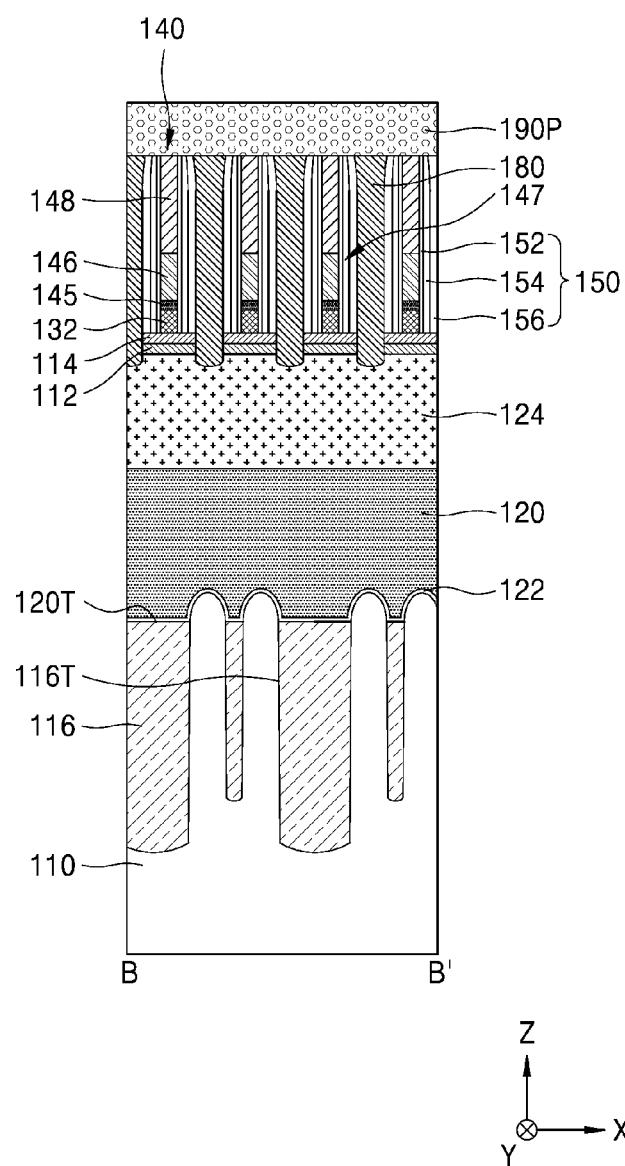
Figure 19C:
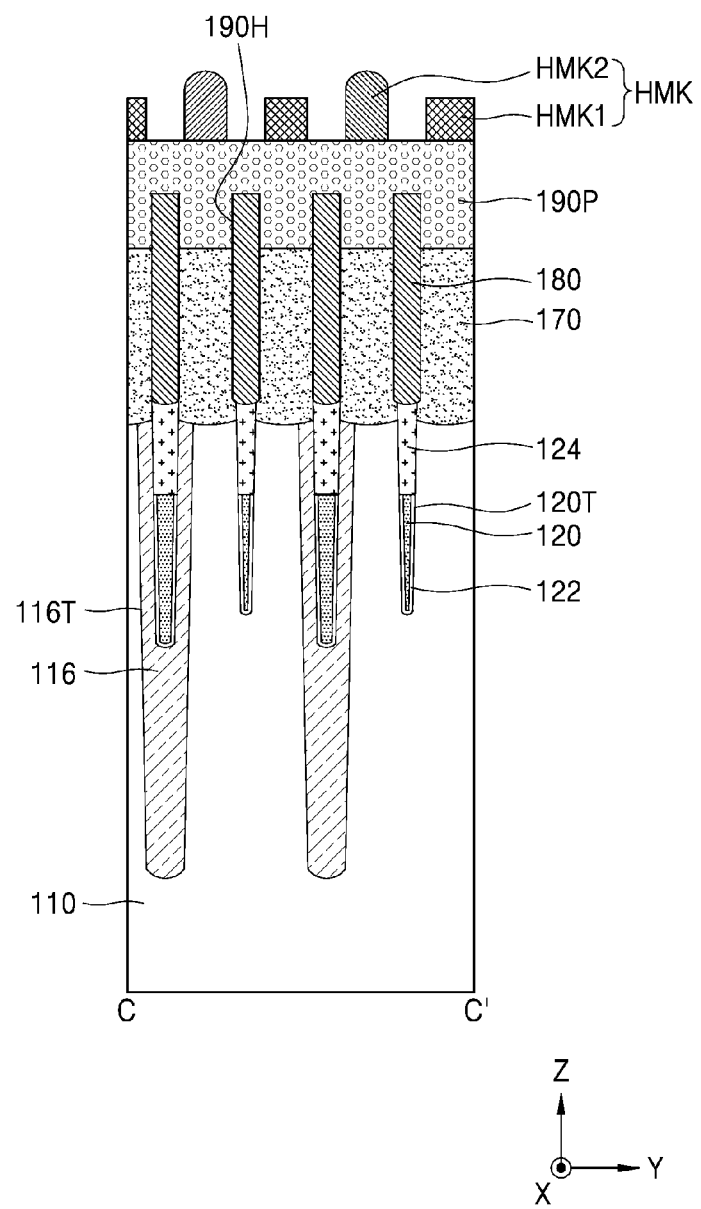
Figure 19D:
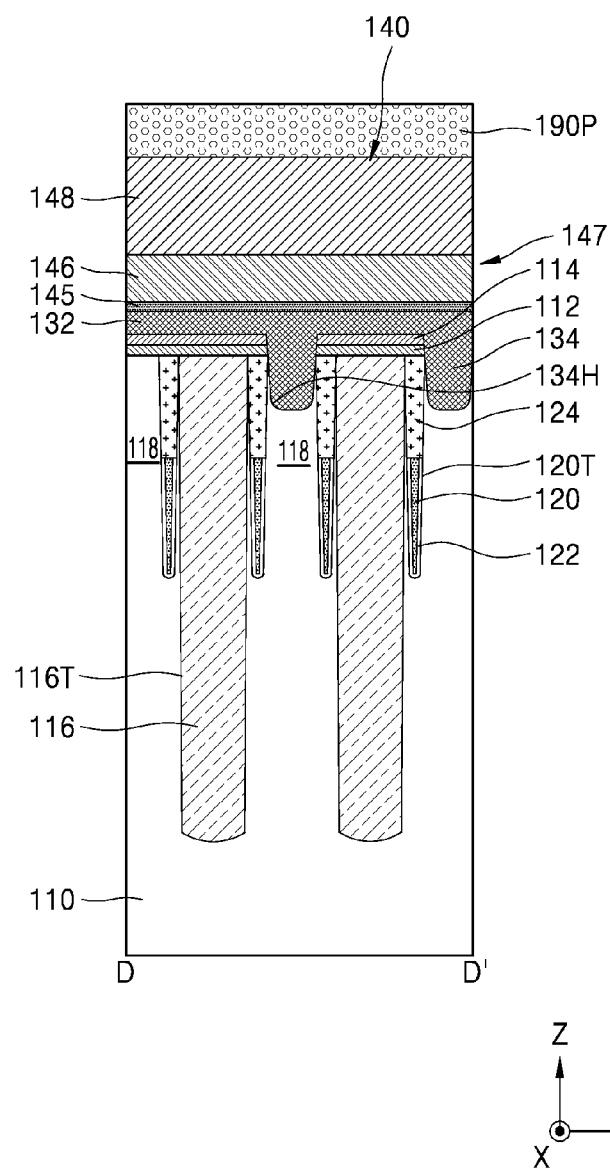
Figure 20A:
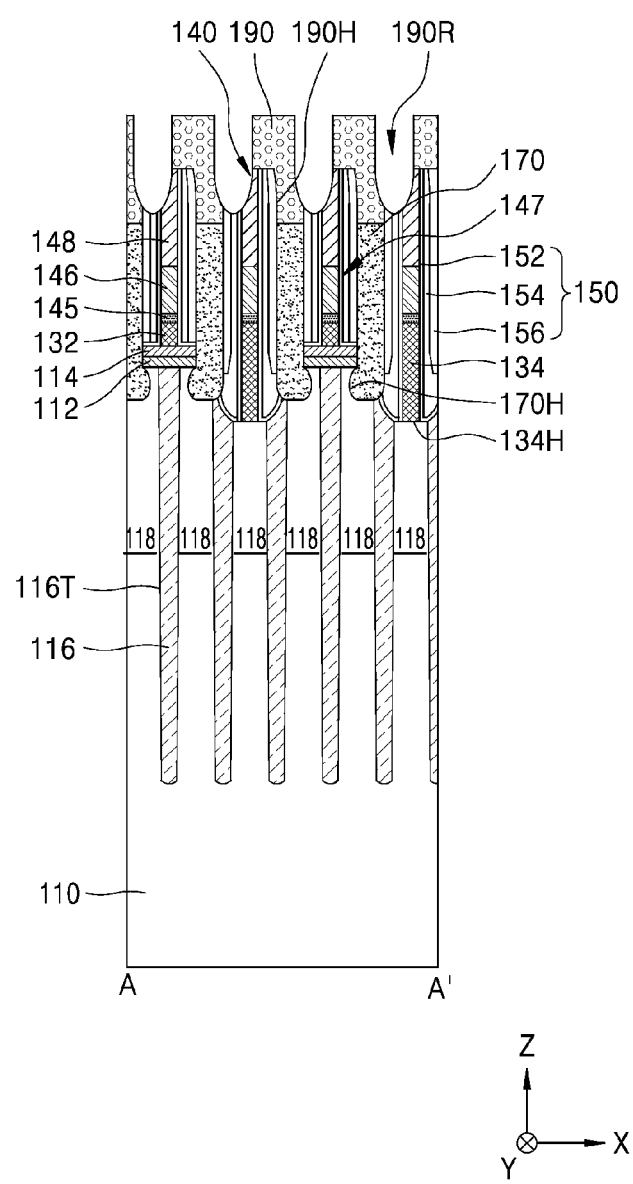
Figure 20B:
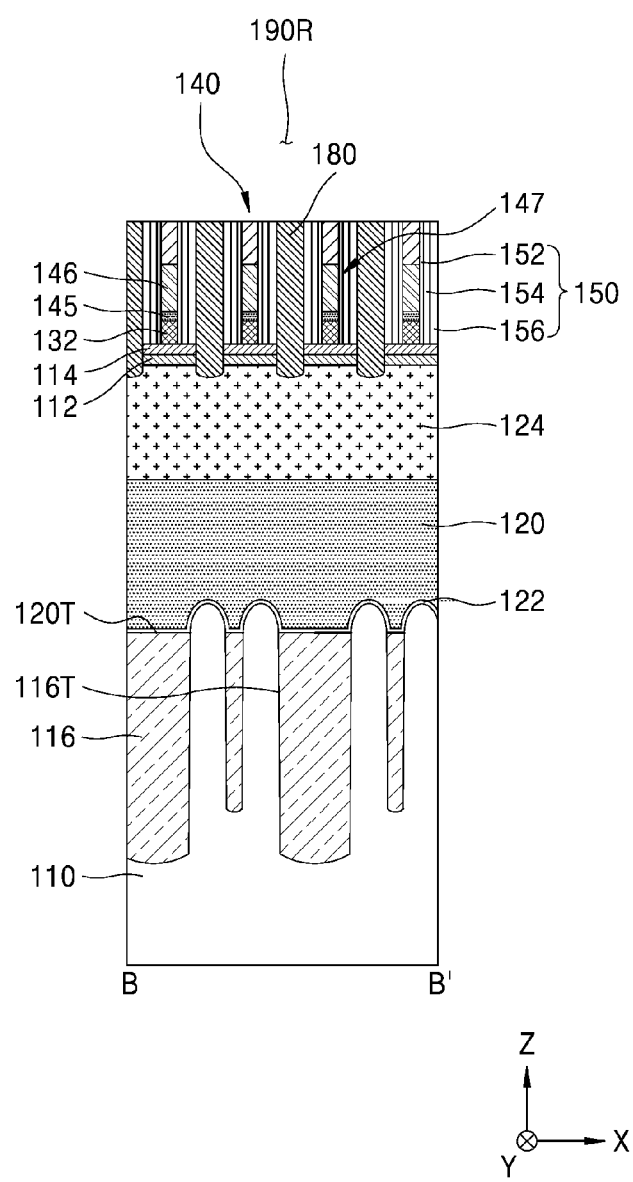
Figure 20C:
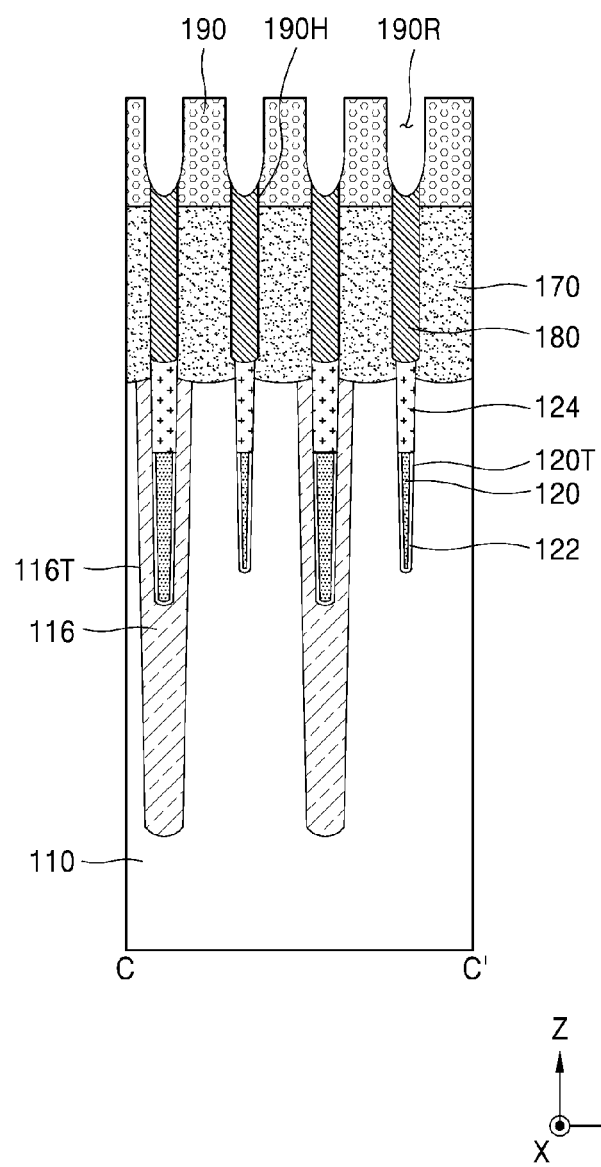
Figure 20D:
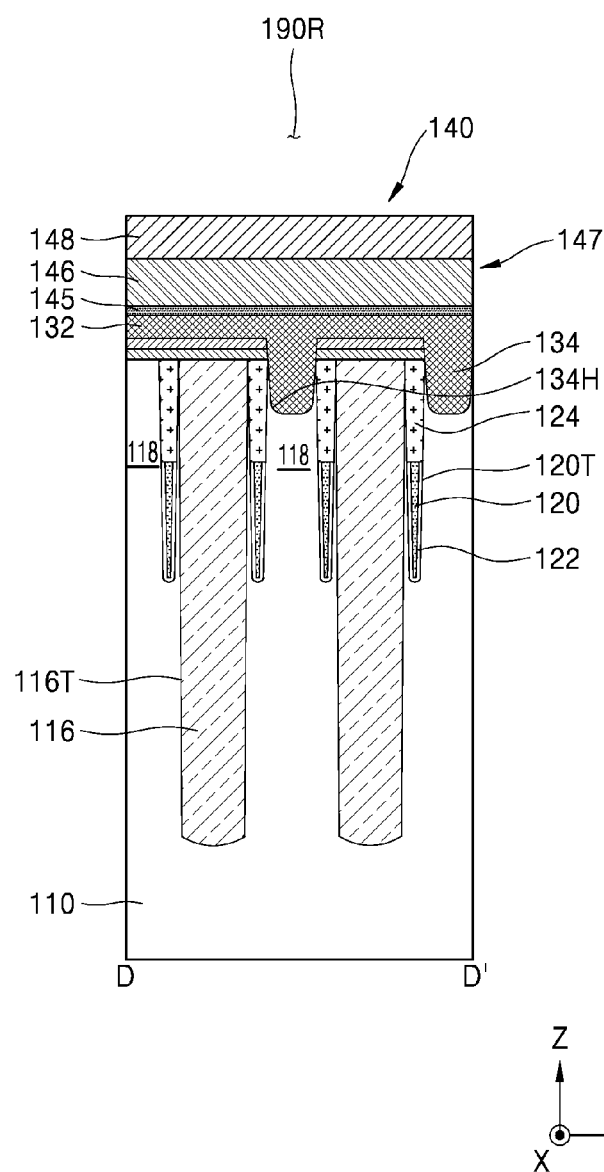

FIGS. 13A through 13B are schematic top-plan layouts for classifying and describing landing pads included in the semiconductor device formed to correspond to photomasks included in the photomask set according to example embodiments.

Referring to FIG. 13A, the plurality of landing pads LP may include first landing pads LP1 and second landing pads LP2. The first landing pads LP1 may be formed from the plurality of first even mask patterns MKC1 included in the first photomask PM1 shown in FIG. 4A or the first photomask PM1a shown in FIG. 5A, and the second landing pads LP2 may be formed from the plurality of first odd mask patterns MKC2 included in the second photomask PM2 shown in FIG. 4B or the second photomask PM2a shown in FIG. 5B. A distance between center points of two first landing pads LP1 adjacent to each other may be the base distance LB that has a value greater than a value of the second side distance L2.

Referring to FIG. 13B, the plurality of landing pads LP may include first landing pads LP1a and second landing pads LP2a. The first landing pads LP1 may be formed from the plurality of first even mask patterns MKC1b included in the first photomask PM1b shown in FIG. 7A or the first photomask shown in FIG. 8A, and the second landing pads LP2 may be formed from the plurality of first odd mask patterns MKC2b included in the second photomask PM2b shown in FIG. 7B or the second photomask PM2c shown in FIG. 8B. A distance between center points of two first landing pads LP1 adjacent to each other may be the first side distance L1 having a value greater than those of the second side distance L2 and the base distance LB.

Referring to FIGS. 13A and 13B, the plurality of landing pads LP may be formed by grouping landing pads LP adjacent to one another having the base distance LB or the first side distance L1, which has a value greater than the second side distance L2 that has a smallest value of distances between the center points LP-C of two landing pads LP adjacent to each other, and performing two or more photolithography processes each using two or more photomasks. Accordingly, as described above in FIG. 12A, even when the center point LP-C of each of the plurality of landing pads LP is shifted from the center point LPR-C of each of the plurality of reference landing pads and a distance between the two landing pads LP adjacent to each other decreases, the plurality of landing pads PD may be formed without being affected.

FIGS. 14A through 21D are cross-sectional views showing stages in a method of manufacturing a semiconductor device, according to example embodiments. FIGS. 14A, 15A, 16A, 17A, 18A, 19A, 20A, and 21A correspond to a cross-section along line A-A' of FIG. 11A. FIGS. 14B, 15B, 16B, 17B, 18B, 19B, 20B, and 21B correspond to a cross-section along line B-B' of FIG. 11A. FIGS. 14C, 15C, 16C, 17C, 18C, 19C, 20C, and 21C correspond to a cross-section along line C-C' of FIG. 11A. FIGS. 14D, 15D, 16D, 17D, 18D, 19D, 20D, and 21D correspond to a cross-section along line D-D' of FIG. 11A.

Referring to FIGS. 14A through 14D, a device isolation trench 116T may be formed on a substrate 110, and an isolation layer 116 filling the device isolation trench 116T may be formed. The substrate 110 may include a semiconductor material, e.g., silicon (Si). The isolation layer 116 may include a material including at least one of, e.g., a silicon oxide film, a silicon nitride film, and a silicon oxynitride film. A plurality of active regions 118 may be defined on the substrate 110 by the isolation layer 116. Like the active region ACT shown in FIG. 11A, the active region 118 may each have a relatively long island shape which has a short shaft and a long shaft.

A plurality of word-line trenches 120T may be formed in the substrate 110. The plurality of word-line trenches 120T may each have a line shape extending in parallel in the first horizontal direction (the X direction), crossing the active region 118, and being arranged at generally equal intervals in the second horizontal direction (the Y direction). In some embodiments, steps may be formed at bottom surfaces of the plurality of word-line trenches 120T. After cleaning a product of forming the plurality of word-line trenches 120T, a plurality of gate dielectric films 122, a plurality of word-lines 120, and a plurality of buried insulators 124 may be sequentially formed in the plurality of word-line trenches 120T. The plurality of word-lines 120 may construct the plurality of word-lines WL shown in FIG. 11A. The plurality of word-lines may have line shapes extending in the first horizontal direction (the X direction) in parallel to one another, respectively crossing the horizontal region 118 and arranged generally at equal intervals in the second horizontal direction (the Y direction). A top surface of each of the plurality of word-lines 120 may be at a level lower than a top surface of the substrate 110. For example, the plurality of word-lines 120 may include Ti, TiN, Ta, TaN, W, WN, TiSiN, WSiN, or a combination thereof.

The gate dielectric film 122 may include at least one of, e.g., a silicon oxide film, a silicon nitride film, a silicon oxynitride film, oxide/nitride/oxide (ONO), or a high-k dielectric film having a dielectric constant higher than that of the silicon oxide film.

Top surfaces of the plurality of buried insulators 124 may be at a level substantially identical to the level of the top surface of the substrate 110. The buried insulator 124 may include at least one of, e.g., a silicon oxide film, a silicon nitride film, a silicon nitride film, or a combination thereof.

Referring to FIGS. 15A through 15D, insulator patterns 112 and 114 covering the isolation layer 116, the plurality of active regions 118, and the plurality of buried insulators 124 are formed. For example, the insulator patterns 112 and 114 may include silicon oxide films, silicon nitride films, silicon oxynitride films, metal-based dielectric films, or combinations thereof. In some embodiments, the insulator patterns 112 and 114 may be formed by stacking a plurality of insulators including a first insulator pattern 112 and a second insulator pattern 114. In some embodiments, the first insulator pattern 112 may include a silicon oxide film, and the second insulator pattern 114 may include a silicon oxynitride film. Thereafter, a direct contact hole 134H penetrating the insulator patterns 112 and 114 is formed. The direct contact hole 134H may be formed to expose a source region in the active region 118. In some embodiments, the direct contact hole 134H may extend into the active region 118, i.e., into the source region.

Referring to FIGS. 16A through 16D, a direct contact conductive layer filling the direct contact hole 134H and covering the insulator patterns 112 and 114 is formed. In some embodiments, the conductive layer for direct contacts may include doped polysilicon. Next, after sequentially forming a metal-based conductive layer and an insulating capping layer for covering the insulator patterns 112 and 114 and the direct contact conductive layer and forming a bit-line structure 140, a first metal-based conductive layer, a second metal-based conductive layer, and the insulating capping layer are etched to form a plurality of bit-lines 147, including a first metal-based conductive pattern 145 and a second metal-based conductive pattern 146 that are linear, and a plurality of insulating capping lines 148. In some embodiments, the first metal-based conductive pattern 145 may include titanium nitride (TiN) or Ti—Si—N(TSN), and the second metal-based conductive pattern 146 may include tungsten (W) or W and tungsten silicide (WSi$_x$). One bit-line 147 and one insulating capping line 148 covering the one bit-line 147 may together construct one bit-line structure 140. The plurality of bit-line structures 140, which include the plurality of bit-lines 147 and the plurality of insulating capping lines 148, may each extend in parallel in the second horizontal direction (the Y direction) parallel to a main surface of the substrate 110. The plurality of bit-lines 147 may construct the plurality of bit-lines BL shown in FIG. 11A. In some embodiments, the bit-line structures 140 may further include a conductive semiconductor pattern 132 arranged between the insulator patterns 112 and 114 and the first metal-based conductive pattern 145. The conductive semiconductor pattern 132 may include doped polysilicon.

In an etching process for forming the plurality of bit-lines 147, portions of the direct contact conductive layer that do not vertically overlap the bit-lines may be removed by the etching process to form a plurality of direct contact conductive patterns 134. The plurality of direct contact conductive patterns 134 may construct the direct contacts DC shown in FIG. 11A. The plurality of bit-lines 147 may be electrically connected to the plurality of active regions 118 through the plurality of direct contact conductive patterns 134.

Two sidewalls of each of the plurality of bit-line structures 140 may be covered by an insulating spacer structure 150. A plurality of insulating spacer structures 150 may each include a first insulating spacer 152, a second insulating spacer 154, and a third insulating spacer 156. The second insulating spacer 154 may include a material having a permittivity that is lower than those of the first insulating spacer 152 and the third insulating spacer 156. In some embodiments, the second insulating spacer 154, which includes an oxide film, may be removed in a following process and be an air spacer.

A plurality of buried contact holes 170H may be formed between the plurality of bit-lines 147. Between two bit-lines 147 of the plurality of bit-lines 170, an inner surface of the plurality of buried contact hole 170H may be defined by an insulating spacer structure 150 covering a sidewall of each of the two bit-lines and the active region 118. The plurality of buried contact holes 170H may be formed by using a portion of each of the insulator patterns 112 and 114 and the active region 118 by using the insulating spacer structure 150 covering two sidewalls of each of the plurality of insulating capping lines 148 and the plurality of bit-line structures 140.

Referring to FIGS. 17A through 17D, a plurality of buried contacts 170 and a plurality of insulating fences 180 are formed between the plurality of insulating spacer structures 150 each covering two sidewalls each of the plurality of bit-line structures 140. The plurality of buried contacts 170 and the plurality of insulating fences 180 may be alternately arranged between a pair of insulating spacer structures 150 of the plurality of insulating spacer structures 150 each covering two sidewalls of each of the plurality of bit-line structures 140, that is, in the second horizontal direction (the Y direction). For example, the plurality of buried contacts 170 may include polysilicon. For example, the plurality of insulating fences 180 may include a nitride film. In some embodiments, the plurality of buried contacts 170 may be arranged in a line in each of the first horizontal direction (the X direction) and the second horizontal direction (the Y direction). Each of the buried contacts 170 may extend from the active region 118 in a vertical direction (the Z direction) orthogonal to the substrate 110. The buried contact 170 may construct the plurality of buried contacts BC shown in FIG. 11A. The plurality of buried contacts 170 may be arranged in a space defined by the plurality of insulating fences and the plurality of insulating spacer structures 150 each covering two sidewalls of each of the plurality of bit-line structures 140. The plurality of buried contacts 170 may each fill a lower portion of a space between the plurality of insulating spacer structures 150 each covering two sidewalls of each of the plurality of bit-line structures 140.

A level of top surfaces of the plurality of buried contacts 170 may be lower than a level of top surfaces of the plurality of insulating capping lines 148. Top surfaces of the plurality of insulating fences 180 and top surfaces of the plurality of insulating capping lines 148 may be at a same level about a vertical direction (the Z direction).

A plurality of landing pad holes 190H may be defined by the plurality of insulating spacer structures 150 and the plurality of insulating fences 180. The plurality of buried contacts 170 may be exposed on bottoms of the plurality of landing pad holes 190H.

Referring to FIGS. 18A through 18D, after filling the plurality of landing holes 190H and forming a landing pad material layer 190P covering the plurality of bit-line structures, a plurality of first hardmask patterns HMK1 are formed on the landing pad material layer 190P. The plurality of first hardmask patterns HMK1 may be formed by, for example, an EUV lithography process. The plurality of first hardmask patterns HMK1 on the landing pad material layer 190P may be formed by a method similar to the method of manufacturing the first hardmask pattern 42 on the target layer 20 described with reference to FIGS. 10A through 10D. In some embodiments, the buffer layer 30 and the auxiliary layer 35 shown in FIG. 10A may be further arranged between the landing pad material layer 190P and the first hardmask pattern HMK1. In some embodiments, the landing pad material layer 190P may include a conductive barrier film and a conductive pad material layer above the conductive barrier film. In some embodiments, the conductive barrier film may have a Ti/TiN stack structure. In some embodiments, the conductive pad material layer may include tungsten (W).

Referring to FIGS. 19A through 19D, a plurality of second hardmask patterns HMK2 are formed on the landing pad material layer 190P. The plurality of second hardmask patterns HMK2 may be formed by, for example, an EUV lithography process. The plurality of second hardmask patterns HMK2 may be spaced apart from the plurality of first hardmask patterns HMK1 and arranged between the plurality of first hardmask patterns HMK1. The plurality of second hardmask patterns HMK2 may be formed in a method similar to the method of manufacturing the second hardmask pattern 72 described with reference to FIGS. 10E through 10G.

Referring to FIGS. 20A through 20D, a plurality of landing pads 190 filling at least a portion of the plurality of landing pad holes 190H and extending onto the plurality of bit-line structures 140. The plurality of landing pads 190 may be arranged on the plurality of buried contacts 170 and extend onto the plurality of bit-line structures 140. In some embodiments, the plurality of landing pads 190 may extend onto the plurality of bit-lines 147. As the plurality of landing pads 190 are arranged on the plurality of buried contacts 170, the plurality of buried contacts 170 and the plurality of landing pads 190 corresponding to each other may be electrically connected to each other. The plurality of landing pads 190 may be connected to the active region 118 through the plurality of buried contacts 170. The plurality of landing pads 190 may construct the plurality of landing pads LP shown in FIG. 11A.

The buried contact 170 may be arranged between two bit-line structures 140 that are adjacent to each other, and the landing pad 190 may extend from between two bit-line structures 140, which are adjacent to each other having the buried contact 170 therebetween, onto one bit-line structure 140. The plurality of landing pads 190 may be portions of the landing pad material layers 190P obtained by portions of the landing pad material layer 190P by using the hardmask pattern HMK shown in FIGS. 18A through 19D, which includes the plurality of first hardmask patterns HMK1 and the second hardmask patterns HMK2, as etching masks and then split in plural by using recess units 190R. The plurality of landing pads 190 may be spaced apart from each other having the recess unit 190R therebetween.

Referring to FIGS. 21A through 21D, a plurality of lower electrodes 210, a capacitor dielectric film 220, and an upper layer 230 may be sequentially formed on the plurality of landing pads 190 to form a semiconductor memory device 1 including a plurality of capacitor structures 200. Each of the plurality of lower electrodes 210 may be electrically connected to each of the plurality of landing pads 190 and correspond to each of the plurality of landing pads 190. The capacitor dielectric film 220 may conformally cover the plurality of lower electrodes 210. The upper electrode 230 may cover the capacitor dielectric film 220. The upper electrode 230 may face the upper electrodes 210 having the capacitor dielectric film 220 between the upper electrode 230 and the capacitor dielectric film 220. In a certain region, the capacitor dielectric film 220 and the upper electrode 230 may be integrally formed to cover the plurality of lower electrodes 210. The plurality of lower electrodes 210 may construct the plurality of storage nodes SN shown in FIG. 11A.

The plurality of lower electrodes 210 may have a column shape, that is, a pillar shape, filled to have a circle-shape horizontal cross-section, but is not limited thereto. In some embodiments, each of the plurality of lower electrodes 210 may have a cylinder shape with a sealed bottom. In some embodiments, the plurality of lower electrodes 210 may be arranged a honeycomb shape aligned in zigzag about the first horizontal direction (the X direction) or the second horizontal direction (the Y direction). The plurality of lower electrodes 210 may include, for example, silicon doped with an impurity, metal such as tungsten or copper, or a conductive metal compound such as titanium nitride. Although not shown, the semiconductor memory device 1 may further include at least one supporting pattern contacting sidewalls of the plurality of lower electrodes 210.

Figure 21A:
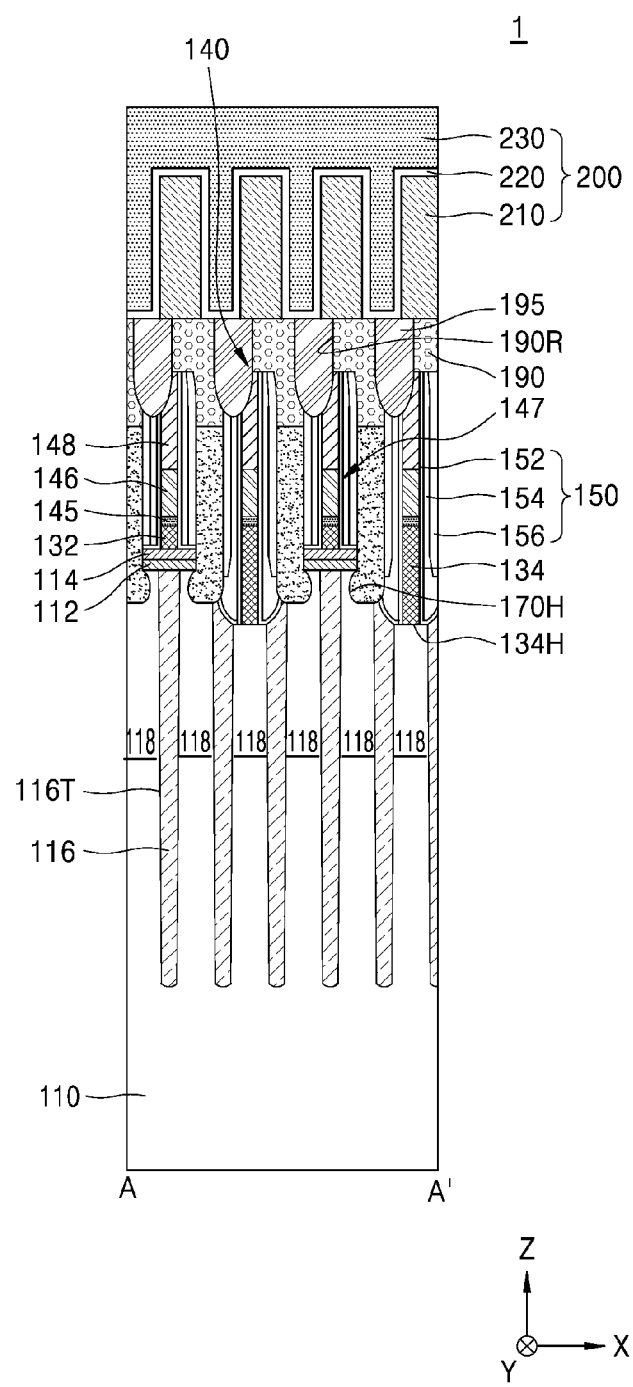
Figure 21B:
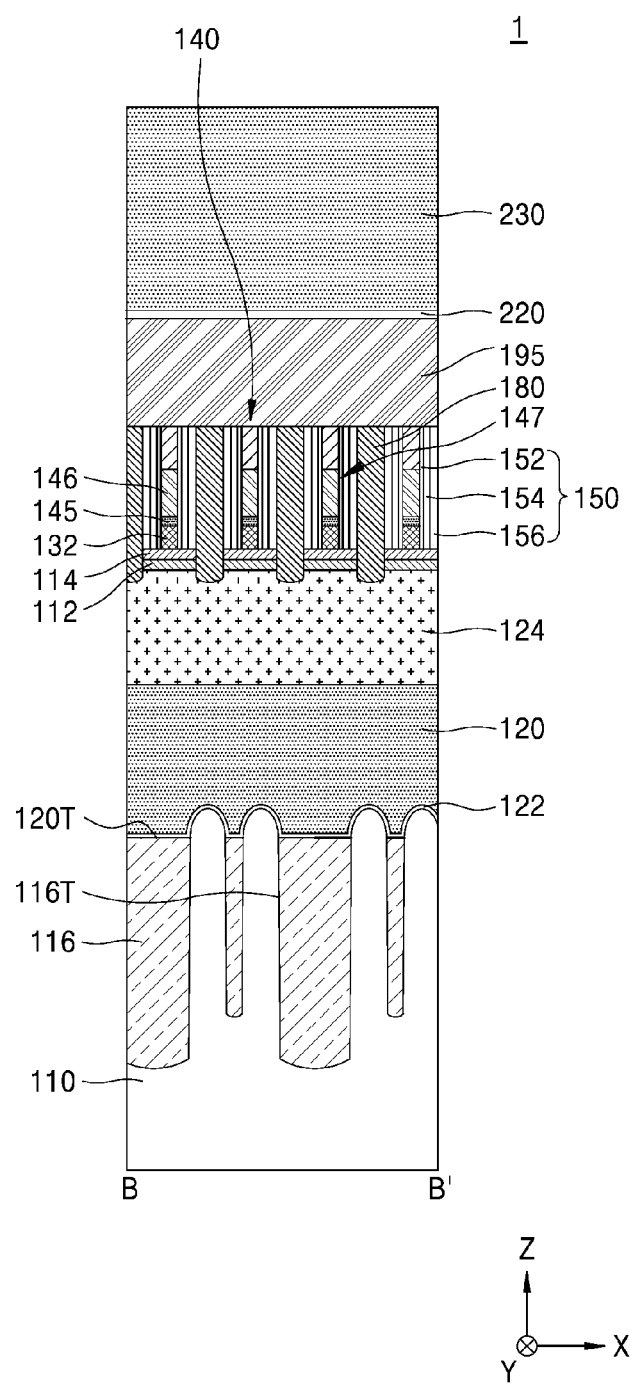
Figure 21C:
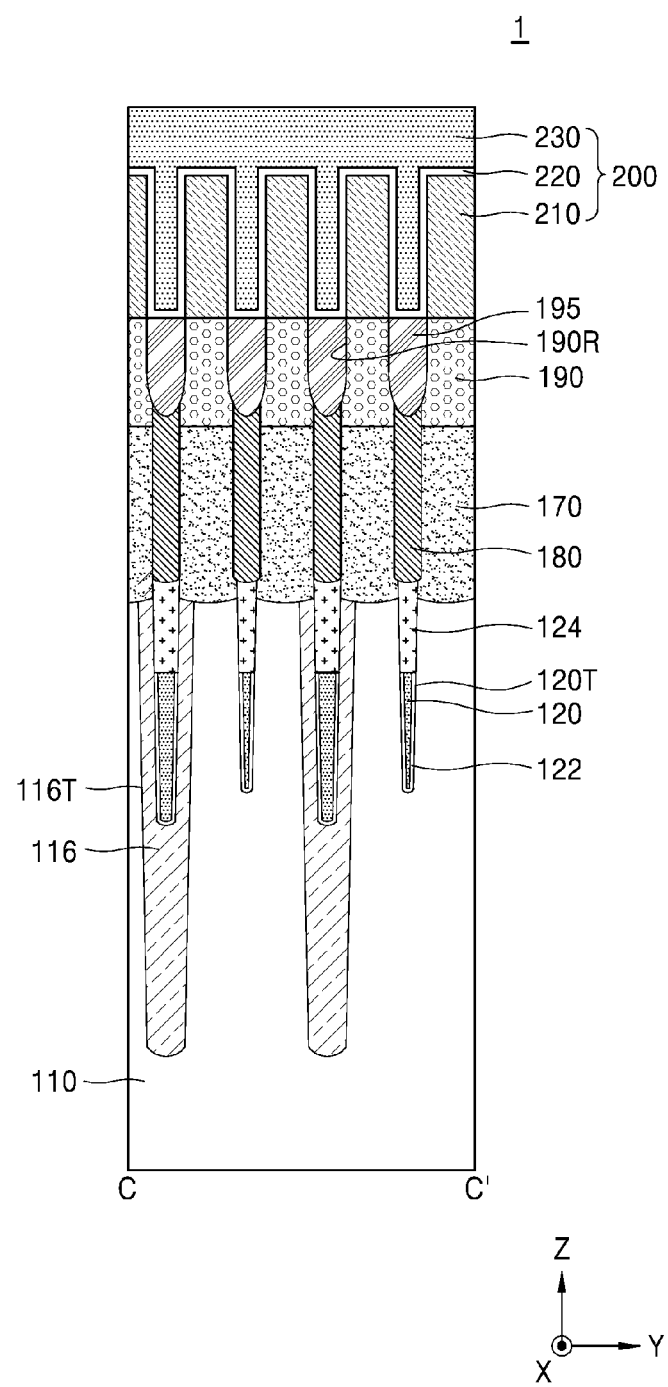
Figure 21D:
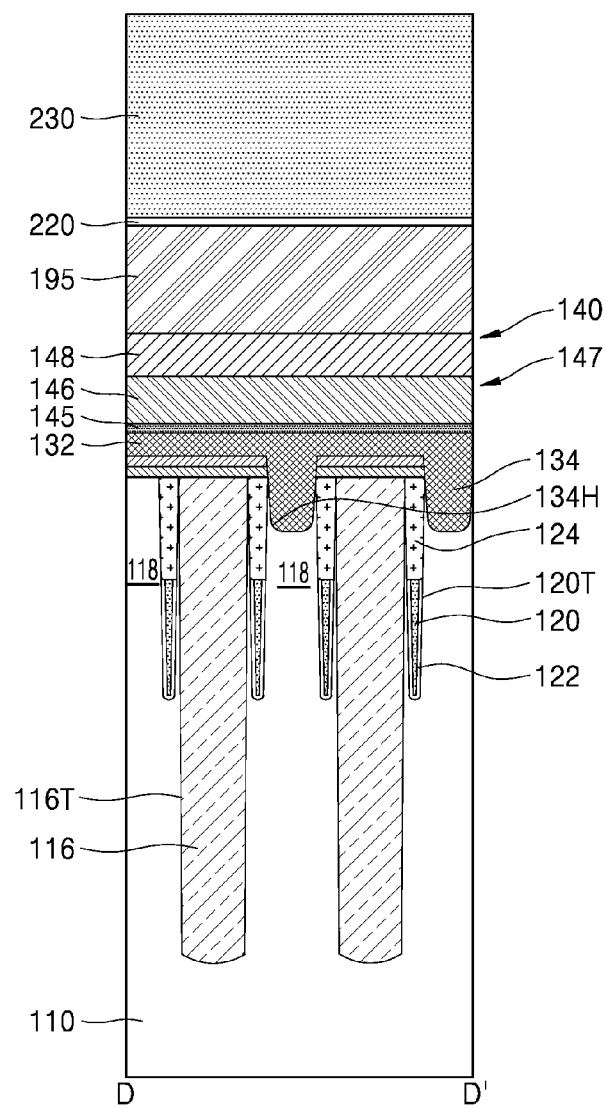

Before forming a plurality of capacitor structures 200, an insulator structure 195 filling the recess unit 190R may be formed. Although FIGS. 21A and 21C shows that the top surface of the insulating structure 195 and the bottom surface of the lower electrode 210 are at a same level, but are not limited thereto. For example, a level of a top surface of the insulator structure 195 may be higher than a level of a bottom surface of the lower electrode 210, and the lower electrode 210 may extend into the insulator structure 195 toward the substrate 110.

In the semiconductor memory device 1 according to the present disclosure, center points of the plurality of landing pads 190 are shifted away from adjacent bit-line structures 140, and thus, widths of the plurality of landing pads 190 in the first horizontal direction (the X direction) extending in the vertical direction (the Z direction) along a sidewall of the neighboring bit-line structure 140 may extend. Therefore, an overlap margin between the landing pad 190 and the buried contact 170 corresponding to each other increases, and the reliability of electrical connection between the landing pad 190 and the buried contact 170 corresponding to each other may increase. In addition, as a distance in the first horizontal direction (the X direction) between one landing pad 190 and the buried contact 170 connected to another landing pad 190 adjacent to the one landing pad 190 increases, occurrence of a bridge between the landing pad and the buried contact 190 adjacent to the landing pad 190 may be prevented.

In addition, a top surface of each of the plurality of landing pads 190 may have a disc shape, of which an edge is substantially a circle rather than an ellipse. Therefore, as a separation distance between the plurality of landing pads 190 increases, occurrence of a bridge between neighboring landing pads 190, and a capfill property of the insulating structure 195 filling between the plurality of landing pads may be improved. Accordingly, reliability in electronical insulation between the plurality of landing pads 190 may be improved.

The methods, processes, and/or operations described herein (e.g., preparing, grouping, splitting, etc. of pattern layouts) may be performed by code or instructions to be executed by a computer, processor, controller, or other signal processing device (e.g., via a simulation to be implemented when processing physical layers on a substrate). The computer, processor, controller, or other signal processing device may be those described herein or one in addition to the elements described herein. Because the algorithms that form the basis of the methods (or operations of the computer, processor, controller, or other signal processing device) are described in detail, the code or instructions for implementing the operations of the method embodiments may transform the computer, processor, controller, or other signal processing device into a special-purpose processor for performing the methods described herein.

Also, another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the method embodiments described herein.

By way of summation and review, example embodiments provide a method of manufacturing a photomask set and a method of manufacturing a semiconductor device by using the photomask set which may be used for reducing the difficulty in processes of forming patterns in a process of manufacturing a semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a plurality of bit-line structures having bit-lines extending in parallel to one another in a first horizontal direction on a substrate;
    forming a plurality of buried contacts filling lower portions of spaces between the plurality of bit-line structures on the substrate; and
    forming a plurality of landing pads by using a photomask set including a first photomask and a second photomask, the plurality of landing pads filling upper portions of spaces between the plurality of bit-line structures and extending onto the plurality of bit-line structures, and including a first landing pad, a second landing pad, and a third landing pad adjacent to one another, wherein a triangle connecting center points of top surfaces of the first landing pad and the second landing pad, and the third landing pad includes a scalene triangle,
    wherein forming the plurality of landing pads includes:
        forming a landing pad material layer filling the upper portions of the spaces between the plurality of bit-line structures and covering the plurality of bit-line structures,
        forming a plurality of first hardmask patterns on the landing pad material layer by using the first photomask,
        forming a plurality of second hardmask patterns by using the second photomask in a space between the plurality of first hardmask patterns on the landing pad material layer, and
        patterning the landing pad material layer by using the plurality of first hardmask patterns and the plurality of second hardmask patterns as etching masks.

2. The method as claimed in claim 1, wherein forming the plurality of landing pads includes aligning the plurality of landing pads in a row having a base distance between center points of top surfaces in a second horizontal direction orthogonal to the first horizontal direction and in a zigzag pattern in the first horizontal direction.

3. The method as claimed in claim 2, wherein each of the first photomask and the second photomask includes an even layout pattern and an odd layout pattern alternately corresponding to the rows arranged in the second horizontal direction from among the plurality of landing pads.

4. The method as claimed in claim 2, wherein each of the first photomask and the second photomask includes an even layout pattern and an odd layout pattern alternately corresponding to the rows arranged in a zigzag pattern in the first horizontal direction from the plurality of landing pads.

5. The method as claimed in claim 4, wherein the plurality of first hardmask patterns and the plurality of second hardmask patterns, from among the plurality of landing pads, each alternately corresponds to rows in which a distance between center points of top surfaces has a value greater than the base distance, the rows that are arranged in zigzag in the first horizontal direction.

6. The method as claimed in claim 1, wherein forming the plurality of landing pads includes forming an edge of a top surface of each of the plurality of landing pads into a circle.

7. A method of manufacturing a semiconductor device, the method comprising:
    forming a plurality of word-lines extending in parallel to one another in a first horizontal direction across a plurality of active regions on a substrate, in which the plurality of active regions is defined by an isolation layer;

forming, on the substrate, a plurality of bit-line structures having bit-lines extending in parallel to one another in a second horizontal direction orthogonal to the first horizontal direction;

forming, on the substrate, a plurality of buried contacts filling lower portions of spaces between the plurality of bit-line structures and connected to the plurality of active regions;

forming a plurality of landing pads by using a photomask set including a first photomask and a second photomask, the plurality of landing pads being connected to the plurality of buried contacts, filling upper portions of spaces between the plurality of bit-line structures, extending onto the plurality of bit-line structures, and each having a circle-shape top surface; and forming, on the plurality of bit-line structures, a plurality of storage nodes connected to the plurality of landing pads, wherein the forming of the plurality of landing pads includes:

forming a landing pad material layer filling upper portions of spaces between the plurality of bit-line structures and covering the plurality of bit-line structures;

forming a plurality of first hardmask patterns and a plurality of second hardmask patterns apart from the plurality of first hardmask patterns, on the landing pad material layer, by sequentially using the first photomask and the second photomask; and patterning the landing pad material layer by using the plurality of first hardmask patterns and the plurality of second hardmask patterns as etching masks, wherein lengths of three sides of a triangle connecting center points of top surfaces of three landing pads adjacent to one another from among the plurality of landing pads respectively have a base distance having a value of 3 F (feature size), a first side distance greater than the base distance, and a second side distance less than the base distance, and in the forming of the plurality of storage nodes, lengths of three sides of a triangle connecting center points of top surfaces of three storage nodes adjacent to one another from among the plurality of storage nodes have a value of 3 F (feature size).

8. The method as claimed in claim 7, wherein the plurality of first hardmask patterns and the plurality of second hardmask patterns alternately correspond to rows arranged in the first horizontal direction from among the plurality of landing pads, respectively.

9. The method as claimed in claim 7, wherein the plurality of first hardmask patterns and the plurality of second hardmask patterns, from among the plurality of landing pads, alternately correspond to rows arranged in zigzag in a second horizontal direction, the rows in which a distance between center points of top surfaces includes the first side distance, respectively.

10. The method as claimed in claim 7, wherein each of the first photomask and the second photomask is a reflective-type mask for an Extreme Ultraviolet (EUV) lithography process.

* * * * *